(12) United States Patent
Sadamatsu

(10) Patent No.: US 8,136,074 B2
(45) Date of Patent: Mar. 13, 2012

(54) PRINTED CIRCUIT BOARD DESIGN SUPPORT PROGRAM, RECORDING MEDIUM, AND PRINTED CIRCUIT BOARD DESIGN SUPPORT METHOD

(75) Inventor: Toshisato Sadamatsu, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 335 days.

(21) Appl. No.: 12/499,733

(22) Filed: Jul. 8, 2009

(65) Prior Publication Data

US 2010/0011326 A1    Jan. 14, 2010

(30) Foreign Application Priority Data

Jul. 11, 2008   (JP) .................................. 2008-182043

(51) Int. Cl.
G06F 17/50 (2006.01)
(52) U.S. Cl. .......................... 716/120; 716/127; 716/137
(58) Field of Classification Search .................. 716/120, 716/127, 137
See application file for complete search history.

(56) References Cited

U.S. PATENT DOCUMENTS

| | | | | |
|---|---|---|---|---|
| 5,587,920 A | * | 12/1996 | Muyshondt et al. | 716/137 |
| 6,327,695 B1 | * | 12/2001 | Bothra et al. | 716/55 |
| 6,453,444 B1 | * | 9/2002 | Shepard | 716/102 |
| 6,557,154 B1 | * | 4/2003 | Harada et al. | 716/115 |
| 6,937,480 B2 | | 8/2005 | Iguchi et al. | |
| 7,039,572 B1 | * | 5/2006 | Narahara et al. | 703/14 |
| 7,114,132 B2 | * | 9/2006 | Yaguchi | 716/115 |
| 7,257,792 B2 | * | 8/2007 | Nakayama et al. | 716/122 |
| 7,530,043 B2 | * | 5/2009 | Hsu et al. | 716/137 |
| 7,823,096 B2 | * | 10/2010 | Katagiri et al. | 716/136 |
| 2002/0157067 A1 | * | 10/2002 | Yaguchi | 716/1 |
| 2002/0178429 A1 | * | 11/2002 | Nakayama et al. | 716/15 |
| 2006/0242615 A1 | * | 10/2006 | Mimura et al. | 716/15 |
| 2007/0033553 A1 | * | 2/2007 | Katagiri et al. | 716/4 |
| 2008/0230258 A1 | * | 9/2008 | Shen et al. | 174/251 |
| 2010/0006987 A1 | * | 1/2010 | Murugan et al. | 257/659 |

FOREIGN PATENT DOCUMENTS

| | | | |
|---|---|---|---|
| JP | 10334132 A | * | 12/1998 |
| JP | 2004252743 A | * | 9/2004 |
| JP | 2007-272342 | | 10/2007 |

* cited by examiner

Primary Examiner — Phallaka Kik
(74) Attorney, Agent, or Firm — Canon U.S.A., Inc. IP Division

(57) ABSTRACT

To automatically arrange vias on a printed circuit board so as to satisfy a predetermined condition. A printed circuit board design support method for causing a computer to execute a ground conductive area identifying conductive areas which can be used as grounds of a printed circuit board having a plurality of conductive layers, an extracting an overlapping conductive area in which the conductive areas identified in the ground conductive area identifying are two-dimensionally overlapped with one another, and an automatic arranging interlayer connection members configured to electrically connect at least two layers with one another among the plurality of conductive areas in the overlapping conductive area extracted in the extracting at an interval within a predetermined distance.

20 Claims, 56 Drawing Sheets

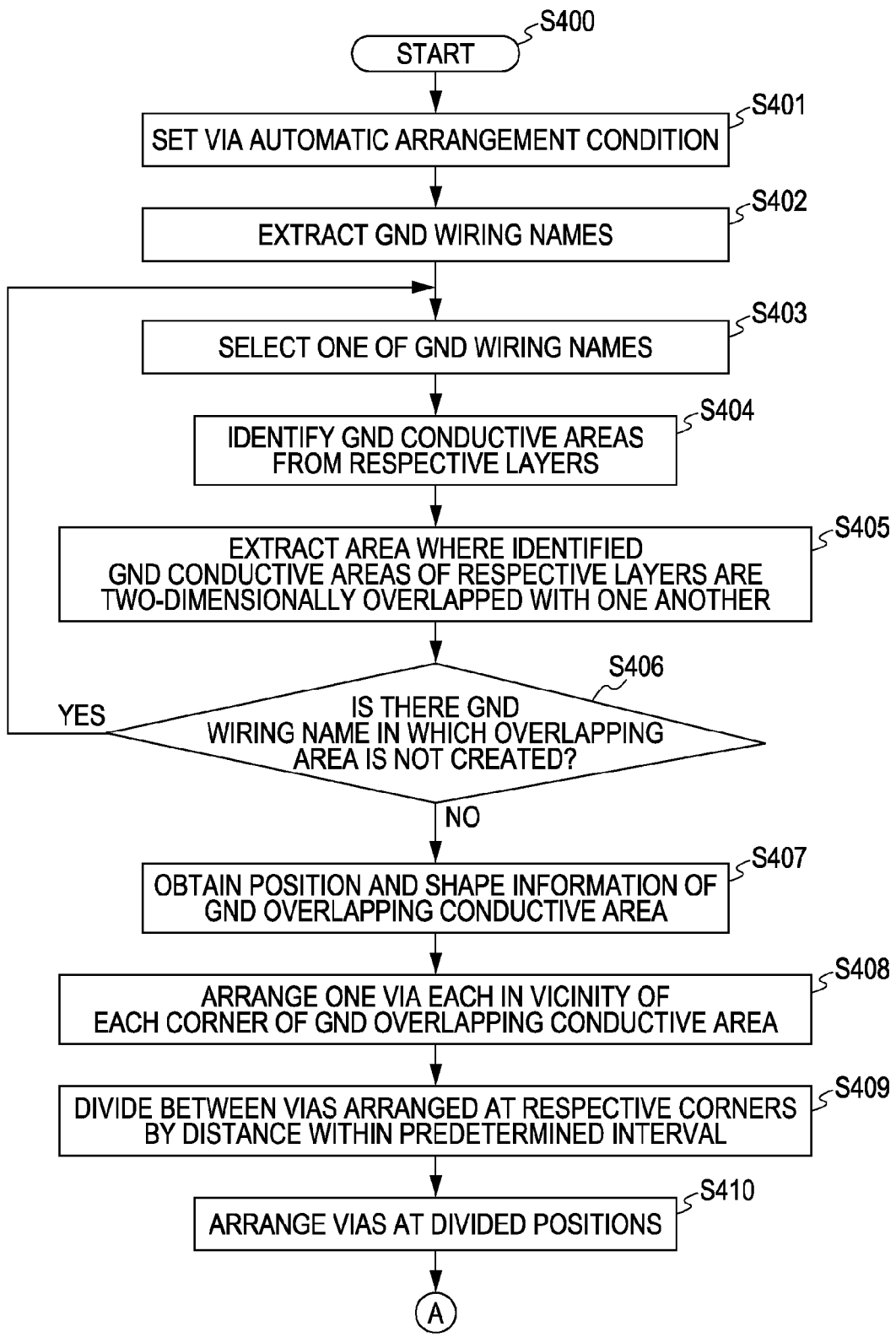

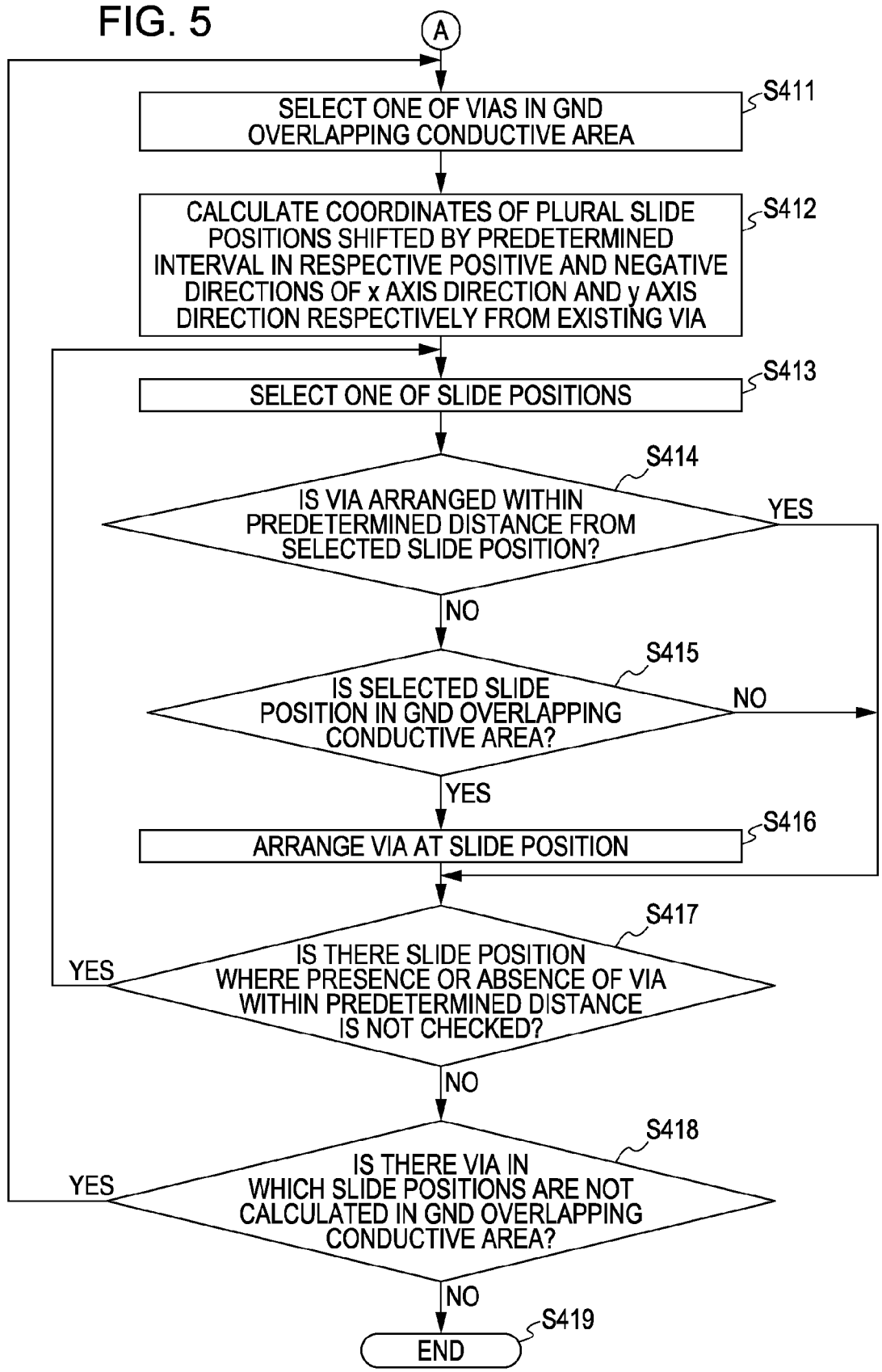

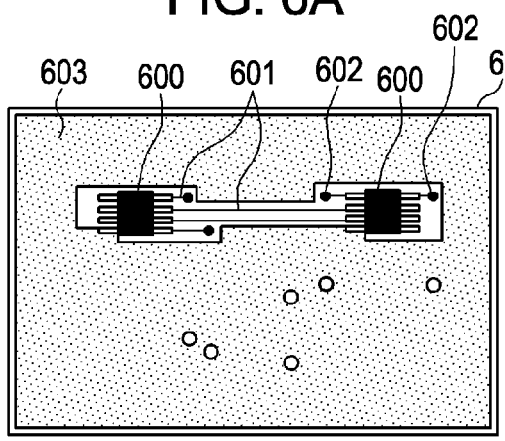
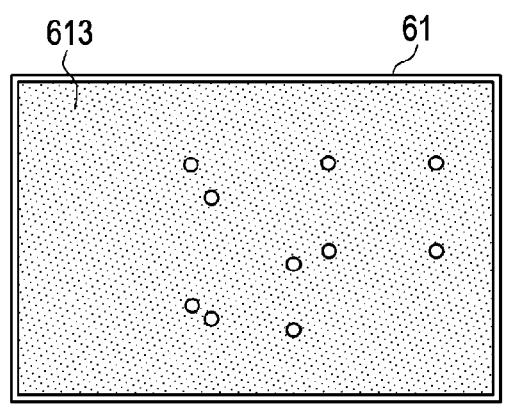
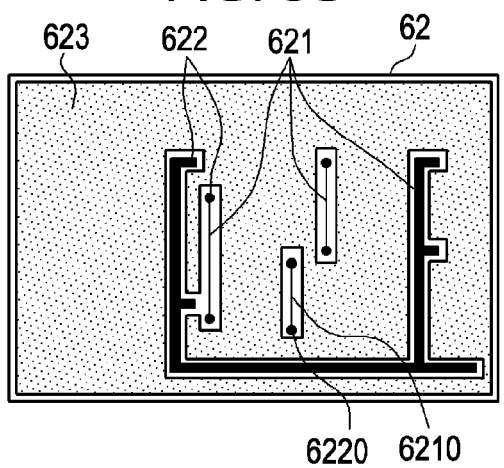
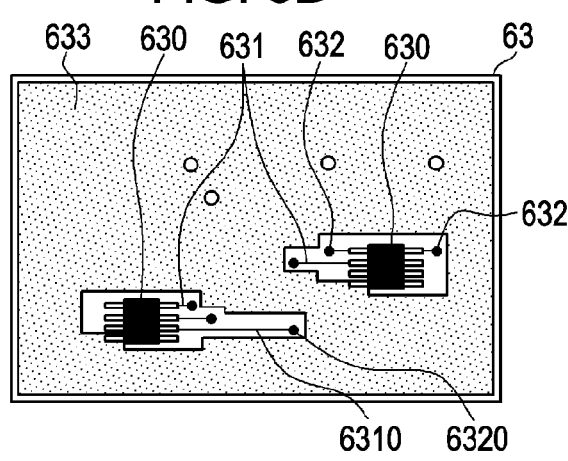
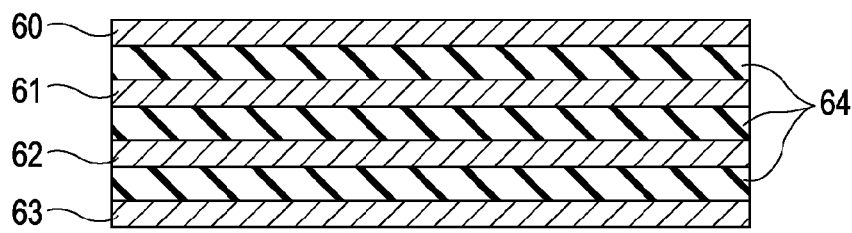

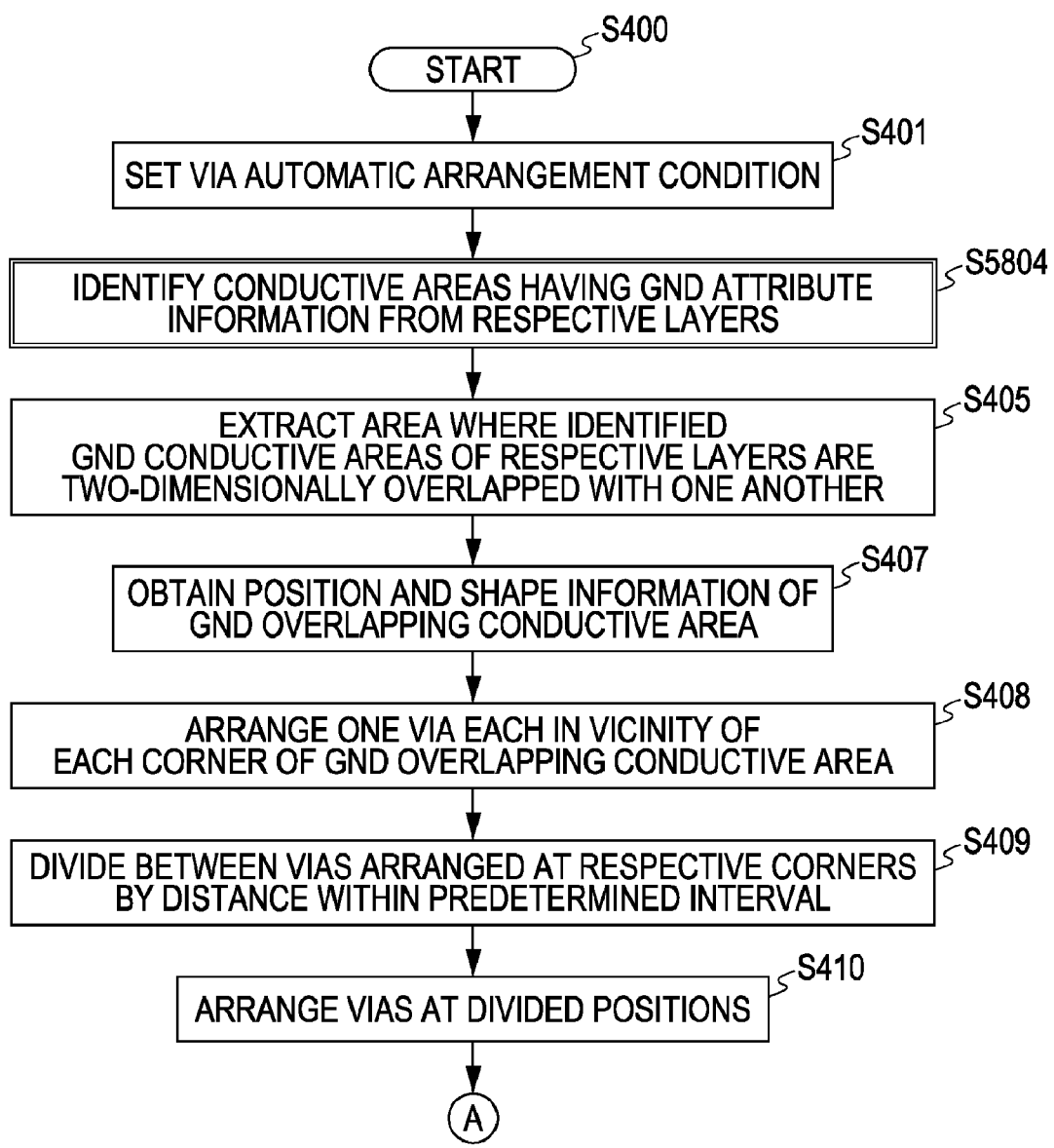

PRINTED CIRCUIT BOARD DESIGN SUPPORT PROGRAM, RECORDING MEDIUM, AND PRINTED CIRCUIT BOARD DESIGN SUPPORT METHOD

This application claims the benefit of Japanese Patent Application No. 2008-182043, filed Jul. 11, 2008, which is hereby incorporated by reference herein in its entirety.

BACKGROUND OF THE INVENTION

1. Field of the Invention

The present invention relates to a printed circuit board design support program, a recording medium, a printed circuit board design support method, and a printed circuit board design support apparatus. In particular, the invention aims to appropriately arrange an interlayer connection member (a via hole, hereinafter, referred to as "via") configured to electrically connect a plurality of conductive layers laminated on contact with an insulating layer.

2. Description of the Related Art

In recent years, in association with an increase in the speed of signals transmitted in an electronic device such as an information technology device, unnecessary electromagnetic waves (hereinafter, referred to as radiation noise) radiated from the electronic device cause a problem. In order to solve this problem, various designs for suppressing the radiation noise are carried out with respect to a wiring on a printed circuit board in the electronic device, a wire harness connected to the wiring, and a housing of the electronic device.

As a design method for suppressing the radiation noise, U.S. Pat. No. 6,937,480 and Japanese Patent Laid-Open No. 2007-272342 propose a technology for devising an arrangement of vias configured to electrically connect a plurality of conductive layers in the printed circuit board.

As to a design support apparatus for a printed-wiring assembly described in U.S. Pat. No. 6,937,480, a technology is disclosed with which the number of arranged vias in a predetermined range on the printed circuit board is calculated, and a situation is notified when the number of arranged vias is smaller than a predetermined number. Also, in this design support apparatus, a technology is disclosed for determining whether the vias are arranged at a predetermined interval and issuing a notification in a case where the vias are not arranged at the predetermined interval.

In a circuit board design support apparatus described in Japanese Patent Laid-Open No. 2007-272342, a location where a necessity for a layer change with respect to a return current route of a signal should be determined (hereinafter, referred to as check point) is detected. A technology is disclosed for displaying a synthesized area of an area in a range at a specified distance from the detected check point and an area where no vias are arranged.

As described above, in the printed-wiring assembly design support apparatus described in U.S. Pat. No. 6,937,480, a situation in which the number of arranged vias in the predetermined range is small or a situation in which the vias are not arranged at the predetermined distance is notified.

In addition, in the circuit board design support apparatus described in Japanese Patent Laid-Open No. 2007-272342, a synthesized area is calculated of an area in the vicinity of a location where the necessary for the layer change with respect to the return current route should be determined such as a layer change location of a signal line and an area where no power source or GND vias are arranged. Then, the necessity for the layer change with respect to the return current route is determined, and when the layer change with respect to the return current route is necessary, the synthesized area is visualized.

However, a user needs to visually determine whether a via can be added so as to satisfy a condition of USP or determine at which location the via can be added when the additional arrangement of the via is attempted to the synthesized area where the layer change with respect to the return current route is necessary in Japanese Patent Laid-Open No. 2007-272342. Therefore, it takes much time for the user to determine the location at which the via can be additionally arranged, and further, a mistake in the determination or an oversight of the position where the additional arrangement can be performed may occur.

SUMMARY OF THE INVENTION

The present invention has been made in view of the above-mentioned problems and aims to automatically arrange vias on a printed circuit board so as to satisfy a predetermined condition.

According to an aspect of the present invention, there is provided a printed circuit board design support program for causing a computer to execute: a ground conductive area identifying step of identifying conductive areas which can be used as grounds of a printed circuit board having a plurality of conductive layers; an extracting step of extracting an overlapping conductive area in which the conductive areas identified in the ground conductive area identifying step are two-dimensionally overlapped with one another; and a first arranging step of arranging interlayer connection members configured to electrically connect at least two layers with one another among the plurality of conductive areas in the overlapping conductive area extracted in the extracting step at an interval within a predetermined distance.

According to another aspect of the present invention, there is provided a printed circuit board design support method including: a ground conductive area identifying step of identifying conductive areas which can be used as grounds of a printed circuit board having a plurality of conductive layers; an extracting step of extracting an overlapping conductive area in which the conductive areas identified in the ground conductive area identifying step are two-dimensionally overlapped with one another; and a first arranging step of arranging interlayer connection members configured to electrically connect at least two layers with one another among the plurality of conductive areas in the overlapping conductive area extracted in the extracting step at an interval within a predetermined distance.

According to still another aspect of the present invention, there is provided a printed circuit board design support apparatus including: a ground conductive area identifying unit configured to identify conductive areas which can be used as grounds of a printed circuit board having a plurality of conductive layers; an extracting unit configured to extract an overlapping conductive area in which the conductive areas identified by the ground conductive area identifying unit are two-dimensionally overlapped with one another; and a first arranging unit configured to arrange interlayer connection members configured to electrically connect at least two layers with one another among the plurality of conductive areas in the overlapping conductive area extracted by the extracting unit at an interval within a predetermined distance.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate exemplary embodiments and features of the invention and, together with the description, serve to explain at least some of the principles of the invention.

FIG. 4 is a flow chart for an example of a processing operation according to a first embodiment of the present invention.

FIG. 5 is a flow chart for an example of the processing operation according to the first embodiment.

FIGS. 6A to 6E are schematic diagrams of a printed circuit board for describing the operational processing according to the first embodiment.

FIG. 8 is a flow chart for an example of the processing operation in a case where a GND conductive area is identified by using GND attribute information according to the first embodiment.

DESCRIPTION OF THE EMBODIMENTS

Preferred embodiments of the present invention will now be described in detail in accordance with the accompanying drawings.

Hereinafter, examples of a printed circuit board design support apparatus, a printed circuit board design support method, and a printed circuit board design support program according to the present embodiment will be described in detail. It is to be noted that the present invention is not limited to the following description and exemplary embodiments. Modifications and combinations can be of course made within the gist of the present invention.

According to the following embodiments, as a target of a conductive area where vias are arranged, only a ground (hereinafter, referred to as GND) conductive area is mentioned, but in case of necessity, a power source area can be set as the arrangement target. Furthermore, in the accompanying drawings, the same symbols are assigned to the same components even being illustrated in different embodiments and drawings.

Figure 1:
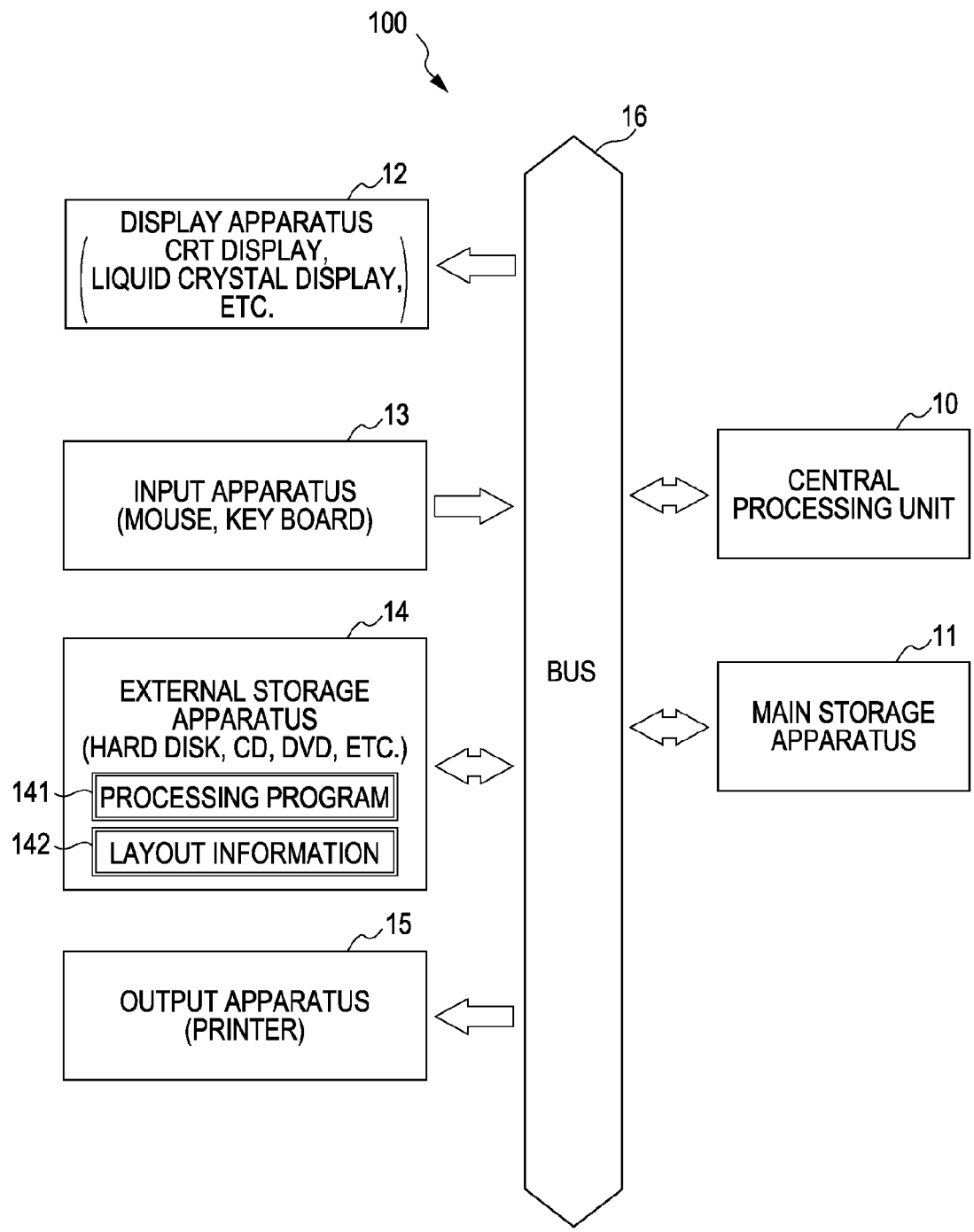
FIG. 1 shows a configuration of a printed circuit board design support apparatus.

FIG. 1 shows an example of a schematic configuration of a computer apparatus including a printed circuit board design support apparatus according to a first embodiment of the present invention. As shown in FIG. 1, a printed circuit board design support apparatus 100 is constructed by including a central processing unit (CPU) 10, a main storage apparatus 11, a display apparatus 12, an input apparatus 13, an external storage apparatus 14, and an output apparatus 15.

The CPU 10 is configured to control the entirety of the apparatus. The main storage apparatus 11 is composed of a read-only store memory (ROM), a random access memory (RAM) for temporarily performing read and write when the CPU 10 performs a calculation processing, or the like. The display apparatus 12 is composed of a cathode-ray tube, a liquid crystal display, or the like. The input apparatus 13 is composed of a mouse, a key board, or the like. The external storage apparatus 14 is configured to perform read and write with respect to a recording medium such as a hard disk, a flexible disk, a CD, a DVD, or an MD. The output apparatus 15 is composed of a printer or the like for printing a calculation result or the like which is output to the display apparatus 12. The respective apparatuses are mutually connected via a bus 16 for transmitting information such as an address bus, a data bus, or a control bus. Such a configuration is adopted that through a control of the CPU 10, the respective apparatuses can send and receive necessary information such as control information or data information via the bus 16.

In addition, the external storage apparatus 14 previously stores a processing program 141 and layout information 142. The processing program 141 is a program according to an embodiment of the present invention, which is installed in the external storage apparatus 14 so as to be executed by the CPU 10.

The layout information 142 is information related to the printed circuit board. That is, the layout information includes information related to an outer shape (profile) and a layer configuration of the printed circuit board, component information such as a positional coordinate of a component mounted to the printed circuit board and a shape and a size of a conductive part to which a terminal is connected, a wiring name of a wiring between components, and wiring information such as positional coordinates of the respective points constituting a wiring diagram.

Figure 2:
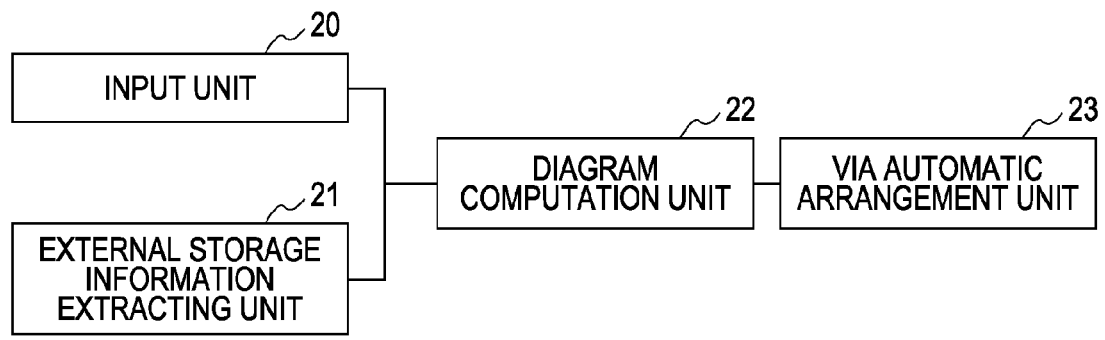
FIG. 2 shows a function configuration of the printed circuit board design support apparatus.

FIG. 2 shows an example of a mechanism configuration of the printed circuit board design support apparatus according to the present embodiment.

A functional configuration shown in FIG. 2 is realized when the CPU 10 executes the processing program 141. The printed circuit board design support apparatus 100 is constructed by including an input unit 20, an external storage information extracting unit 21, a diagram computation unit 22, and a via automatic arrangement unit 23.

The input unit 20 has a function of inputting instruction information such as read of the layout information input via the input apparatus 13 by the user or execution of the processing program 141 and information related to a condition used for executing the processing program 141 or the like to the printed circuit board design support apparatus. Hereinafter, the condition used for executing the processing program 141 or the like will be referred to as via automatic arrangement condition. It is to be noted that the input information is processed or controlled as occasion demands by the CPU 10 to be stored in the main storage apparatus 11.

When the execution of the processing program is input from the input unit 20, the external storage information extracting unit 21 extracts the processing program 141 stored in the external storage apparatus 14 while following the input and stores the extracted program in the main storage apparatus 11. Also, when the instruction of the read of the layout information is received from the input unit 20, the external storage information extracting unit 21 extracts the layout information 142 stored in the external storage apparatus 14 and stores the extracted layout information in the main storage apparatus 11.

The diagram computation unit 22 performs a diagram computation processing such as extraction of an area where diagrams are two-dimensionally overlapped across a plurality of layers while a partial storage area of the main storage apparatus 11 is utilized. The diagram computation unit 22 performs the diagram computation processing on the basis of the via automatic arrangement condition stored in the main storage apparatus 11, the processing program 141, and the layout information 142.

The via automatic arrangement unit 23 performs a calculation processing for determining via arrangement positions and whether the vias are to be arranged and arranges the vias while the partial storage area of the main storage apparatus 11 is utilized.

Figure 3:
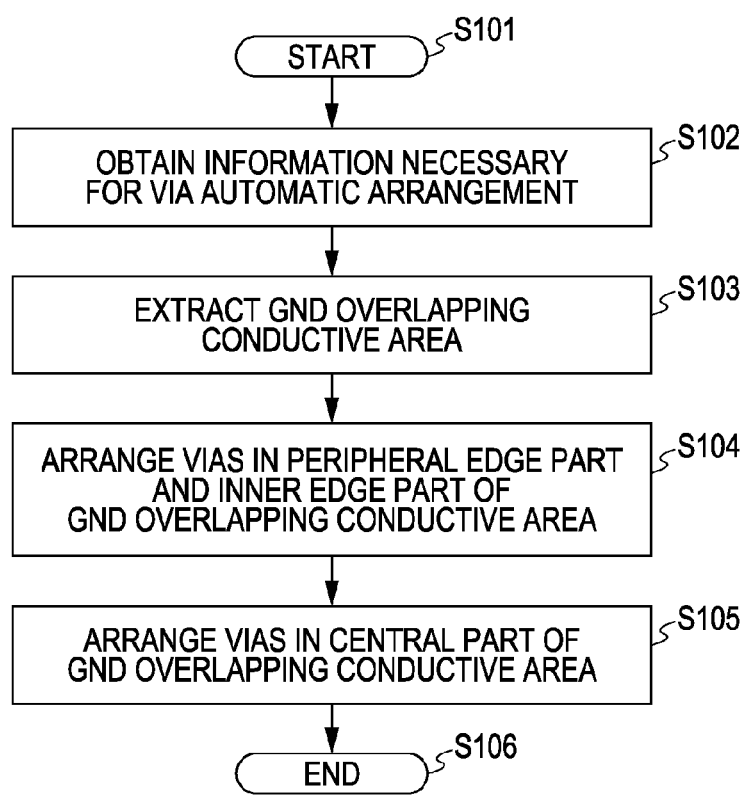
FIG. 3 is a flow chart for an operational processing of the printed circuit board design support apparatus.

FIG. 3 is a flow chart showing a example of a processing procedure performed by the printed circuit board design support apparatus according to the present embodiment on the basis of the printed circuit board design support program (the processing program). FIGS. 4 and 5 are flow charts showing operations in detail in the respective steps of the flow chart shown in FIG. 3.

First, the operation of the printed circuit board design support apparatus according to the present embodiment will be described with reference to FIG. 3. In step S101, when the processing program execution instruction is input from the input unit 20, the external storage information extracting unit 21 transfers the processing program 141 to the main storage apparatus 11. Next, the diagram computation unit 22 and the via automatic arrangement unit 23 execute the processing program 141, and the processing in the flow chart shown in FIG. 3 is started.

In step S102, the input unit 20 transfers the input information to the main storage apparatus 11, and the external storage information extracting unit 21 extracts the layout information 142 to be transferred to the main storage apparatus 11. That is, the input unit 20 and the external storage information extracting unit 21 obtain and set information necessary for via automatic arrangement which will be described below.

In step S103, the diagram computation unit 22 extracts a GND overlapping conductive area which will be described below.

In step S104, the via automatic arrangement unit 23 automatically arranges GND vias which will be described below in a peripheral edge part and an inner edge part at an interval equal to or smaller than a predetermined interval.

In step S105, the via automatic arrangement unit 23 automatically arranges the GND vias in an area except for the peripheral edge part and the inner edge part (hereinafter, referred to as central part) at an interval equal to or smaller than a predetermined interval. In step S106, the processing program is ended.

Next, the operation of the printed circuit board design support apparatus according to the present embodiment will be described on the basis of the detailed flow charts shown in FIGS. 4 and 5 with reference to schematic diagrams shown in FIGS. 6A to 6E and FIGS. 9A to 9D to FIG. 16. It is to be noted that in the following description, in order to facilitate the understanding, the schematic diagrams shown in FIGS. 6A to 6E are used for the printed circuit board. The actual printed circuit board has highly-condensed and complex wirings, and the following schematic description does not exclude the situation.

Here, the schematic diagrams of the printed circuit board shown in FIGS. 6A to 6E will be described. The printed circuit board shown in FIGS. 6A to 6E has a construction in which four layers of conductive layers are laminated via insulating films, respectively. To be more specific, as shown in the cross sectional view of FIG. 6E, conductive layers 60, 61, 62, and 63 have a configuration of being layered via the insulating layers 64, respectively. FIGS. 6A to 6D are plane views as seen from the conductive layer side of the conductive layers 60, 61, 62, and 63 to the insulating layer side. In the respective plane views, gray parts, black circles, and black line parts are parts having conductivity. Also, outlined parts are parts having no conductivity (in the case of lamination on the insulating layer, parts having the insulator exposed).

Components 600 and 630 shown in FIGS. 6A and 6D are active components arranged on the printed circuit board. Also, black solid line parts 601, 621, and 631 shown in FIGS. 6A, 6C, and 6D are conductive areas of signal wirings whose potentials are different from the GND. Also, black circles 602, 622, and 632 shown in FIGS. 6A, 6C, and 6D are vias of the signal wirings whose potentials are different from the GND. Also, gray parts 603, 613, 623, and 633 shown in FIGS. 6A to 6D are wirings respectively having the GND potential, that is, GND conductive areas. It is to be noted that in FIGS. 6A to 6D, in order to facilitate visualization in the drawings, symbols are assigned to only a part of the conductive areas and the vias of the signal wirings.

Next, flow charts of FIGS. 4 and 5 will be described in detail.

First, in step S400, when the processing program execution instruction is input from the input unit 20, the external storage information extracting unit 21 transfers the processing program 141 to the main storage apparatus 11, and the diagram computation unit 22 and the via automatic arrangement unit 23 execute the processing program 141. Next, in step S401, the input unit 20 sets the input via automatic arrangement condition. Herein, the via automatic arrangement conditions refer to a largest allowable value L1, a largest allowable value L2, a largest allowable value L3, and the like. The largest allowable value L1 (hereinafter, referred to as predetermined interval L1) is the largest allowable value of an interval from a peripheral edge of an area where the conductive areas of the respective layers are two-dimensionally overlapped with one another (hereinafter, referred to as the GND overlapping conductive area) to the GND via. Also, the largest allowable value L2 (hereinafter, referred to as predetermined interval L2) is the largest allowable value of an interval between GND vias in the peripheral edge part and the inner edge part. Also, the largest allowable value L3 (hereinafter, referred to as predetermined interval L3) is the largest allowable value of an interval between GND vias in the central part of the GND overlapping conductive area.

At this time, the predetermined intervals L2 and L3 are preferably set smaller than ½ ($\lambda/2$) of the wavelength of the signal current having the largest frequency flowing through the conductive area of the printed circuit board ($\lambda$). This is because resonance of a return current flowing on the GND conductive area of the printed circuit board and a reflected current thereof is prevented. In actuality, the GND or the power source via is preferably arranged in a range of a distance of $\lambda/2$ in any directions as seen from one GND via. On the other hand, in actuality, when the GND or the power source via is arranged at an interval equal to or smaller than $\lambda/10$, it is possible to sufficiently suppress the radiation noise. Therefore, it suffices that L2=L3=$\lambda/10$ is set.

Also, in a case where the GND vias are arranged in the peripheral edge part and the inner edge part at an interval smaller than that in the central part, for example, L2=$\lambda/10$ and L3=$\lambda/4$ may be set. For example, in a case where the frequency of the highest-speed signal current on the printed circuit board is 1 GHz, the wavelength of the signal on the printed circuit board is approximately 15 cm. Therefore, it suffices, for example, that L2=1.5 cm and L3=3.75 cm are set. Also, to be more strict, in a case where the frequency is denoted by f, a dielectric constant is denoted by $\epsilon r$, a magnetic permeability is denoted by $\mu r$, and the light speed is denoted by c, the wavelength $\lambda p$ of the signal on the printed circuit board can be calculated through $\lambda p=c/(f\times\sqrt{(\epsilon r \mu r)})$. Therefore, the wavelength calculated through this expression may also be used.

Figure 7A:
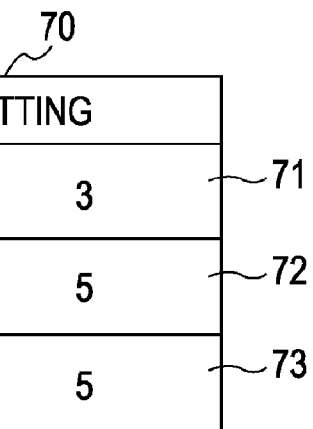
FIGS. 7A and 7B are explanatory diagrams for describing a setting method for a via automatic arrangement condition according to the first embodiment.
Figure 7B:
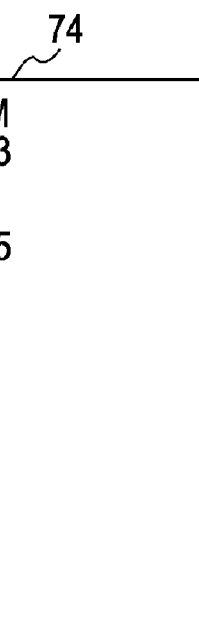
Figure 9A:
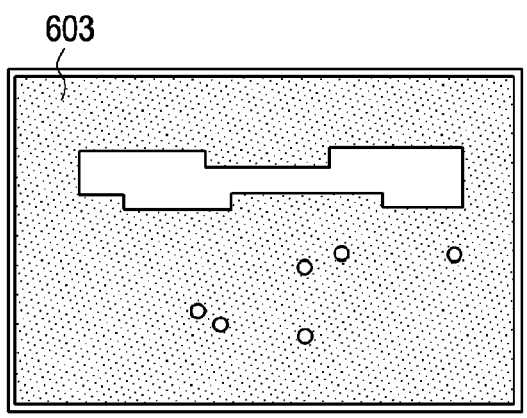
FIGS. 9A to 9D show states after a processing in step S404 according to the first embodiment.
Figure 9B:
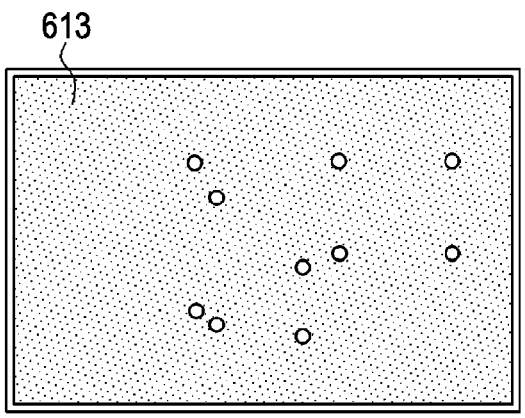
Figure 9C:
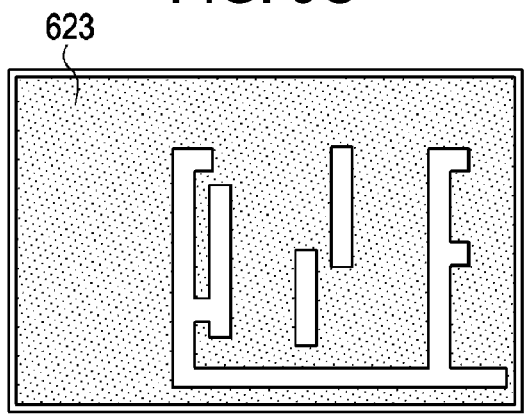
Figure 9D:
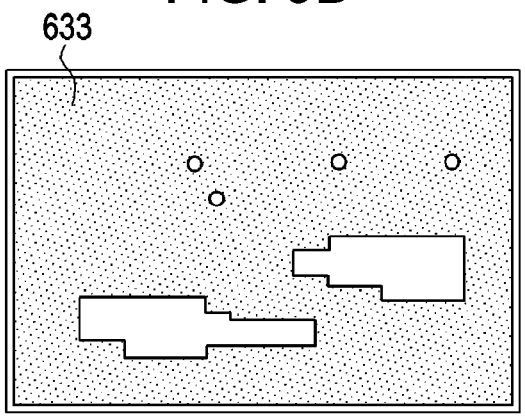

Next, an example of the setting method for the via automatic arrangement condition in step S401 will be described with reference to FIGS. 7A and 7B. FIG. 7A shows an example of an input screen for inputting the via automatic arrangement condition. The user can input the above-mentioned predetermined intervals L1 to L3 in input fields 71 to 73 of an input screen 70 via the input apparatus 13. The input unit 20 reads out the input via automatic arrangement condition to be stored in the main storage apparatus 11. It is to be noted that a setting method for the via automatic arrangement condition is not limited to the input to the input screen shown in FIG. 7A. For example, the via automatic arrangement condition may be set automatically in such a manner that a file 74 describing the via automatic arrangement condition shown in FIG. 7B is previously stored in the external storage apparatus 14, and the CPU 10 reads out the file to store the via automatic arrangement condition in the main storage apparatus 11. In this case, a structure of the file describing the via automatic arrangement condition is not limited to that shown in FIG. 7B, and any structure may be used as long as the via automatic arrangement condition can be read out. Also, in a case where the via automatic arrangement condition is set constant irrespective of the printed circuit board, the via automatic arrangement condition may be described in the processing program 141.

As described above, the via automatic arrangement condition can be calculated on the basis of the wavelength λ of the signal current. Therefore, a method can also be conceivable in which the user inputs the frequency of the signal current in the input screen and calculates the wavelength λ on the basis of the frequency thereof, and for example, by setting L2=λ/10 and L3=λ/4, L2 and L3 are calculated.

While referring back to the flow chart shown in FIG. 4, step S402 and subsequent steps will be described. It is to be noted that the operational processing in steps S402 to S406 is a processing carried out by the diagram computation unit 22 on the basis of the layout information 142 stored in the main storage apparatus 11.

In step S402, the diagram computation unit 22 extracts GND wiring names from the layout information 142.

Next, in step S403, the diagram computation unit 22 selects one GND wiring name as a verification target from the extracted GND wiring names.

Next, in step S404, the diagram computation unit 22 identifies the conductive areas of the respective layers related to the selected GND wiring name. This processing corresponds to an example of a ground conductive area identifying step.

Next, in step S405, the diagram computation unit 22 extracts an area where the identified conductive areas of the respective layers are two-dimensionally overlapped with one another in a height direction as a GND overlapping conductive area A. This processing corresponds to an example of an extracting step.

Next, in step S406, the diagram computation unit 22 determines whether a GND wiring name in which the GND overlapping conductive area is not yet extracted exists. In a case where the wiring name in which the GND overlapping conductive area is not extracted exists, the flow is returned to the processing in step S403. In a case where the wiring name in which the GND overlapping conductive area is not extracted does not exist, the flow advances to the processing in step S407.

The next operational processing in steps S407 to S419 is a processing carried out by the via automatic arrangement unit 23 on the basis of the layout information 142 stored in the main storage apparatus 11.

In step S407, when the GND overlapping conductive area A is extracted in all the GND wiring names, the via automatic arrangement unit 23 obtains position information and shape information of the GND overlapping conductive area A from the layout information 142.

Next, in step S408, the via automatic arrangement unit 23 arranges one piece of the via having the same potential as the GND (hereinafter, referred to as GND via) in the GND overlapping conductive area A within the predetermined interval L1 from the respective construction points constructing the GND overlapping conductive area A.

Next, in step S409, the via automatic arrangement unit 23 calculates a distance D1 between the adjacent GND vias along a line constructing a peripheral edge of the GND overlapping conductive area A (hereinafter, referred to as construction line) among the respective vias arranged in step S408. The via automatic arrangement unit 23 calculates a value N1 which is obtained while 1 is added to an integer part of a quotient obtained by dividing D1 by the predetermined interval L2. Furthermore, the via automatic arrangement unit 23 calculates a value C1 (=D1/N1) obtained by dividing the distance D1 between the GND vias by N1, and divides a gap between the adjacent GND vias along the GND overlapping conductive area A of the vias arranged in step S408 into a distance C1 within a predetermined interval.

Next, in step S410, the via automatic arrangement unit 23 arranges the GND vias at the division positions divided in step S409. In this manner, in steps S408 to S410, the via automatic arrangement unit 23 arranges the GND vias at a plurality of predetermined positions. This processing corresponds to a second arranging step.

Next, while following step A shown in FIG. 4 to step A shown in FIG. 5, in step S411, the via automatic arrangement unit 23 selects one of the GND vias already arranged in the GND overlapping conductive area A from the layout information 142. This processing corresponds to a first selecting step.

In step S412, the via automatic arrangement unit 23 calculates four points shifted (separated) by a value of the half of the largest allowable value L3 (L3/2) of the interval between the GND vias in the central part of the GND overlapping conductive area from the selected GND via in the respective positive and negative directions of the x direction and y direction. This processing corresponds to a calculating step. Hereinafter, the point shifted (separated) in the above-mentioned manner is referred to as slide position.

In step S413, the via automatic arrangement unit 23 selects one point P1 from the slide positions calculated in step S412.

In step S414, the via automatic arrangement unit 23 determines whether the GND via exists within a range at a distance half of the predetermined interval L3 (L3/2) from the slide position P1 selected in step S413. In a case where the GND via exists, the flow advances to the processing in step S417. In a case where the GND via does not exist, the flow advances to the processing in step S415.

In step S415, the via automatic arrangement unit 23 determines whether the point P1 exists in the GND overlapping conductive area A. In a case where the point P1 exists in the GND overlapping conductive area A, the flow advances to the processing in step S416. In a case where the point P1 does not exist in the GND overlapping conductive area A, the flow advances to the processing in step S417.

In step S416, the via automatic arrangement unit 23 arranges the GND via at the point P1. This processing corresponds to an other interlayer connection member arranging step.

Next, in step S417, the via automatic arrangement unit 23 determines whether the slide position in which the determination in step S414 is not performed (the slide position other than the point 1) exists among the four points calculated in step S412. In a case where the slide position in which the processing in step S414 is not performed exists, the flow is returned to the processing in step S413. On the other hand, in a case where the slide position in which the processing in step S414 is not performed does not exist, the flow advances to the processing in step S418.

In step S418, the via automatic arrangement unit 23 determines whether another GND via in which the processing is not performed in step S412 exists in the GND overlapping conductive area A. At this time, the GND via arranged in step S415 is also set as the target of the GND via determined whether the processing in step S412 is performed. In a case where the GND via in which the processing in step S412 is not performed exists, the flow is returned to the processing in step S411. In a case where the GND via in which the processing in step S412 is not performed does not exist, in step S419, the processing program 141 is ended.

Herein, in the processing in steps S402 to S406 according to the present embodiment, a configuration is adopted in which the GND overlapping conductive areas are extracted from the GND conductive areas having the respective GND wiring names. On the other hand, as the GND conductive areas having the respective GND wiring names have the respective GND attribute information other than the respective GND wiring name, similarly as in the processing in steps S402 to S406, the GND overlapping conductive areas with respect to the respective GND wiring names can be extracted.

In addition, as all the GND conductive areas have the GND attribute information, the GND overlapping conductive areas with respect to all the GND conductive areas can also be extracted.

Here, FIG. 8 is an example of a flow chart of an operational processing similar to that according to the present embodiment in a case where all the GND conductive areas have the GND attribute information. In the flow chart shown in FIG. 8, in step S5804, the diagram computation unit 22 extracts the conductive areas of the respective layers having the respective GND attribute information and extracts the two-dimensionally overlapped area with respect to the areas having the same attribute information in step S405. At this time, also in a case where plural pieces of the GND attribute information exist, irrespective that the pieces of the GND attribute information are identical or different from each other, the two-dimensionally overlapped area of the respective layers can also be extracted. It is to be noted that step A shown in FIG. 8 follows step A shown in FIG. 5.

Next, with reference to the above-mentioned schematic diagrams of the printed circuit board shown in FIGS. 6A to 6E, the processing operation in the above-mentioned flow charts shown in FIGS. 4 and 5 will be specifically described in step S404 and subsequent steps. In step S404, the diagram computation unit 22 identifies the conductive areas having the respective GND wiring name selected in step S403 from the conductive areas of the respective layers shown in FIGS. 6A to 6D, that is, the GND conductive areas 603, 613, 623, and 633. FIGS. 9A to 9D are drawings showing the GND conductive area identified in step S404 in schematic plane views. The printed circuit boards shown in FIGS. 9A to 9D respectively correspond to the printed circuit boards shown in FIGS. 6A to 6D.

Figure 10:
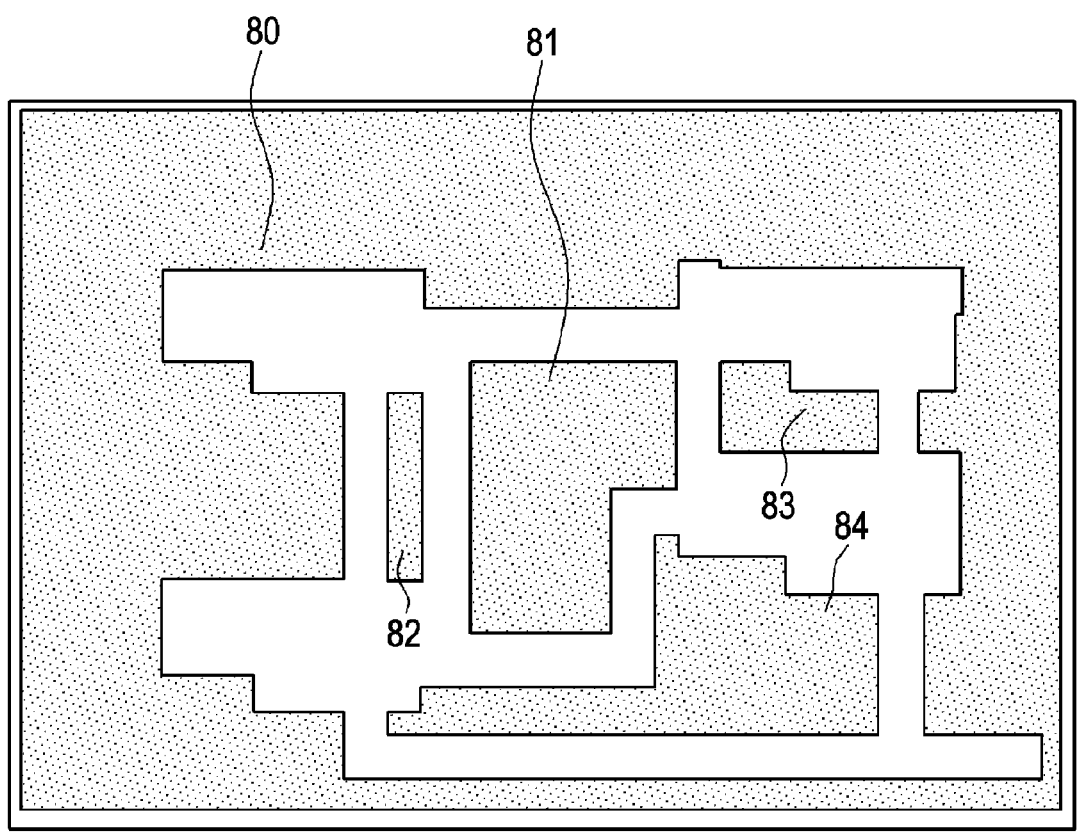
FIG. 10 shows a state after a processing in step S405 according to the first embodiment.

In step S405, the diagram computation unit 22 projects the conductive areas of the respective layers 603, 613, 623, and 633 shown in FIGS. 9A to 9D to extract an area in which the GND conductive areas of all the layers are two-dimensionally overlapped with one another, that is, the GND overlapping conductive area. FIG. 10 shows the GND overlapping conductive area extracted in step S405. That is, areas 80, 81, 82, 83, and 84 of gray parts shown in FIG. 10 are the GND overlapping conductive areas.

Hereinafter, in order to facilitate a description on a processing of automatically arranging the GND via, while paying attention to the GND overlapping conductive area 81 among the GND overlapping conductive areas shown in FIG. 10, the processing of automatically arranging the GND via will be described.

In step S407, the via automatic arrangement unit 23 obtains position information and shape information of the GND overlapping conductive area 81. To be more specific, first, the via automatic arrangement unit 23 obtains coordinates and orders of construction points 900, 901, 902, 903, 904, and 905 constituting the GND overlapping conductive area 81 shown in FIG. 11. Next, the via automatic arrangement unit 23 calculates coordinates of the starting points and the ending points of construction lines 910, 911, 912, 913, 914, and 915 constituting the GND overlapping conductive area 81 shown in FIG. 11 from the coordinates and orders of the construction points. Hereinafter, a description will be given of a processing of automatically arranging the GND vias in the peripheral edge part within the predetermined interval executed in steps S408 to S410 on the basis of the position information and the shape information of the GND overlapping conductive area 81.

Figure 11:
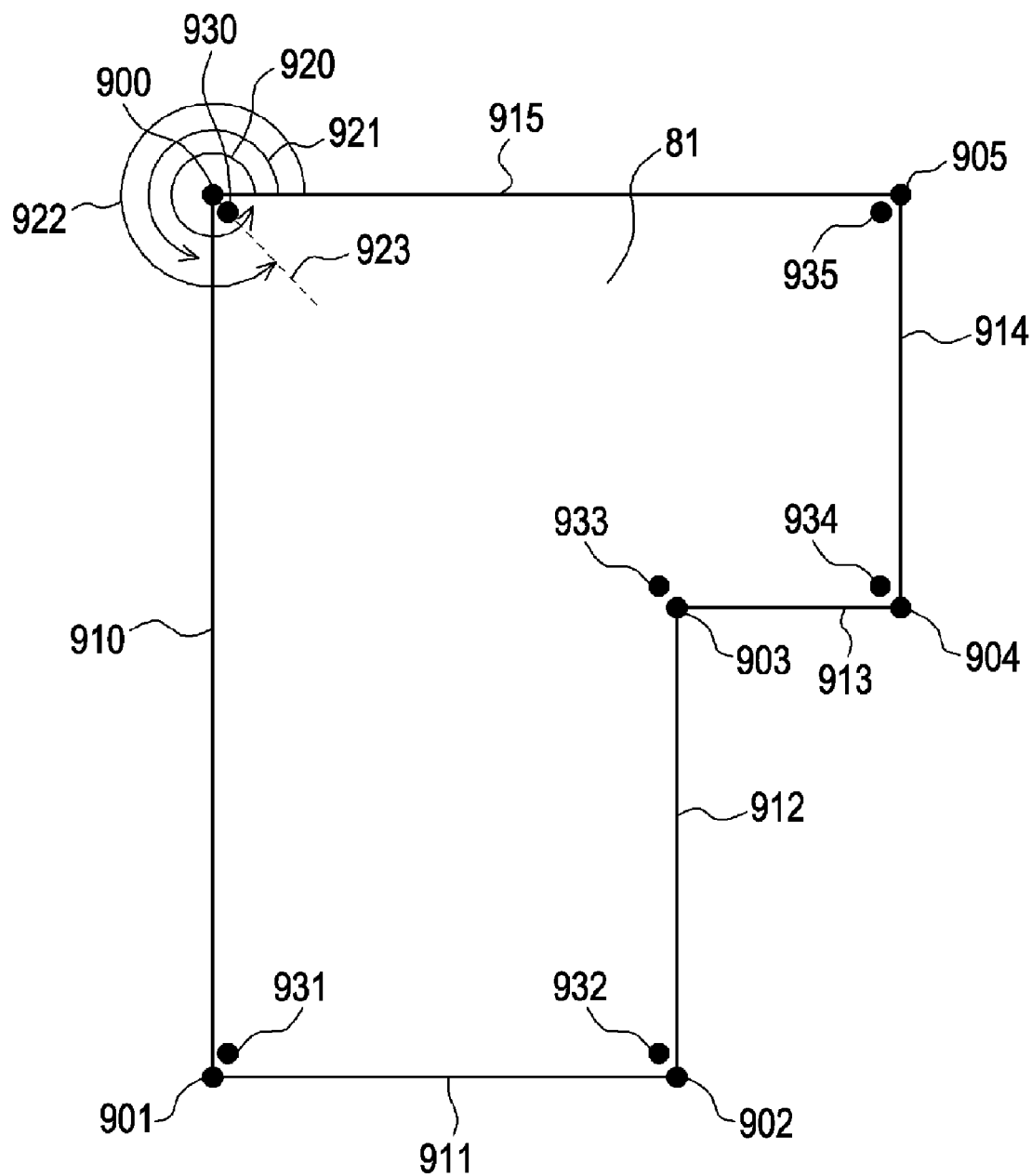
FIG. 11 is an explanatory diagram for describing step S408 according to the first embodiment.

In step S408, the via automatic arrangement unit 23 arranges GND vias 930, 931, 932, 933, 934, and 935 inside the GND overlapping conductive area 81 as shown in FIG. 11 from the coordinate information of the construction points 900, 901, 902, 903, 904, and 905. Herein, a calculation method for the arrangement position of the GND via arranged in step S408 will be described. At this time, the description will be given while attention is paid on the GND via 930 among the GND vias.

First, the via automatic arrangement unit 23 calculates an angle $\theta_1$ of a corner 920 and an angle $\theta_2$ of a corner 921 as seen from the component in parallel with the positive direction of the x axis of the construction point 900 defined by the construction lines 915 and 910 constituting the GND overlapping conductive area 81. Next, the via automatic arrangement unit 23 calculates an angle $\theta_3$ of an intermediate corner 922 between the corner 920 and the corner 921 $(=(\theta_1+\theta_2)/2)$. Furthermore, the via automatic arrangement unit 23 calculates a position in the direction of the corner 922 as seen from the construction point 900, that is, on a dotted line 923, and also away from the construction point 900 by the distance of the predetermined interval L1 and arranges the GND via 930. With this method, the GND via exists in the GND overlapping conductive area, and also the interval from the peripheral edge of the GND overlapping conductive area to the GND via is not set to be larger than the predetermined interval L1.

In addition, as another method, a method may also be used with which the via automatic arrangement unit 23 calculates a plurality of positions away from the construction point 900 by the predetermined interval L1 in directions of a plurality of predetermined angles and selects the position in the GND overlapping conductive area 81 among the positions. Furthermore, a method may also be used with which after the calculation of the angle $\theta_1$, the via automatic arrangement unit 23 calculates a position on the line facing in the GND overlapping conductive area 81 for the first time after rotating by a predetermined angle each in the clockwise direction from the construction line 915 and also away from the construction point 900 by the distance of the predetermined interval L1. It is to be noted that with the method of calculating the position for arranging the GND via described herein, the position away from the construction point 900 by the distance L1 is calculated, but the via automatic arrangement unit 23 may adopt a value shorter than L1 such as L1/2 or L1/3.

In step S408, the via automatic arrangement unit 23 performs a similar processing on the other construction points 901, 902, 903, 904, and 905 to arrange the GND vias 931, 932, 933, 934, and 935.

Figure 12:
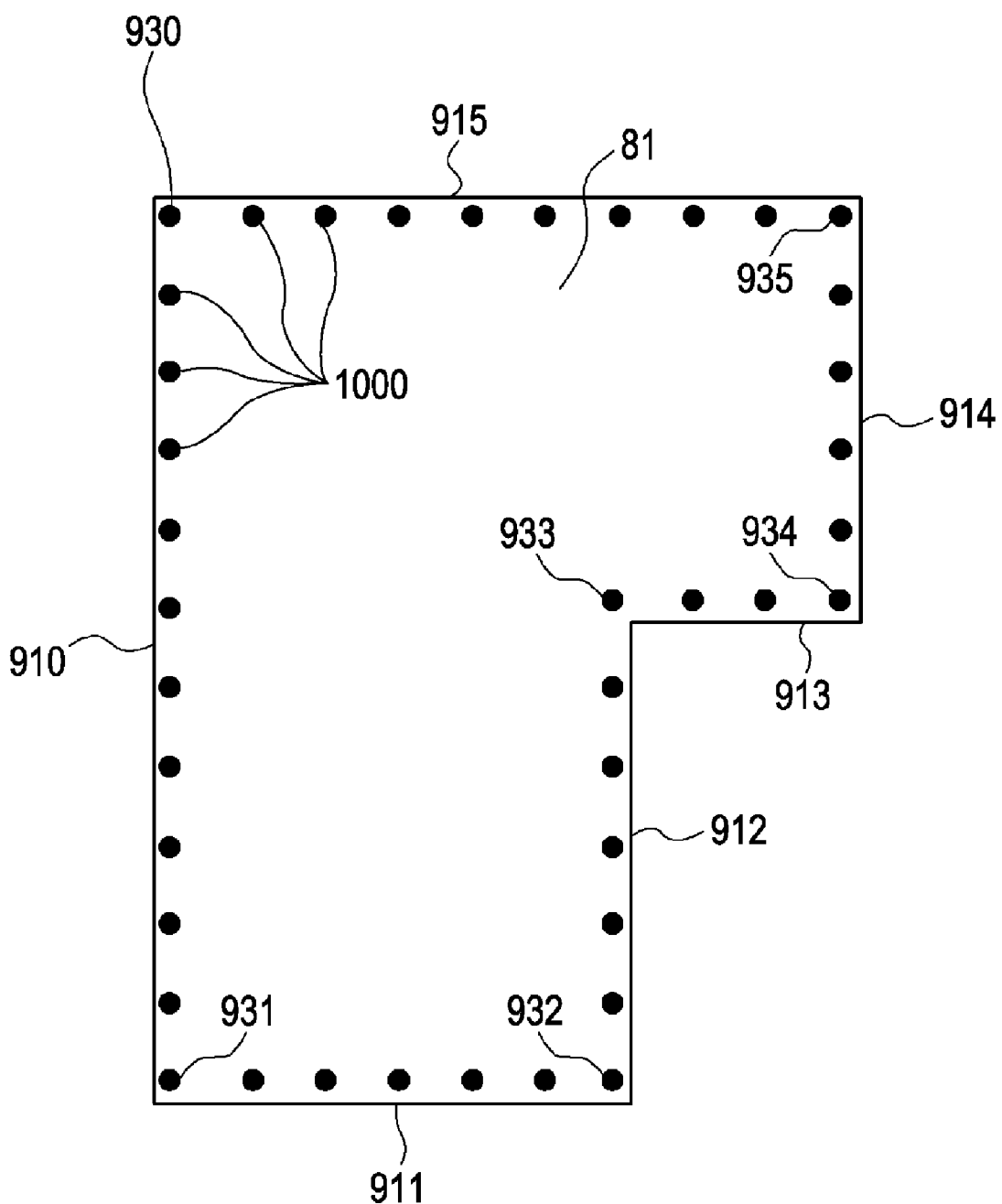
FIG. 12 shows a state after a processing in step S410 according to the first embodiment.

In step S409, the via automatic arrangement unit 23 divides a gap between the GND vias of the GND vias 931, 932, 933, 934, and 935 arranged in step S408 by a distance equal to or smaller than the predetermined interval L2 and arranges the GND vias 1000 as shown in FIG. 12. It is to be noted that in FIG. 12, in order to facilitate visualization in the drawings, the symbol is assigned to only the GND via 1000 which is a part of the arranged GND vias. Herein, in steps S408 and S409, a method of arranging the GND vias will be described. At this time, the description will be given while paying attention to a gap between the GND via 930 and the GND via 931. First, the via automatic arrangement unit 23 calculates a straight line distance D1 between the GND via 930 and the GND via 931. Next, the via automatic arrangement unit 23 calculates a quotient (D1/L2) obtained by dividing D1 by the predetermined interval L2 and adds 1 to an integer part of the quotient to set the value as N1. Finally, the via automatic arrangement unit 23 calculates a quotient C1 (=D1/N1) obtained by dividing D1 by N1. Next, the via automatic arrangement unit 23 arranges the GND via 1000 at a position at every distance C1 from the GND via 930 towards the GND via 931. With this configuration, the interval between the GND vias 1000 is certainly smaller than L2. Furthermore, as the GND vias 930 and 931 exist within the predetermined interval L1 from the peripheral edge of the GND overlapping conductive area 81, the GND vias 1000 also exist within the predetermined interval L1 from the peripheral edge of the GND overlapping conductive area 81.

Herein, the description has been given while paying attention to the GND overlapping conductive area 81 having no inner edge part. However, even in a case where the GND overlapping conductive area 81 has an inner edge part, it is possible to obtain the position information and the shape information. Therefore, with a similar method to the method of arranging the GND vias in the peripheral edge part, it is possible to arrange the GND vias in the inner edge part too. Also, in the above description, the position of the GND via arranged first in the GND overlapping conductive area is in the vicinity of the construction point of the GND overlapping conductive area. On the other hand, for example, the position of the GND via arranged first in the GND overlapping conductive area may be a position to which the middle point of the construction line of the GND overlapping conductive area is shifted vertically with respect to the construction line by a value half of the predetermined interval L1 (L1/2) towards the inner side of the GND overlapping conductive area.

Furthermore, the GND via may not be necessarily arranged in the vicinity of the construction point. For example, points on the construction lines 915 and 911 and also within the distance L1 from the construction line 910 are respectively calculated, and a gap between the two points is divided into an interval small than L2 similarly as in the above, the GND vias may be arranged at the divided points.

Next, a processing operation of automatically arranging the GND vias in the central part of the GND overlapping conductive area 81 within the predetermined interval L3 in steps S411 to S417 will be specifically described.

In step S411, the via automatic arrangement unit 23 selects one of the plurality of GND vias already arranged in the GND overlapping conductive area 81. At this time, it is assumed that, for example, the via automatic arrangement unit 23 selects shown a GND via 1100 in FIG. 13.

Figure 13:
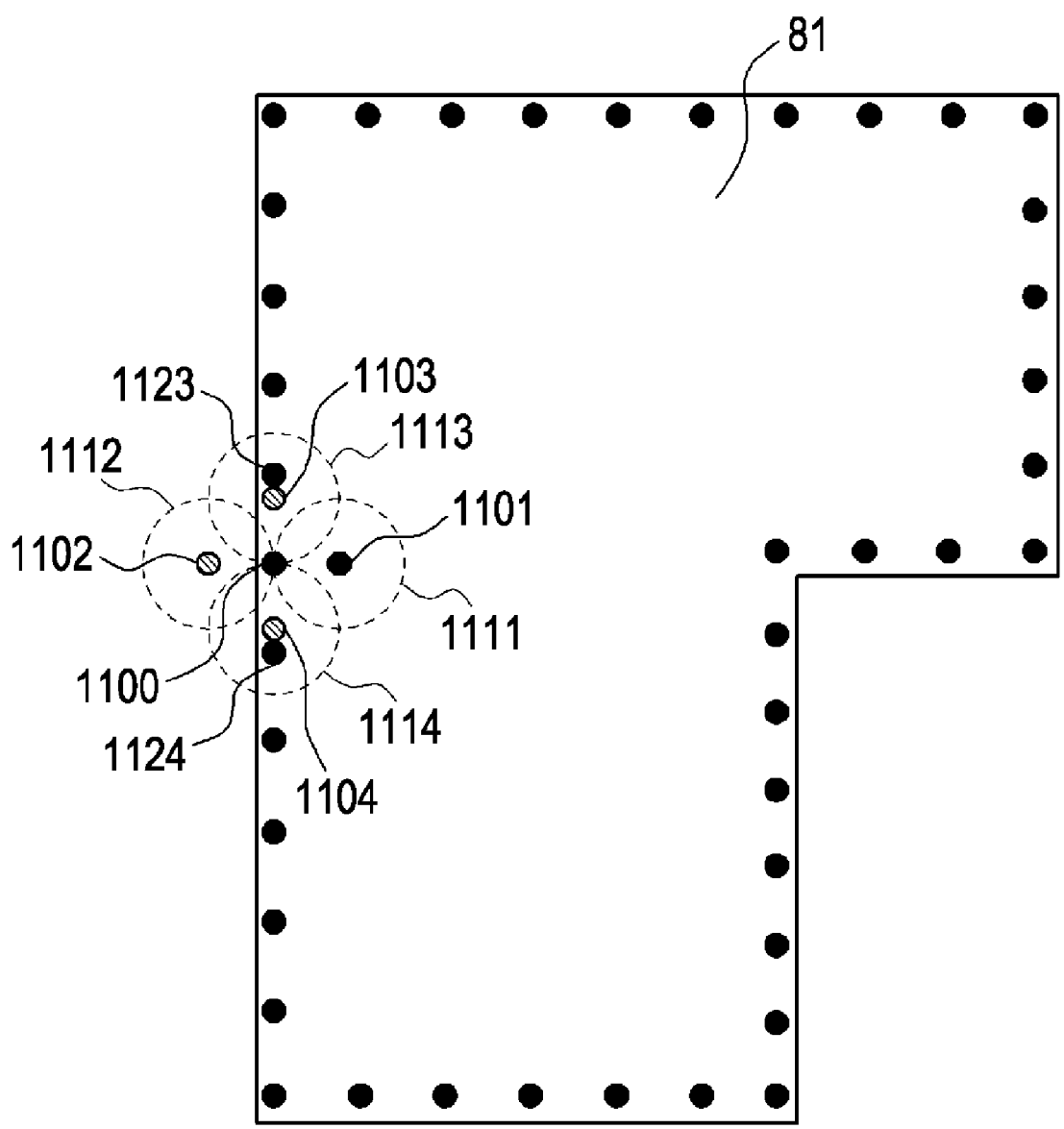
FIG. 13 is an explanatory diagram for describing a processing from steps S411 to S416 according to the first embodiment.

In step S412, the via automatic arrangement unit 23 calculates a plurality of slide positions shifted in a predetermined position by a predetermined distance from the GND via 1100. Here, a calculation method for the slide positions will be described. First, the via automatic arrangement unit 23 sets slide positions to which the GND via 1100 are shifted in the respective positive and negative directions in the x axis direction and the y axis direction by a distance half of the predetermined interval L3 (L3/2). To be more specific, as shown in FIG. 13, the positions shifted in the positive direction in the x axis direction, the negative direction in the x axis direction, the positive direction in the y axis direction, and the negative direction in the y axis direction respectively correspond to slide positions 1101, 1102, 1103, and 1104. In addition, as another method, the via automatic arrangement unit 23 may also sets positions shifted by a value such as L3/2 or L3/3 which is smaller than L3 in the positive direction in the x axis direction, the positive direction in the y axis direction, or the like, rotated by an angle of 30° each in the clockwise direction from a half line drawn from the GND via 1100, for example, as the slide positions.

In step S413, the via automatic arrangement unit 23 selects one of the slide positions 1101, 1102, 1103, and 1104. For example, in a case where the slide position 1101 is selected, in step S414, the via automatic arrangement unit 23 determines that another GND via does not exist within a range by a distance half of the predetermined interval L3 (L3/2) from the slide position 1101, that is, in a circle 1111 shown in FIG. 13.

Next, in step S415, the via automatic arrangement unit 23 determines that the slide position 1101 exists in the GND overlapping conductive area 81.

Therefore, step S416, the via automatic arrangement unit 23 arranges the GND via 1101 at the slide position 1101.

Next, in step S417, as the via automatic arrangement unit 23 has not determined as to the remaining slide positions 1102, 1103, and 1104 whether another GND via exists in the predetermined range, the flow is returned to the processing in step S413.

Also, in step S413, in a case where the via automatic arrangement unit 23 selects the slide position 1102, in step S414, it is determined whether another GND via does not exist in a range of the distance of L3/2 from the slide position 1102, that is, in a circle 1112 shown in FIG. 13. Next, in step S415, as the via automatic arrangement unit 23 determines that the slide position 1102 is out of the GND overlapping conductive area 81, the flow advances to the processing in step S417. In step S417, the via automatic arrangement unit 23 has not determined as to the remaining slide positions 1103 and 1104 whether another GND via exists in the predetermined range, the flow is returned to the processing in step S413.

Furthermore, in step S413, in a case where the via automatic arrangement unit 23 selects the slide position 1103, in step S414, it is determined whether the GND via 1123 exists in a range of the distance of L3/2 from the slide position 1103, that is, in a circle 1113 shown in FIG. 13. Therefore, the flow advances to the processing in step S417.

In step S417, as the via automatic arrangement unit 23 has not determined as to the remaining slide position 1104 whether another GND via exists in the predetermined range, the flow is returned to the processing in step S413.

Then, in step S413, the via automatic arrangement unit 23 selects the slide position 1104. In step S414, similarly as in the case of the determination for the position 1103, the via automatic arrangement unit 23 determines whether the GND via 1124 exists in a circle 1114. Therefore, the flow advances to the processing in step S417. In step S417, as the via automatic arrangement unit 23 does not have slide positions to determine whether another GND via exists in the predetermined range, the flow advances to the processing in step S418.

In step S418, the via automatic arrangement unit 23 determines that the GND via exists in which the processing in step S412 is not performed, and the flow is returned to the processing in step S411. In step S411, the via automatic arrangement unit 23 selects one of the plurality of GND vias in which the processing in step S412 is not performed. Hereinafter, by repeatedly executing the processing in steps S411 to S418, the GND vias are automatically arranged in the central part of the GND overlapping conductive area 81.

Figure 14:
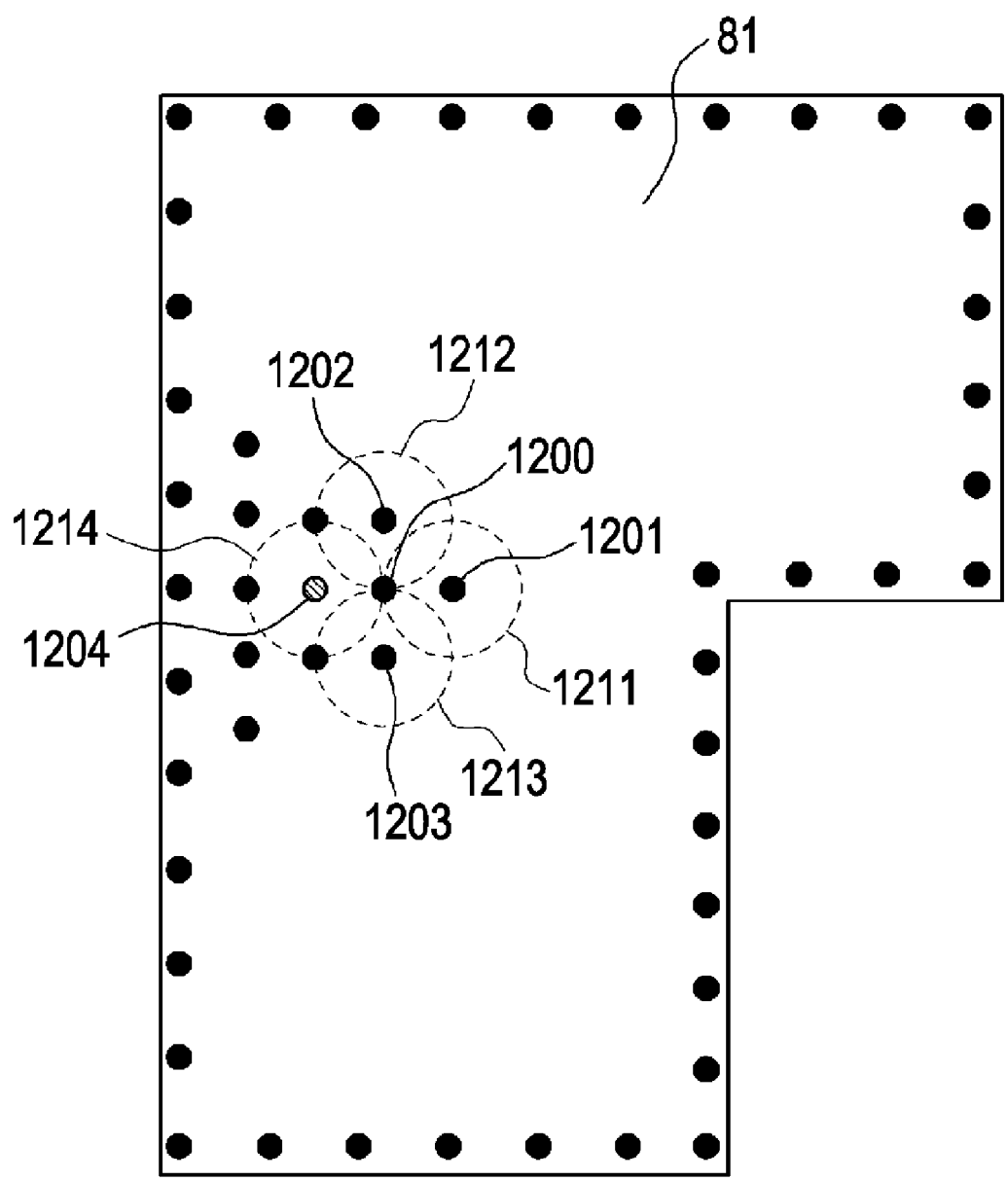
FIG. 14 is an explanatory diagram for describing the processing from steps S411 to S416 according to the first embodiment.

Next, a case will be described in which the via automatic arrangement unit 23 selects a GND via 1200 shown in FIG. 14 from the plurality of GND vias in step S411. In this case, in step S412, the via automatic arrangement unit 23 calculates, as shown in FIG. 14, slide positions 1201, 1202, 1203, and 1204. Then, as to the slide positions 1201, 1202, and 1203, in step S414, the via automatic arrangement unit 23 determines that the GND vias do not respectively exist in ranges of the distance of L3/2 (in circles 1211, 1212, and 1213 shown in FIG. 14). Furthermore, in step S415, the via automatic arrangement unit 23 determines that slide position exists in the GND overlapping conductive area 81. Therefore, in step S416, the via automatic arrangement unit 23 arranges the GND vias 1201, 1202, and 1203.

On the other hand, as to the slide position 1204, the GND via is already arranged at the same position as the slide position 1204. Thus, in step S414, the via automatic arrangement unit 23 determines that the GND via exists within the range of L3/2 (in a circle 1214 shown in FIG. 14). Therefore, the via automatic arrangement unit 23 does not arrange the GND via. Hereinafter, similarly, the processing in steps S411 to S418 is repeatedly executed until the GND via in which the processing in step S412 is not performed does not exist.

In step S418, in a case where the via automatic arrangement unit 23 determines that the GND via in which the processing in step S412 is not performed does not exist, the program is ended in step S419.

Figure 15:
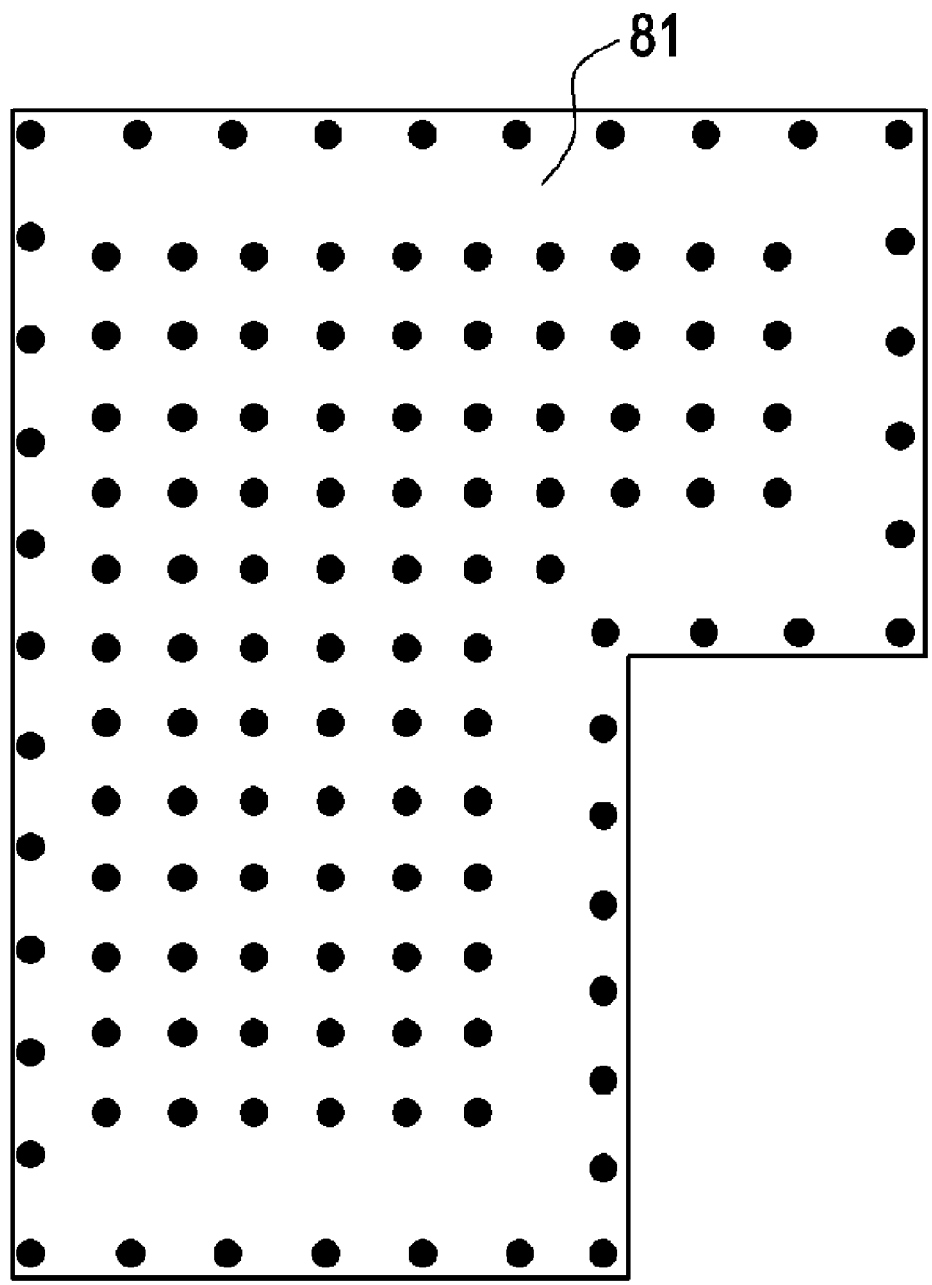
FIG. 15 shows an arrangement state of GND vias after the processing according to the first embodiment.

FIG. 15 shows an arrangement state of the GND vias in the GND overlapping conductive area 81 at a time point when the program is ended in step S419. As shown in FIG. 15, the GND vias are respectively arranged in the peripheral edge part and the central part of the GND overlapping conductive area 81 within the predetermined interval.

Figure 16:
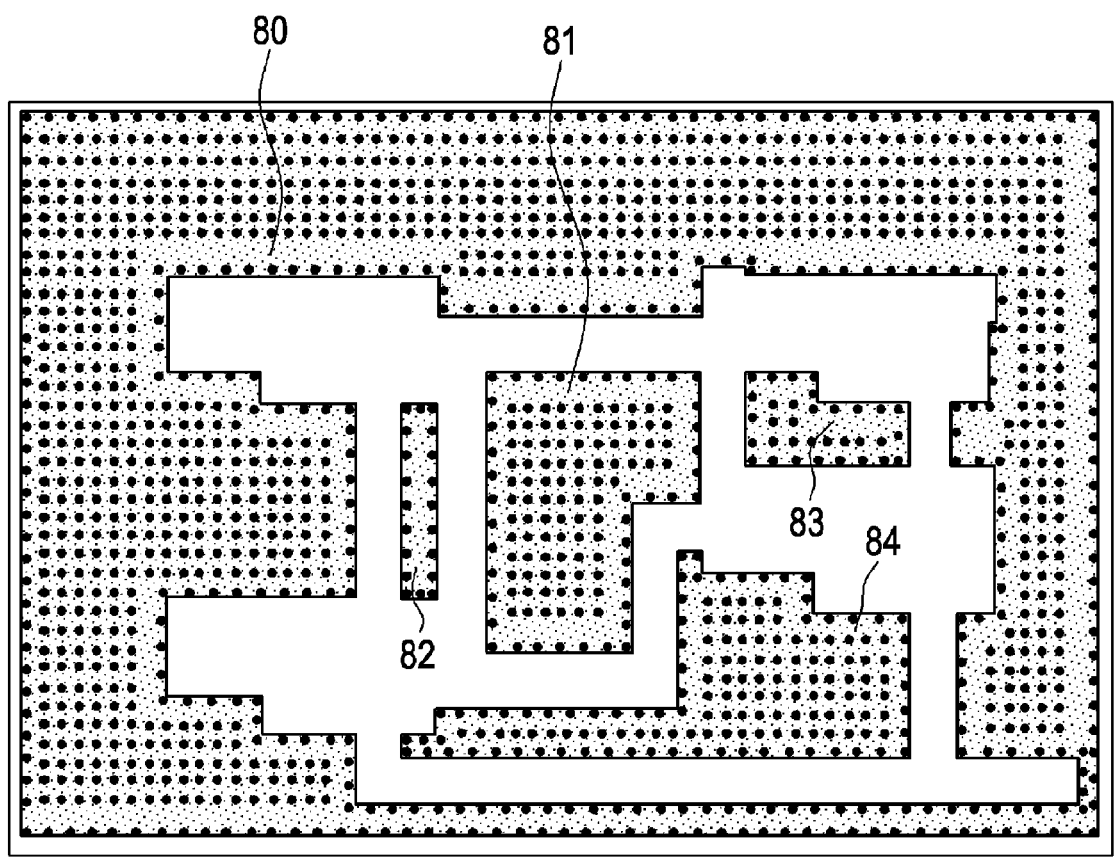
FIG. 16 shows the arrangement state of the GND vias after the processing according to the first embodiment.

FIG. 16 shows an arrangement state of the GND vias on the GND overlapping conductive areas 80, 81, 82, 83, and 84 at a time point when the program is ended in step S419. Herein, according to the explanation described above thus far, in order to facilitate visualization in the drawings, the slide position where the GND via is arranged has the same symbol as the GND via.

In the above description, in the arrangement of the GND vias in the central part of the GND overlapping conductive area, in order to certainly arrange the GND vias within the predetermined interval L3, the shift distance in step S412 is set as L3/2, and the search range for the surrounding GND via at the slide position in step S414 is set as L3/2. However, in consideration of costs, the number of the GND vias to be arranged may be minimized as much as possible. In such a case, for example, the shift distance in step S412 is set as L3, and the search range for another GND via in step S414 may also be set as a distance of a predetermined ratio with respect to L3 which can be set by the user. With this setting, although the GND via is not necessarily arranged within the predetermined interval L3, it is possible to arrange the relatively small number of the GND vias. Therefore, it is possible to arrange the GND vias in consideration of cost aspects.

Also, in the above description, in order to automatically arrange all the GND vias in the GND overlapping conductive area, the example has been shown in which one via each is arranged in the vicinity of the respective corners of the GND overlapping conductive area in step S408. However, a processing similar to this processing in step S408 can also be performed by the user. That is, as an instruction screen is displayed for arranging one or a plurality of vias in the GND overlapping conductive area and the respective corners thereof by using the display apparatus, it is possible for the user to arrange the GND via in the vicinity of the respective corners of the GND overlapping conductive area.

In addition, in the above description, the case has been described in which the position information and the shape information of the GND overlapping conductive area are mainly represented as the coordinates, but, for example, the GND vias can be also automatically arranged in a case where the area is represented by an equation or an inequation of the plane or the space such as an inequation on the xy plane. For example, in the case of the inequation on the xy plane, it is possible to obtain the positional coordinates of the respective construction points of the GND overlapping conductive area by way of coordinates of intersecting points in equations in which an inequality sign is represented by an equality sign. Also, the determination whether a particular point is in or out of the GND overlapping conductive area can be carried out by simply applying the coordinates to the inequation. Therefore, it is possible to perform a processing similar to that according to the above-mentioned present embodiment.

In this manner, according to the present embodiment, as shown in FIG. 16, at a distance within the predetermined interval L1 from the peripheral edge of the peripheral edge part and the inner edge part in the GND overlapping conductive area of the printed circuit board, the GND vias can be automatically arranged in an interval within the predetermined interval L2. Also, it is possible to automatically arrange the GND vias in the central part of the GND overlapping conductive area at an interval within the predetermined interval (L3).

It is to be noted that when the GND vias are actually arranged, the above-mentioned predetermined intervals L1, L2, and L3 can be varied actually in one circuit board depending on a situation, respectively with a value within L1, a value within L2, and a value within L3. It is however noted that when the values L1, L2, and L3 are not varied, that is, when the arrangement at the even interval is set, the calculation for the variation of the values L1, L2, and L3 depending on a situation is not necessary, and an advantage is obtained that the program operation becomes faster.

In addition, according to the present embodiment, the case has been described in which the GND vias on contact with all the conductive layers of the printed circuit board are automatically arranged, but it is also possible to automatically arrange the GND vias on contact with a part of the conductive layers constituting the printed circuit board (for example, two layers). In that case, the overlapping conductive area only with respect to the conductive layer on contact with the GND via is extracted, and the GND vias may be arranged in the relevant overlapping conductive area similarly as in the above-mentioned embodiment. At that time, it is possible to efficiently arrange the GND vias by treating the GND vias on contact with the plurality of layers including the part of the relevant conductive layers as the GND vias already arranged.

According to the first embodiment, as shown in step S408 in the flow chart shown in FIG. 4, the case has been described in which the GND via functioning as the reference for automatically arranging the GND vias is arranged in the vicinity of the respective construction points in the GND overlapping conductive area. On the other hand, in order to shorten the return current of the high-speed signal, the GND via is preferably arranged in the vicinity of the via of the high-speed signal wiring. According to a second embodiment, a case will be described in which the GND via functioning as the reference for automatically arranging the GND vias is arranged in the vicinity of the via of the high-speed signal wiring.

Figure 17:
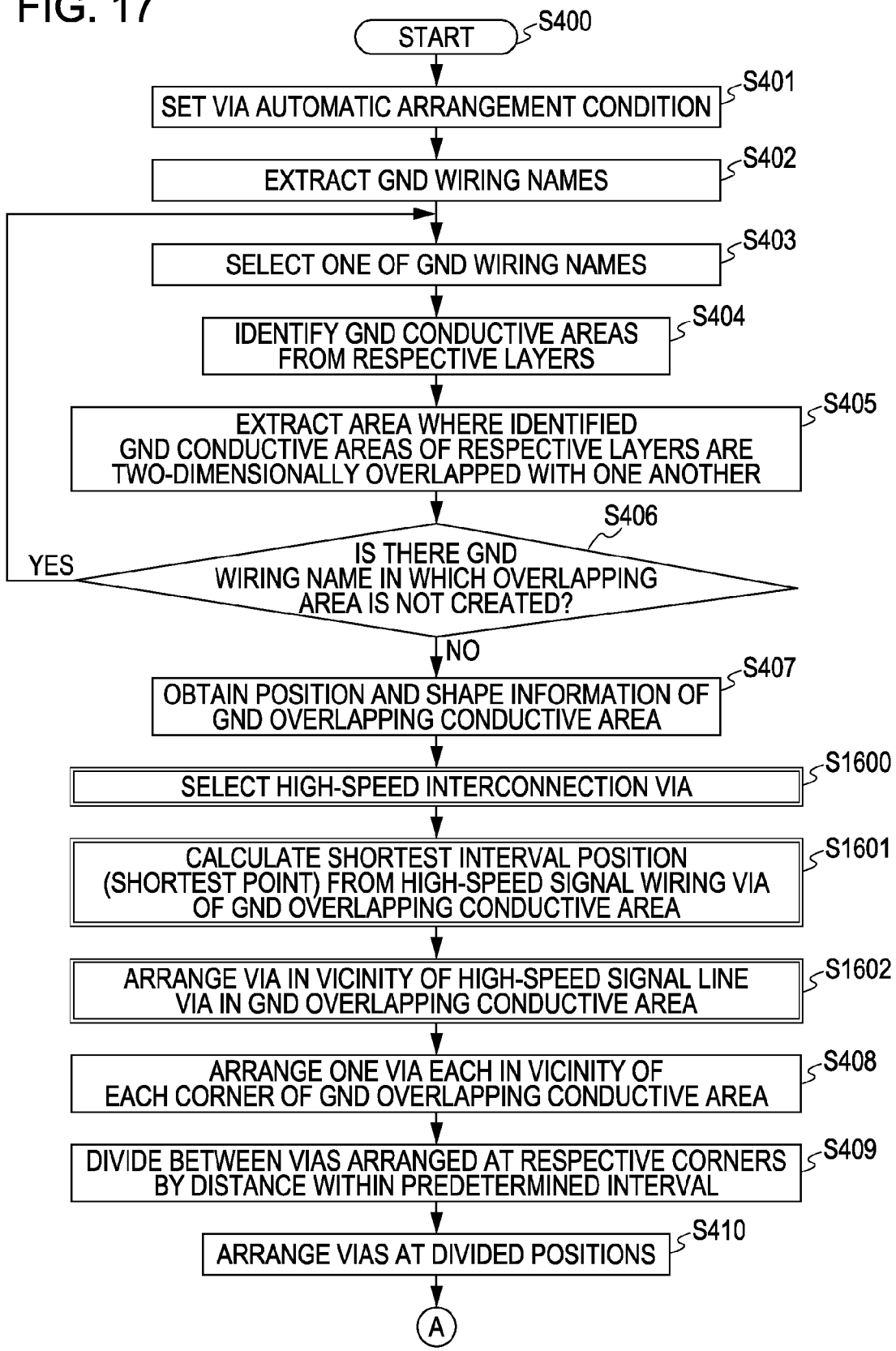
FIG. 17 is a flow chart for an example of the processing operation according to a second embodiment of the present invention.
Figure 18A:
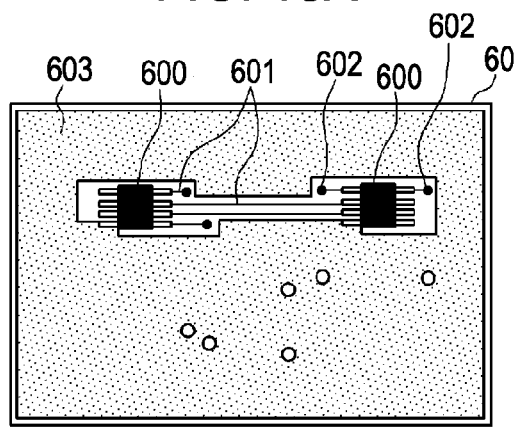
FIGS. 18A to 18E are schematic diagrams of a printed circuit board for describing the operational processing according to the second embodiment.
Figure 18B:
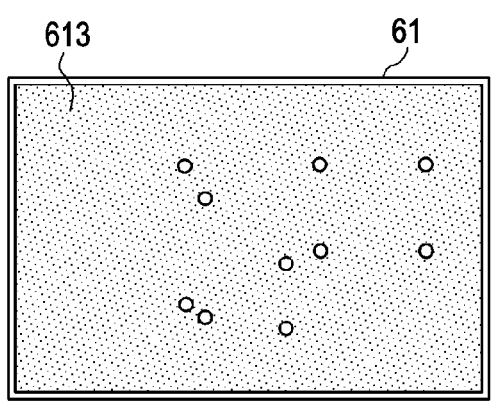
Figure 18C:
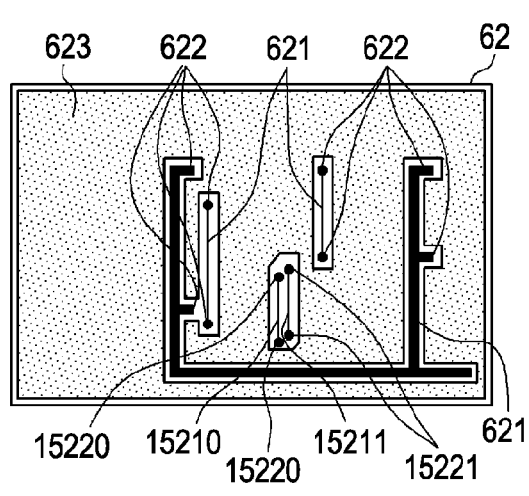
Figure 18D:
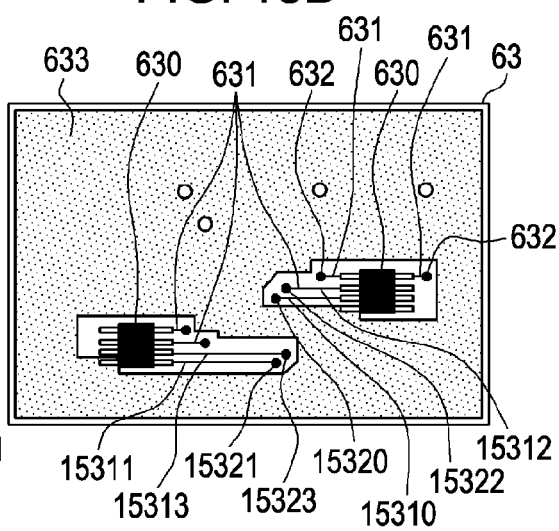
Figure 18E:
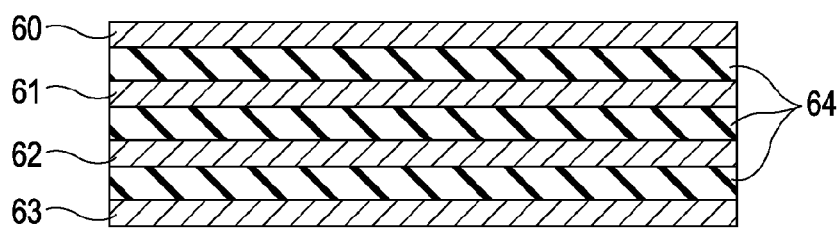

The processing operation performed on the basis of the printed circuit board design support program (processing program) by the printed circuit board design support apparatus according to the present embodiment is similar to the above-mentioned flow chart shown in FIG. 3. FIG. 17 is a flow chart showing a part of the steps in detail in the flow chart shown in FIG. 3. Herein, step A shown in FIG. 17 leads to step A shown in FIG. 5. Hereinafter, the processing operation of the printed circuit board design support apparatus according to the present embodiment will be described with reference to the flow charts shown in FIGS. 17 and 5 and the schematic drawings shown in FIGS. 18 to 22.

In the flow chart shown in FIG. 17, the processing in steps S400 to S407 and the processing in steps S408 to S410 to be performed are the same processings as those with the same step numbers described in FIG. 4, and a detail description will be omitted. According to the present embodiment, the processing in steps S1600 to S1602 is added between steps S407 and S408 in the flow chart shown in FIG. 4.

In step S1600, the diagram computation unit 22 selects the via of the high-speed interconnection. This processing corresponds to a second selecting step. Here, an example of the way of selecting the high-speed interconnection via will be described. For example, the input unit 20 displays an input screen with which a high-speed interconnection attribute can be set with respect to the respective wirings on the display apparatus 12. When the user inputs the high-speed interconnection attribute in the input field of the input screen via the input apparatus 13, the input unit 20 reads the input information to be stored in the main storage apparatus 11. On the basis of the stored information, the diagram computation unit 22 selects a via of the wiring having the high-speed interconnection attribute. A method of inputting the high-speed interconnection attribute may also be a method of inputting information indicating the high-speed interconnection to the respective wirings. Also, as the user inputs a wiring name in a list by using a high-speed interconnection list or selects a wiring to be added to the list, the diagram computation unit 22 may also selects the via of the wiring which is input to the list.

In addition, the method of selecting the high-speed interconnection may also be as follows. That is, a circuit designer inputs the high-speed interconnection attribute to the respective wirings on a circuit diagram design system in advance, and circuit diagram information having attribute information in the respective wirings is stored in the main storage apparatus 11 or the external storage apparatus 14. Therefore, as the input unit 20 reads out the circuit diagram information from the main storage apparatus 11 or the external storage apparatus 14, the diagram computation unit 22 can determine whether the respective wirings have the high-speed interconnection attribute or not, and select the via of the wiring having the high-speed interconnection attribute. At this time, for a method of inputting the high-speed interconnection attribute to the wiring, a method similar to the above-mentioned method may also be performed on the printed circuit board design system. In addition, the circuit designer inputs a frequency of a current flowing through the respective wirings on the circuit diagram design system, and by comparing the frequency with a predetermined threshold, the wiring having the frequency higher than the predetermined threshold may also be determined as the wiring having the high-speed interconnection attribute.

In step S1601, the diagram computation unit 22 calculates a point on the respective GND overlapping conductive areas extracted in step S405 and also at a shortest interval from the via of the high-speed interconnection selected in step S1600 (shortest point).

In step S1602, the via automatic arrangement unit 23 arranges the GND via in the vicinity of the shortest point. This processing corresponds to a fifth arranging step. At this time, in a case where the shortest point is on the construction line of the GND overlapping conductive area, the via automatic arrangement unit 23 arranges the GND via on an extension of a segment connecting from the via of the high-speed interconnection to the shortest point and also within a range of the distance of the predetermined interval L1 from the shortest point. In a case where the shortest point is on the construction point of the GND overlapping conductive area, with a processing similar to that in step S408 according to the first embodiment, the via automatic arrangement unit 23 arranges the GND via.

It is to be noted that in the above description, the case has been described in which in step S1601, the diagram computation unit 22 calculates the shortest point from the vias of the high-speed interconnections to the respective GND overlapping conductive areas. However, as the interval from the via of the high-speed interconnection to the shortest point is larger than a predetermined value L3, the processing in step S1602 may not be performed. For the predetermined value L3, for example, the predetermined interval L2 or the like is used. Also, a processing may also be added so that the user is notified as an error of the via of the high-speed interconnection for which the shortest point where the distance from the via of the high-speed interconnection to the shortest point is equal to or smaller than the predetermined value L3 cannot be found or the situation is visualized.

Next, with reference to the schematic diagrams of the printed circuit boards shown in FIGS. 18A to 18E, the above-mentioned processing operation in the flow chart shown in FIG. 17 will be described. FIGS. 18A to 18E are the schematic diagrams of the printed circuit boards before the GND vias are automatically arranged. It is to be noted that the component arrangement positions and the wiring shown in FIGS. 18A to 18E which are similar to those shown in FIGS. 6A to 6E are assigned with the same symbols, and a description thereof will be omitted. Herein, signal wirings 15210 and 15211 and signal wiring vias 15220 and 15221 shown in FIG. 18C have the high-speed interconnection attribute. Also, signal wirings and signal wiring vias 15320, 15321, 15322, and 15323 shown in FIG. 18D have the high-speed interconnection attribute.

Figure 19:
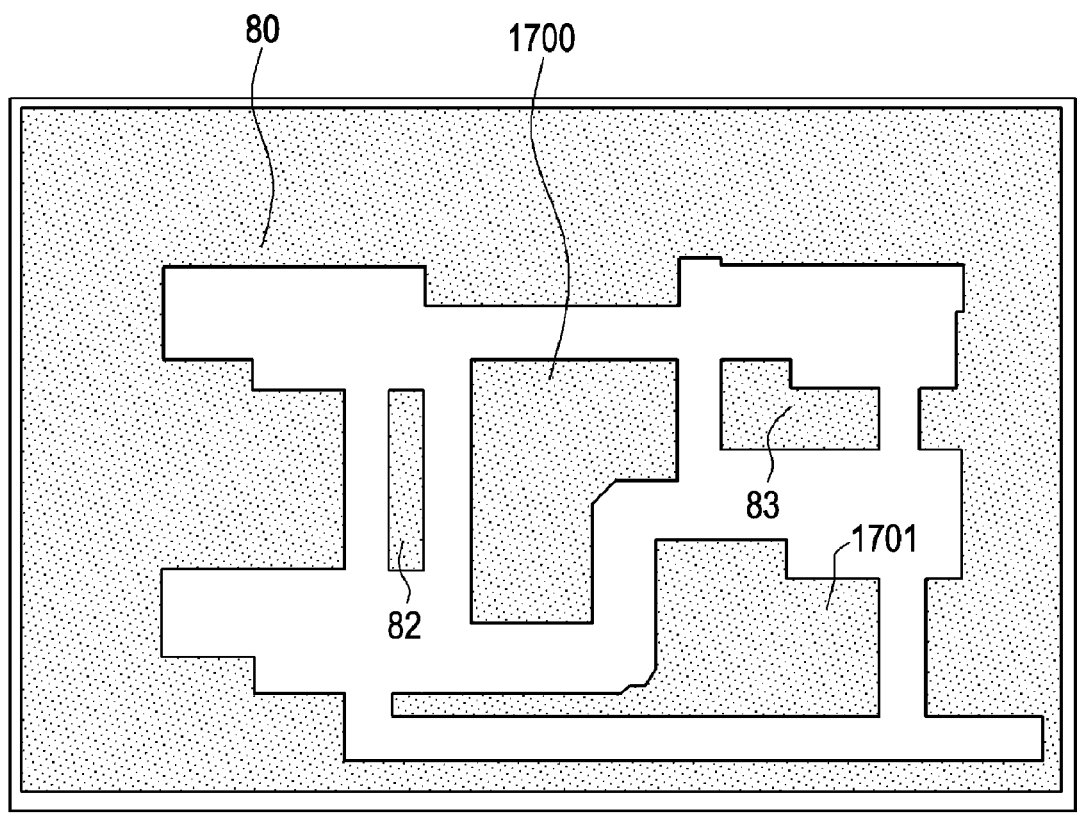
FIG. 19 shows a state after the processing in step S405 according to the second embodiment.

Up to the processing in step S406 in the flow chart shown in FIG. 17, the diagram computation unit 22 projects the GND conductive areas of the respective layers shown in FIGS. 18A to 18D and extracts the GND overlapping conductive areas where the GND conductive areas are two-dimensionally overlapped with one another in all the layers. FIG. 19 shows the extracted GND overlapping conductive areas. That is, areas 80, 82, 83, 1700, and 1701 of gray parts shown in FIG. 19 are GND overlapping conductive areas.

Hereinafter, in order to facilitate the description on the processing of automatically arranging the GND vias, while paying attention to the GND overlapping conductive area 1700 among the GND overlapping conductive areas shown in FIG. 19, the processing of automatically arranging the GND vias will be described. It is to be noted that also in the GND overlapping conductive areas 80, 82, 83, and 1701, the GND vias are similarly automatically arranged.

In step S407, the via automatic arrangement unit 23 obtains the position information and the shape information of the GND overlapping conductive area 1700.

Figure 20:
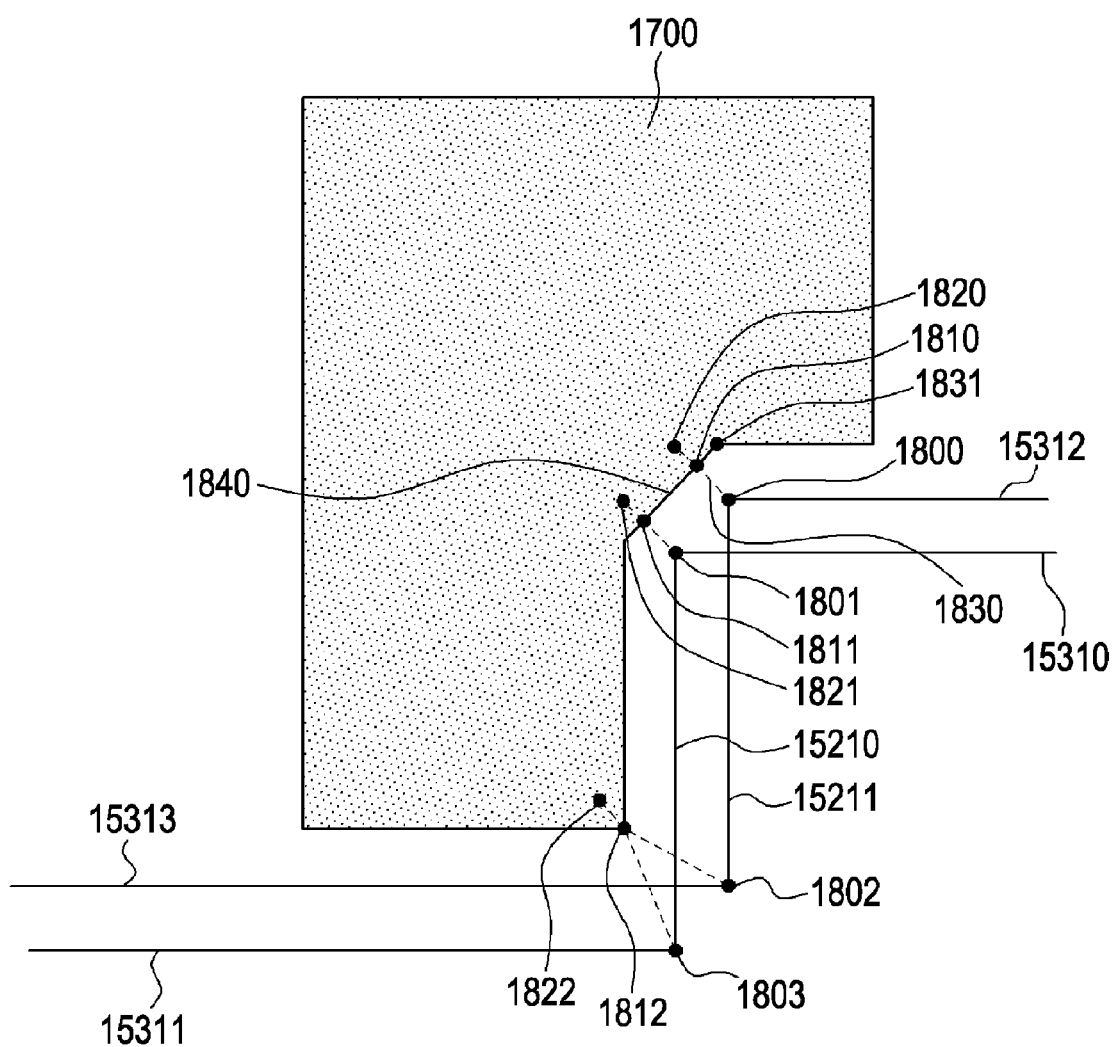
FIG. 20 is an explanatory diagram for describing a processing from steps S1600 to S1602 according to the second embodiment.

Next, in step S1600, the diagram computation unit 22 selects, as shown in FIG. 20, vias having the high-speed interconnection attribute (hereinafter, referred to as high-speed interconnection via) 1800, 1801, 1802, and 1803. At this time, when the high-speed interconnection via corresponds to the signal wiring vias shown in FIGS. 18A to 18E, the high-speed interconnection via 1800 is matched with the signal wiring vias 15221 and 15322. Also, the high-speed interconnection via 1802 is matched with the signal wiring vias 15221 and 15323. Also, the high-speed interconnection via 1801 is matched with the signal wiring vias 15220 and 15320. Also, the high-speed interconnection via 1803 is matched with the signal wiring vias 15220 and 15321.

Next, in step S1601, the diagram computation unit 22 calculates the shortest points 1810, 1811, and 1812 shown in FIG. 20 from the respective high-speed interconnection vias 1800, 1801, 1802, and 1803 with respect to the GND overlapping conductive area 1700. To be more specific, perpendicular lines are calculated which are drawn from the outside of the GND overlapping conductive area and from the respective high-speed interconnection vias with respect to the respective construction lines in the GND overlapping conductive area. Next, the diagram computation unit 22 compares the distances from the high-speed interconnection via to the intersecting points between the respective perpendicular lines and the construction lines with the distances from the high-speed interconnection vias to the respective construction points and sets the intersecting point or the construction point having the shortest distance as the shortest point. For example, in the case of the high-speed interconnection via 1800, the shortest distance among the distances from the high-speed interconnection via to construction lines 1840 of the GND overlapping conductive area 1700 is calculated with referring to a perpendicular line 1830 drawn from the high-speed interconnection via 1800 to the construction line 1840. That is, the shortest distance is a distance from the high-speed interconnection via 1800 to the intersecting point between the perpendicular line 1830 and the construction line 1840. Also, the construction point nearest from the high-speed interconnection via 1800 is the construction point 1831. At this time, when the diagram computation unit 22 compares the distance from the high-speed interconnection via 1800 to the intersecting point with the distance from the high-speed interconnection via 1800 to the construction point 1831, the distance from the high-speed interconnection via 1800 to the intersecting point 1810 is smaller. Therefore, the intersecting point (the shortest point 1810) is calculated as the shortest point. It is to be noted that in the above description, only the distance from the high-speed interconnection via 1800 to the intersecting point 1810 is compared with the distance from the high-speed interconnection via 1800 to the construction point 1831, but in actuality, all the distances from the high-speed interconnection via 1800 to the intersecting points between the perpendicular lines from the high-speed interconnection via 1800 to the respective construction lines in the GND overlapping conductive area 1700 and the relevant construction lines are compared. Also, the distance from the high-speed interconnection via is calculated with respect to all the construction points.

Similarly, the diagram computation unit 22 calculates the shortest point 1811 as the shortest point with respect to the high-speed interconnection via 1801. Also, in the case of the high-speed interconnection vias 1802 and 1803, the diagram computation unit 22 calculates the shortest point 1812 as the same shortest point.

In step S1602, the via automatic arrangement unit 23 arranges the GND via in the vicinity of the shortest point. Herein, the processing varies depending on a case in which the shortest point is on the construction line of the GND overlapping conductive area 1700 and a case in which the shortest point is the construction point. First, in a case where the shortest point is on the construction line like the shortest point 1810, the via automatic arrangement unit 23 arranges the GND via 1820 at a position on an extension of the perpendicular line 1830 and also at a distance having half the value of the predetermined interval L1 from the shortest point 1810 (L1/2). Herein, the GND via is arranged at a position at the distance of L1/2 from the shortest point, but in actuality, the GND via may be arranged within the distance of the predetermined interval L1. Similarly, the via automatic arrangement unit 23 arranges the GND via 1821 with respect to the shortest point 1811.

Next, in a case where the shortest point is the construction point like the shortest point 1812, the via automatic arrangement unit 23 arranges the GND via 1822 through a method similar to step S408 in the flow chart according to the first embodiment shown in FIG. 4.

It is to be noted that in a case where the GND via is already arranged within a range of at distance of the predetermined interval L2 from the GND via 1820, 1821, or 1822 and also within a range of at distance of the predetermined interval L1 from the construction line of the GND overlapping conductive area 1700, a processing of excluding the relevant GND via may also be added. Also, Herein, the search range for the GND via is limited to the range of the predetermined interval L2, but any value may also be used as long as the value is equal to or less than L2. Furthermore, the search range for the GND via may also be an area where the conductive area formed in the surrounding of the nearby GND via is overlapped with the conductive area formed in the surrounding of the GND via 1820.

Next, the processing in step S408 and subsequent steps are the same as step S408 and subsequent steps in the flow chart according to the first embodiment shown in FIG. 4 and the processing in the flow chart shown in FIG. 5, and therefore a brief description will be provided.

Figure 21:
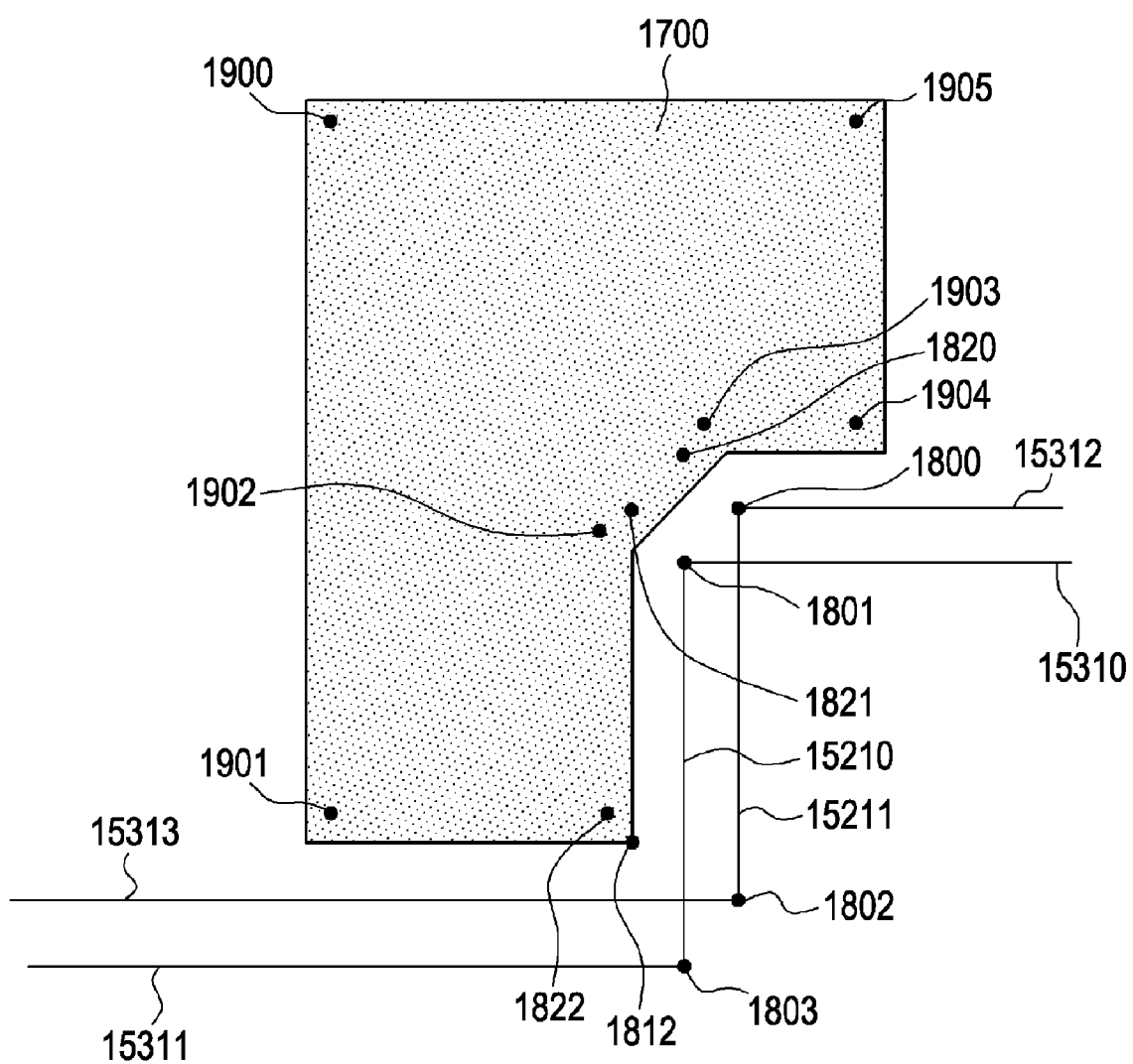
FIG. 21 shows a state after a processing in step S408 according to the second embodiment.

In step S408, the via automatic arrangement unit 23 arranges the GND vias in the vicinity of the respective corners of the GND overlapping conductive area 1700. Here, with reference to FIG. 21, after the processing in step S408, the GND vias arranged in the GND overlapping conductive area 1700 will be described. As shown in FIG. 21, GND vias 1900, 1901, 1902, 1903, 1904, and 1905 are arranged in the GND overlapping conductive area 1700. As to the construction point 1812, in step S1602, the GND via 1822 is arranged, and therefore in step S408, the arrangement processing for the GND via is not necessarily performed. At this time, in step S408, in a case where the GND via to be arranged is extremely close to the GND via in the vicinity of the high-speed interconnection arranged in step S1601, the via automatic arrangement unit 23 may not necessarily arrange the GND via. It is to be noted that the case of being extremely close is similar to a case in which the GND via in the vicinity of the high-speed interconnection via already exists in the search range equivalent to the search range for the GND via which is the target to be excluded in step S1601.

Figure 22:
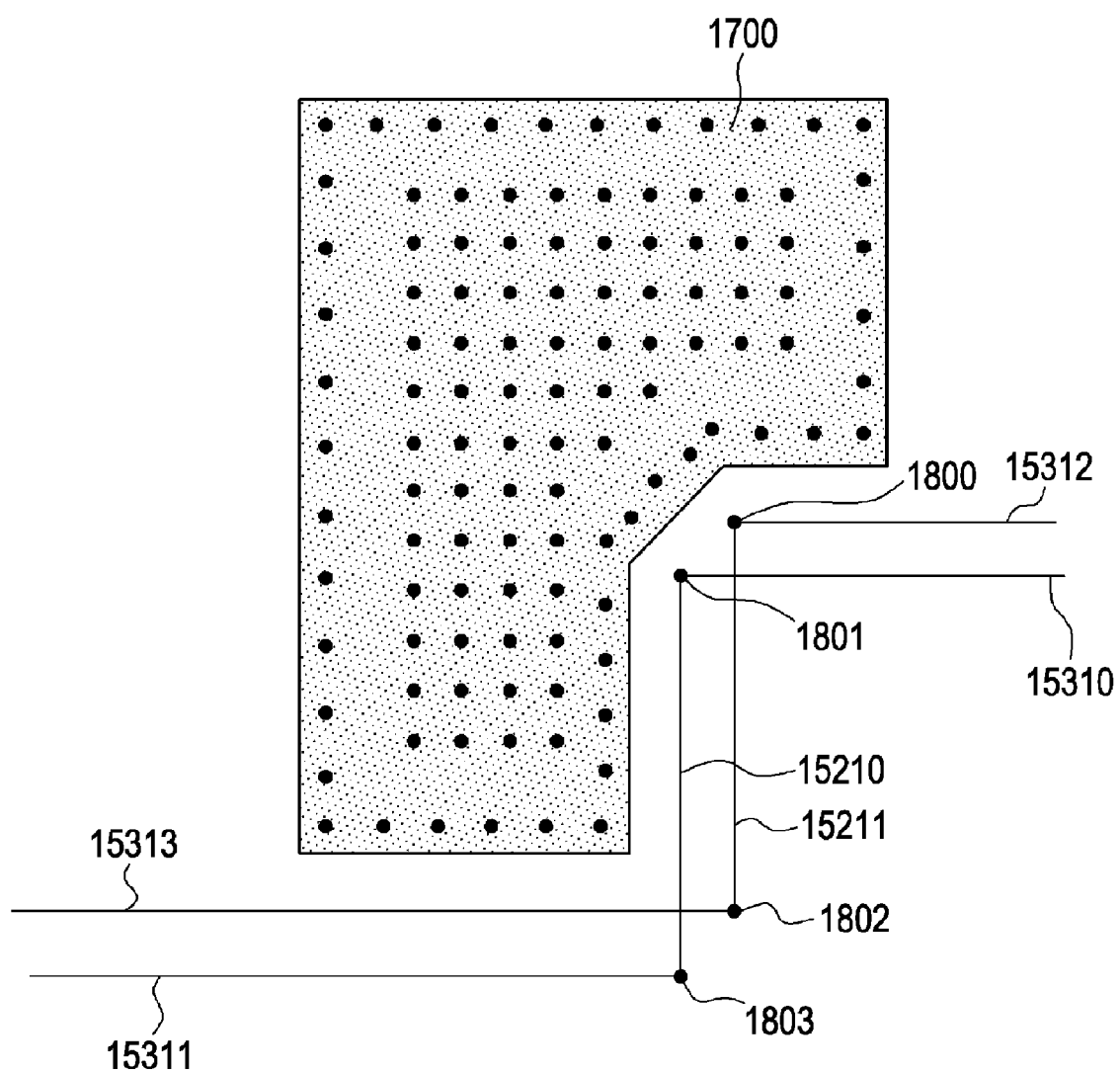
FIG. 22 shows an arrangement state of the GND vias after a processing according to the second embodiment.

Next, by performing the processing in step S409 and subsequent steps similarly as in the processing described according to the first embodiment, as shown in FIG. 22, the GND vias are arranged in the GND overlapping conductive area 1700 within the predetermined interval.

In the above description, in steps S1600 to step S1602, the example has been illustrated in which the GND vias functioning as the reference for automatically arranging the GND vias are automatically arranged in the vicinity of the vias of the high-speed signal lines. However, a processing similar to a series of these processings can also be performed by the user. That is, by using the display apparatus 12, as an instruction screen is displayed for arranging one or a plurality of vias in the GND overlapping conductive area and also in the vicinity of the vias of the respective high-speed signal lines, the user can arrange the GND vias in the GND overlapping conductive area and also in the vicinity of the vias of the high-speed signal lines.

In addition, in the above description, the case has been described in which the position information and the shape information of the GND overlapping conductive area are mainly represented as the coordinates, but, for example, the GND vias can be also automatically arranged in a case where the area is represented by an equation or an inequation of the plane or the space such as an inequation on the xy plane. For example, in the case of the inequation on the xy plane, it is possible to obtain the positional coordinates of the respective construction points of the GND overlapping conductive area by calculating coordinates of intersecting points in equations in which an inequality sign is represented by an equality sign. Also, the determination whether a particular point is in or out of the GND overlapping conductive area can be carried out by simply applying the coordinates to the inequation. Therefore, it is possible to perform a processing similar to that according to the above-mentioned present embodiment.

In this manner, according to the present embodiment, in addition to the first embodiment, the GND vias can be automatically arranged so as to shorten the path for the return current of the high-speed interconnection. Also, the present embodiment is a partially modified example of the first embodiment and has an application range equivalent to the application range described in the first embodiment.

According to the first embodiment, the case has been described in which the GND overlapping conductive area is divided into the peripheral edge part and the inner edge part, and the central part, and the GND vias are arranged in a stepwise fashion. According to the third embodiment, a case will be described in which the GND vias are automatically arranged in the entire GND overlapping conductive area in a non-stepwise fashion.

The processing operation performed on the basis of the printed circuit board design support program (processing program) by the printed circuit board design support apparatus according to the present embodiment is similar to the above-mentioned flow chart shown in FIG. 3 from which step S103 is omitted. It is to be noted that in the printed circuit board design support apparatus described according to the first embodiment, as the GND vias are arranged in the peripheral edge part and the inner edge part, the effects of the measures for the radiation noise are still larger.

Hereinafter, the processing operation of the printed circuit board design support apparatus according to the present embodiment will be described with reference to the flow charts shown in FIGS. 23 and 24 and the schematic diagrams shown in FIGS. 25 to 27. It is to be noted that in order to facilitate the description, in FIGS. 25 to 27, only the GND overlapping conductive area 81 shown in FIG. 10 is illustrated. However, in actuality, the GND vias are also similarly arranged in the GND overlapping conductive areas 80, 82, 83, and 84.

Figure 23:
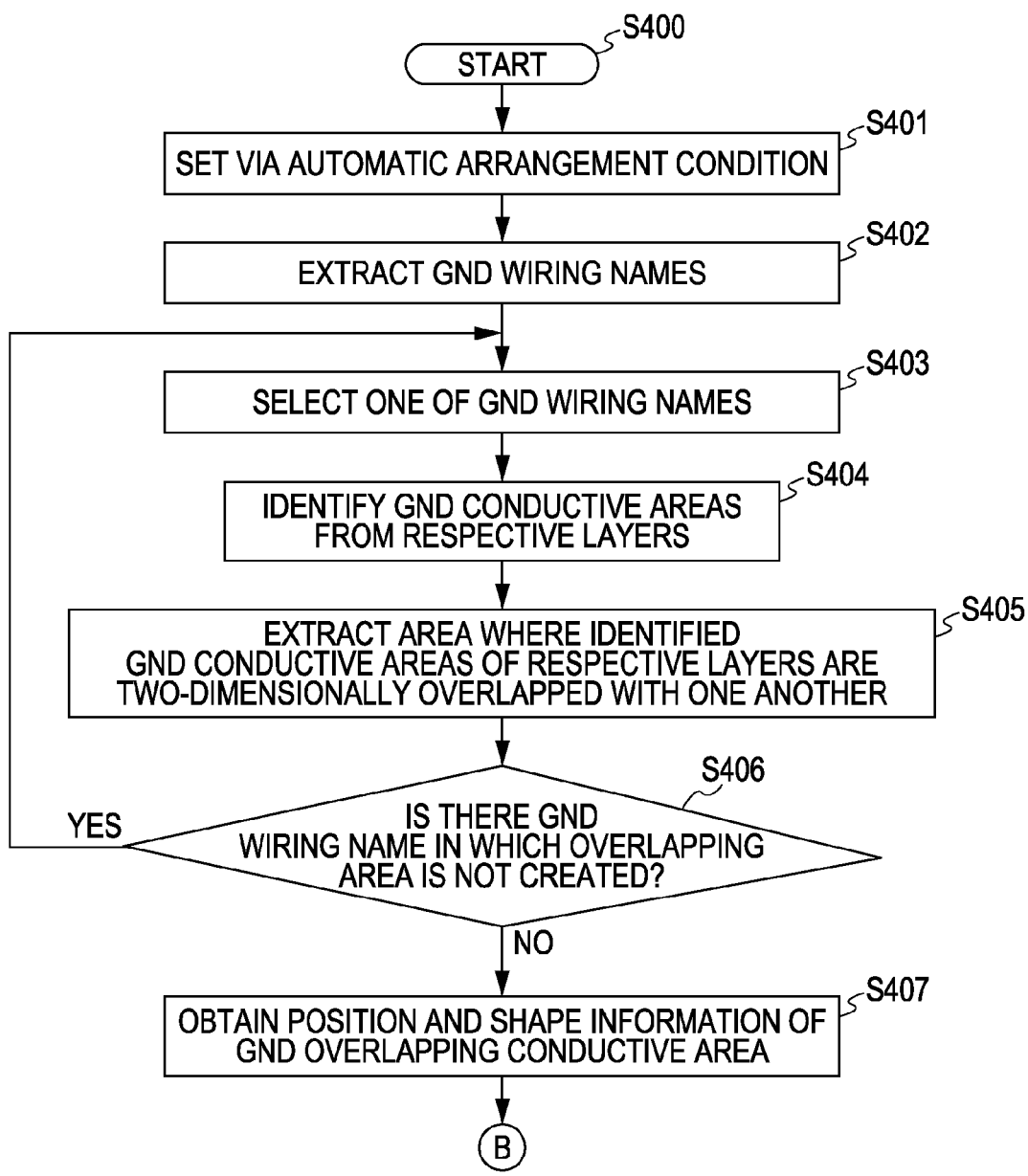
FIG. 23 is a flow chart for an example of the processing operation according to a third embodiment of the present invention.
Figure 24:
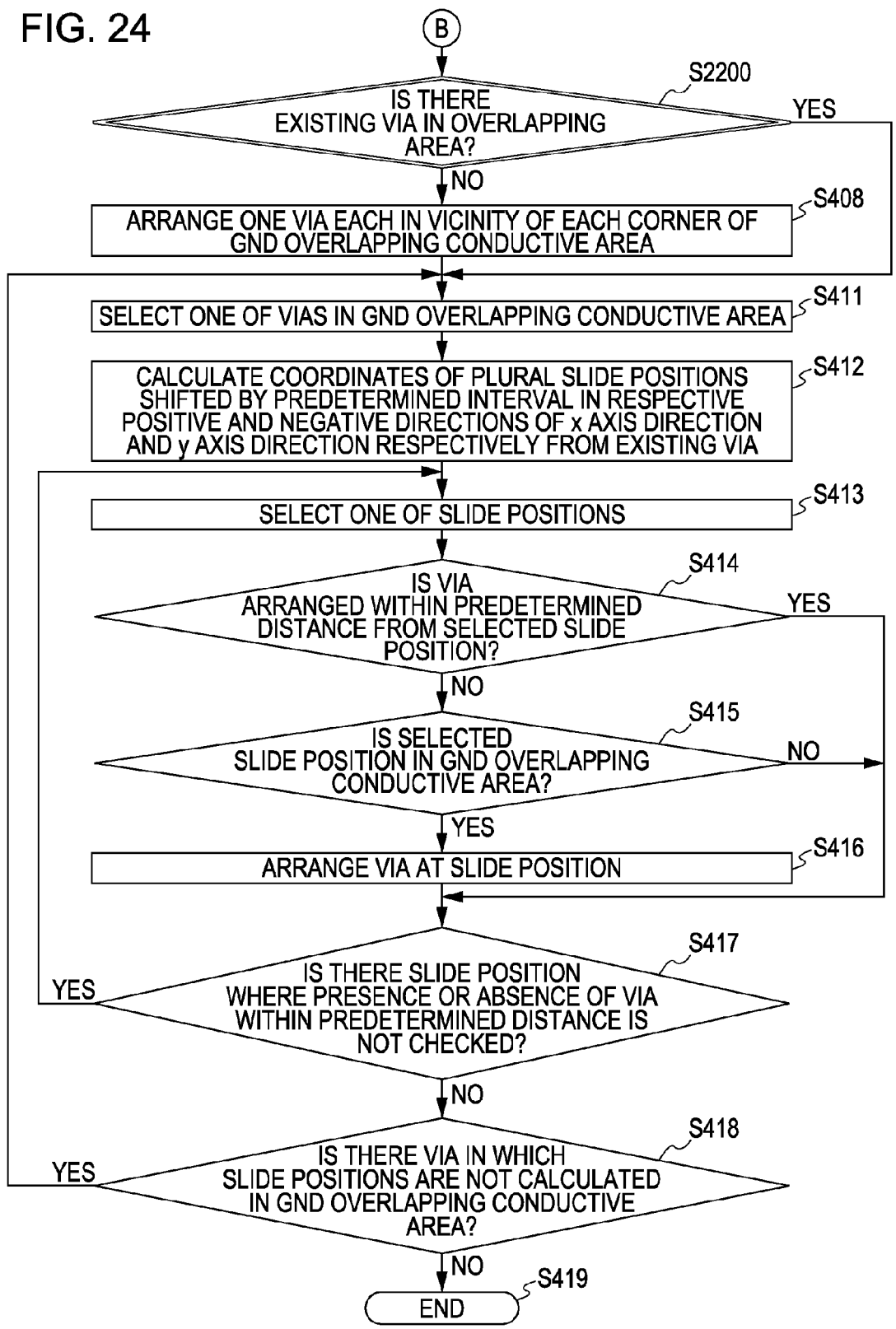
FIG. 24 is a flow chart for an example of the processing operation according to the third embodiment.

In the flow charts shown in FIGS. 23 and 24, the operational processing in steps S400 to S407, S408, and S411 to S419 is the same processing having the same step number shown in FIGS. 4 and 5, and a detail description will be omitted. It is however noted that the via automatic addition condition according to the present embodiment is a largest allowable value L5 of the interval of the GND via (hereinafter, referred to as predetermined interval L5). According to the present embodiment, as being different from the first embodiment, step S2200 is added between steps S407 and S408.

Herein, in step S2200, while referring to the layout information 142 stored in the main storage apparatus 11, the via automatic arrangement unit 23 determines whether the GND vias already exist in the respective GND overlapping conductive areas A extracted in step S405. In a case where the GND vias exist in the GND overlapping conductive areas A, the flow advances to the processing in step S411. In a case where the GND vias do not exist, the flow advances to the processing in step S408. With this step S2200, in a case where the GND vias already exist in the GND overlapping conductive areas A, as the GND vias are automatically arranged while using the existing GND vias as the reference, the processing in step S408 is not necessarily performed. It is however noted that similarly as in the first embodiment, step S2200 may be omitted, and irrespective of whether the GND vias already exist in the GND overlapping conductive areas A, the GND via functioning as the reference in step S408 may also be arranged.

In addition, according to the present embodiment, as being different from the first embodiment, steps S409 and S410 are omitted. Steps S409 and S410 according to the first embodiment are steps for the via automatic arrangement unit 23 to automatically arrange the GND vias within the predetermined interval of the peripheral edge part and the inner edge part in the GND overlapping conductive areas A. Therefore, according to the present embodiment, this is an unnecessary processing. It is to be noted that similarly as in the second embodiment, in order to arrange the GND vias in the vicinity of the high-speed interconnection via with priority, steps S1600 to S1602 in the flow chart shown in FIG. 17 may be added between steps S407 and B in the flow chart shown in FIG. 23.

Next, the processing operation of the printed circuit board design support apparatus according to the present embodiment will be described with reference to the flow charts shown in FIGS. 23 and 24 and the schematic diagrams shown in FIGS. 25 to 27. First, a case will be described in which as there are no existing GND vias in the GND overlapping conductive area, that is, in step S2200, as there are no existing vias in the GND overlapping conductive area, the flow advances to the processing in step S408.

Figure 25:
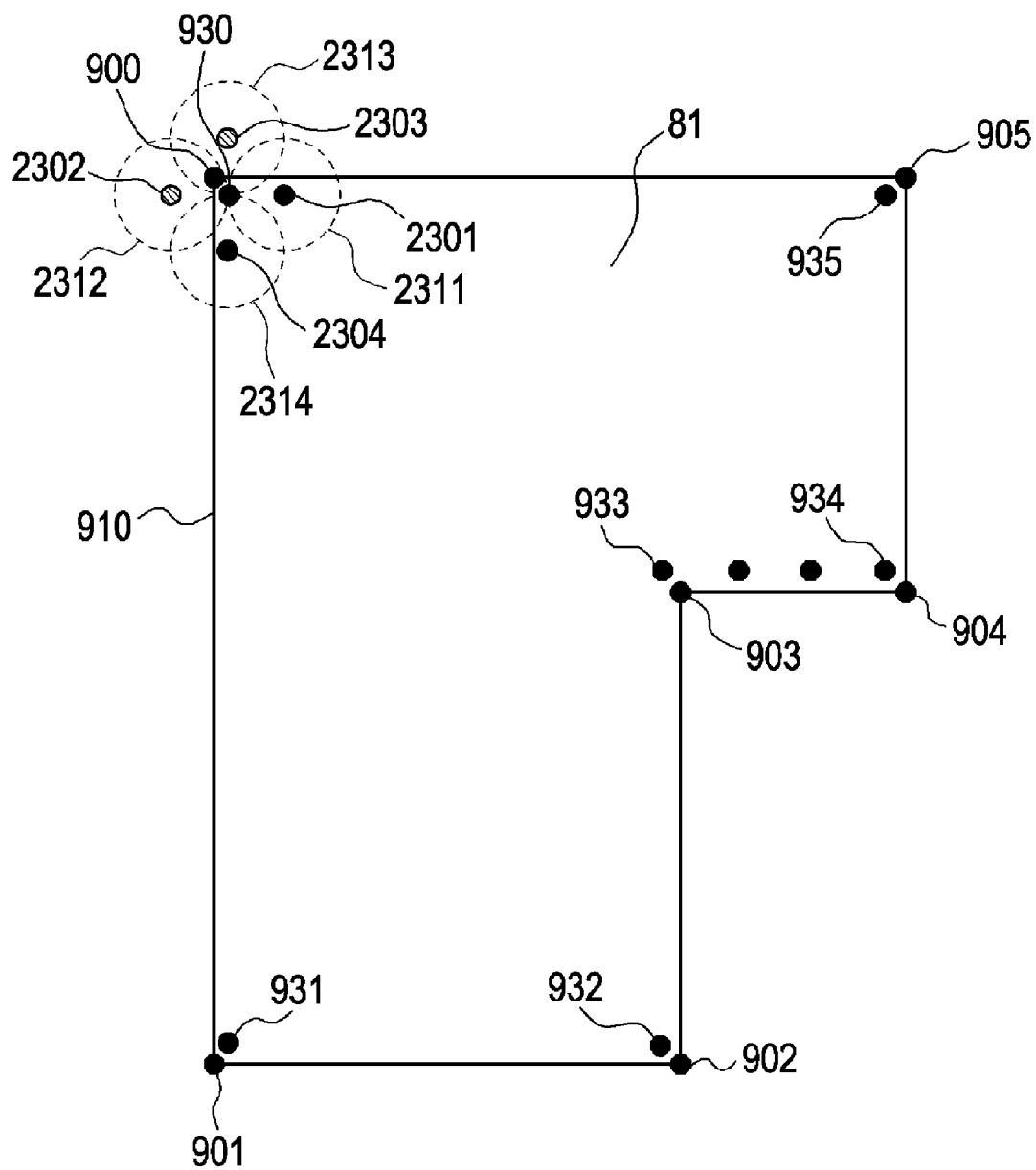
FIG. 25 is an explanatory diagram for describing a processing from steps S411 to S416 according to the third embodiment.
Figure 26:
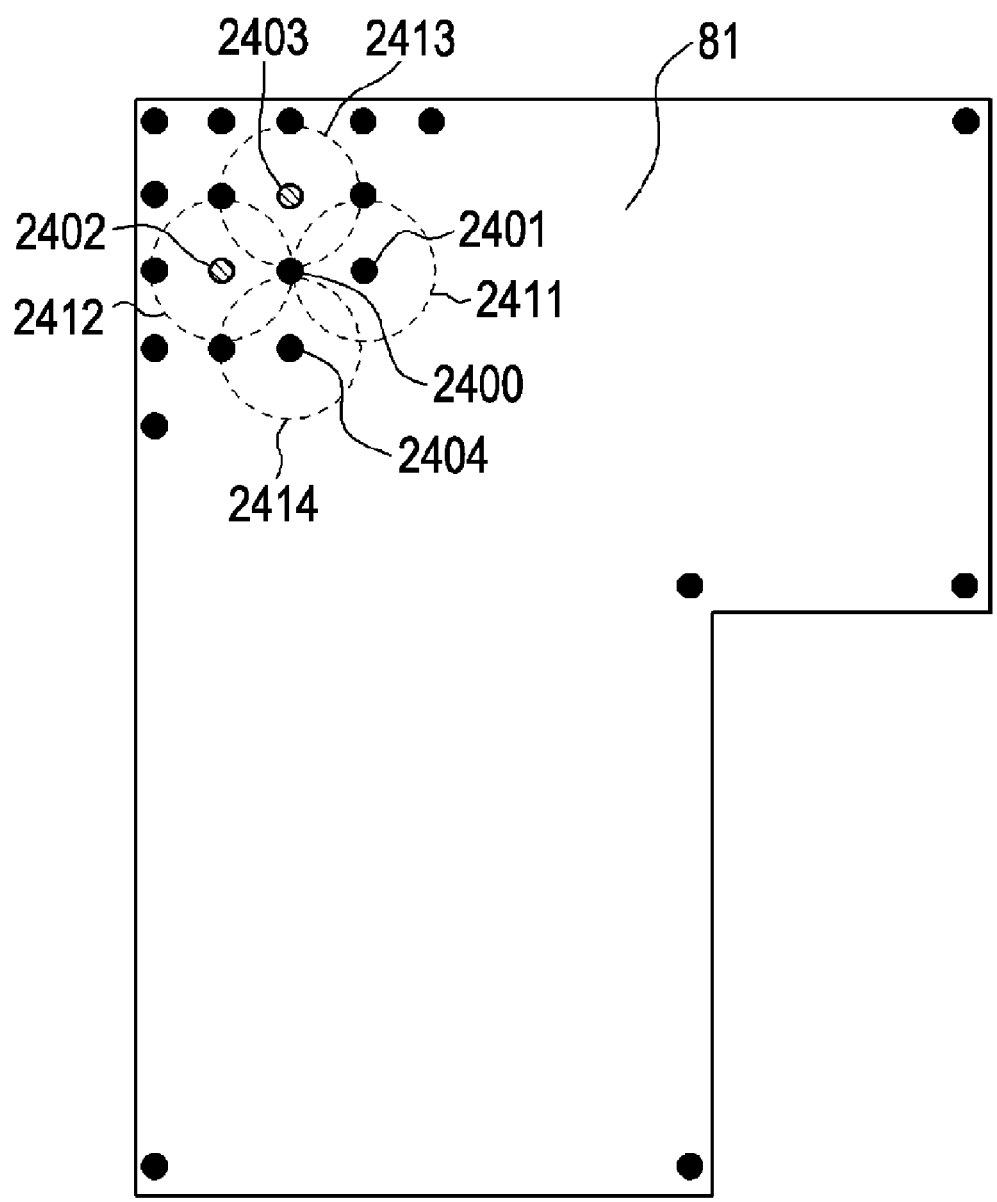
FIG. 26 is an explanatory diagram for describing a processing from steps S411 to S416 according to the third embodiment.

In step S408, the via automatic arrangement unit 23 arranges GND via 930, 931, 932, 933, 934, and 935, respectively, in the vicinity of the construction points 900, 901, 902, 904, and 905 which are the respective corners of the GND overlapping conductive area 81 as shown in FIG. 25. It is to be noted that herein the GND vias functioning as the reference are arranged in the vicinity of the respective corners of the GND overlapping conductive area 81, but, for example, the GND vias may also be arranged only in vicinity of the construction point 900 or in vicinity of not all but a plurality of corners including the construction point 900, the construction point 901, and the like. Furthermore, the GND vias functioning as the reference is not necessarily in the vicinity of the corner. For example, the GND vias functioning as the reference may also be arranged at a point to which the middle point of the construction line 910 shown in FIG. 25 is shifted by a value within the predetermined interval L5 in a direction perpendicular to the construction line 910 and also heading to the inside of the GND overlapping conductive area 81. Other than the above, the GND via functioning as the reference can be arranged at any point in the GND overlapping conductive area 81.

Next, in step S411, the via automatic arrangement unit 23 selects one of the GND vias arranged in step S408. At this time, it is supposed that the via automatic arrangement unit 23 selects, for example, the GND via 930 shown in FIG. 25.

In step S412, the via automatic arrangement unit 23 calculates slide positions shifted in the respective positive and negative directions in the x axis direction and the y axis direction by a distance half of the predetermined interval L5 (L5/2) from the GND via 930. To be more specific, the via automatic arrangement unit 23 calculates slide positions 2301, 2302, 2303, and 2304 as positions shifted in the positive direction in the x axis direction, the negative direction in the x axis direction, the positive direction in the y axis direction, and the negative direction in the y axis direction.

In step S413, the via automatic arrangement unit 23 selects one of the slide positions 2301, 2302, 2303, and 2304. For example, in a case where the slide position 2301 is selected, in step S414, the via automatic arrangement unit 23 determines that another GND via does not exist within a range of the distance half of the predetermined interval L5 (L5/2) from the slide position 2301, that is, in a circle 2311 shown in FIG. 25.

Next, in step S415, the via automatic arrangement unit 23 determines that the slide position 2301 exists in the GND overlapping conductive area 81.

Therefore, step S416, the via automatic arrangement unit 23 arranges the GND via 2301 at the slide position 2301.

Next, in step S417, the via automatic arrangement unit 23 does not determines whether another GND via exists within the predetermined range with regard to the remaining slide positions 2302, 2303, and 2304, and then the flow is returned to the processing in step S413.

Next, in step S413, in a case where the via automatic arrangement unit 23 selects the slide position 2302, in step S414, it is determined that another GND via does not exist within the range of L5/2 from the slide position 2302, that is, in a circle 2312 shown in FIG. 25. Next, in step S415, as the via automatic arrangement unit 23 determines that the slide position 2302 is out of the GND overlapping conductive area 81, the flow advances to the processing in step S417. In step S417, as the via automatic arrangement unit 23 does not determines whether another GND via exists in the remaining slide positions 2303 and 2304 within the predetermined range, the flow is returned to the processing in step S413.

Subsequently, similarly, the via automatic arrangement unit 23 repeatedly executes the series of processings from step S413 to step S417, and the GND via is not arranged at the slide position 2303, but the GND via is arranged at the slide position 2304, and then the flow advances to the processing in step S417.

In step S417, as the slide position to be determined by the via automatic arrangement unit 23 does not exist, the flow advances to the processing in step S418.

Next, the via automatic arrangement unit 23 does not performs the processing in step S412 on the GND vias 2301 and 2304 which are newly added, and the GND vias 931, 932, 933, 934, and 935. Therefore, in step S418, the via automatic arrangement unit 23 determines that the GND via for which the processing in step S412 is not performed exists, and the flow is returned to the processing in step S411. Hereinafter, by repeatedly executing the processing from step S411 to step S418, the GND vias are automatically arranged in the GND overlapping conductive area 81.

Here, with reference to FIG. 26, a case in which in step S411, the GND via 2400 is selected will be described.

In step S412, the via automatic arrangement unit 23 calculates slide positions 2401, 2402, 2403, and 2404.

In step S413, the via automatic arrangement unit 23 sequentially selects one of the slide positions. As to the slide positions 2401 and 2404, the via automatic arrangement unit 23 determines in step S414 that another GND via does not exist within a range of L5/2 (respectively in circles 2411 and 2414), and determines in step S415 that this is in the GND overlapping conductive area 81. Therefore, step S416, the via automatic arrangement unit 23 arranges the GND via 2401 and the GND via 2404.

On the other hand, at the slide positions 2402 and 2403, the GND vias already exist at the same positions as the slide positions 2402 and 2403, respectively, that is, another GND via exist within the range of L5/2 (respectively in circles 2412 and 2413). Therefore, in step S414, the via automatic arrangement unit 23 determines that another GND via exists at the slide positions 2402 and 2403. Therefore, the via automatic arrangement unit 23 does not arrange the GND vias.

Subsequently, similarly, the via automatic arrangement unit 23 repeatedly executes the processing in steps S411 to S418 in step S418 until the GND via in which the processing in step S412 is not performed does not exist. Then, in step S418, in a case where the GND via in which the processing in step S412 is not performed does not exist, the via automatic arrangement unit 23 ends the program in step S419.

Figure 27:
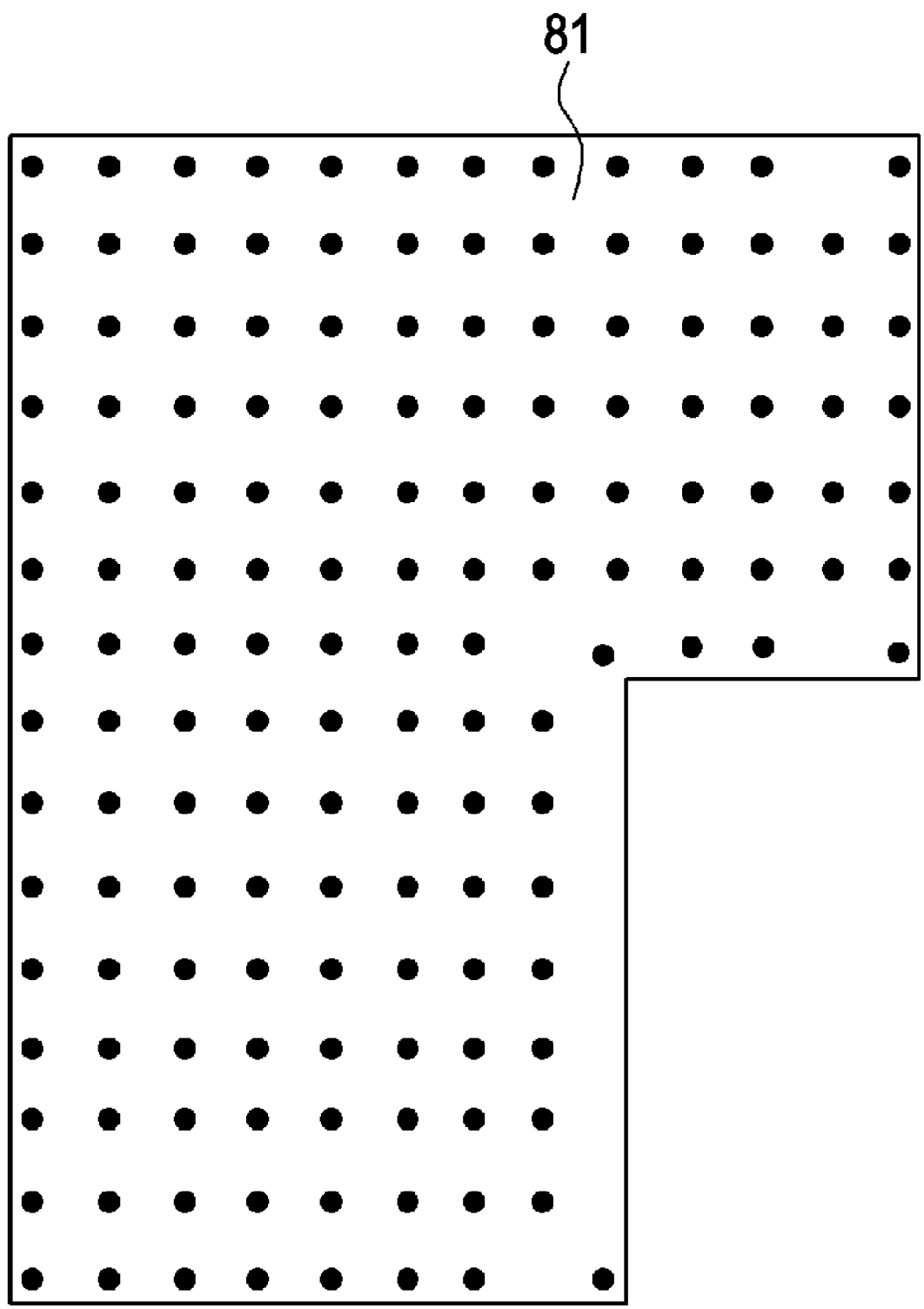
FIG. 27 shows an arrangement state of the GND vias after the processing according to the third embodiment.

FIG. 27 shows an arrangement state of the GND vias on the GND overlapping conductive area 81 at a time point when the program is ended in step S419. Herein, in the above description thus far, in order to facilitate visualization in the drawings, the slide position at which the GND via is arrange and the GND via arranged have the same symbols.

It is to be noted that according to the present embodiment, similarly as in the first embodiment, by allowing the user to set the shift distance in step S412 and the search range for the surrounding of the slide position in step S414, it is possible to realize the arrangement state of the GND vias desired by the user. With this setting, by decreasing the number of the GND vias to be arranged instead of arranging the GND via within the predetermined interval, it is possible to carry out the arrangement of the GND vias in consideration of cost aspects. Furthermore, even in a case where the position information and the shape information of the GND overlapping conductive area are represented by inequations on the plane of coordinates or on the space, it is possible to carry out the automatic arrangement of the GND vias.

In this manner, according to the present embodiment, as shown in FIG. 27, it is possible to automatically arrange the GND vias in the GND overlapping conductive area of the printed circuit board within the predetermined interval L5.

In the above description, in order to automatically arrange all the GND vias in the GND overlapping conductive area, the example has been shown in which one via functioning as the reference each is arranged in the vicinity of the respective corners of the GND overlapping conductive area in steps S2200 and S408. However, a processing similar to this processing in steps S2200 and S408 can also be performed by the user. That is, in step S2200, in a case where the GND via does not exist in the GND overlapping conductive area, by using the display apparatus 12, an instruction screen for arranging one or a plurality of GND vias is displayed for the GND overlapping conductive area where the GND via is not arranged. With this configuration, it is possible to allow the user to arrange the GND vias in the vicinity of the respective corners in the GND overlapping conductive area.

Also, when the GND vias are arranged in actuality, the above-mentioned predetermined interval L5 may also vary in one circuit board depending on a situation within the value of L5. It is however noted that by performing a setting that the value of L5 is not varied, that is, the setting of the evenly spaced arrangement, the calculation of the variation in the value of L5 depending on a situation becomes unnecessary, and an advantage is obtained that the program operation becomes faster.

In addition, according to the present embodiment, the case has been described in which the GND vias on contact with all the conductive layers of the printed circuit board are automatically arranged, but it is also possible to automatically arrange the GND vias on contact with a plurality of a part of the conductive layers constituting the printed circuit board. In that case, the overlapping conductive area only with respect to the conductive layer on contact with the GND via is extracted, and the GND vias may be arranged in the relevant overlapping conductive area similarly as in the above-mentioned embodiment. At that time, it is possible to efficiently arrange the GND vias by treating the GND vias on contact with the plurality of layers including the part of the relevant conductive layers as the GND vias already arranged.

According to the first embodiment, for the method of calculating the arrangement position of the GND vias, a method has been described in which the GND vias already arranged or newly arranged in the GND overlapping conductive area are used as the reference to shift in the predetermined direction by the predetermined distance. According to the fourth embodiment, for a method of calculating the arrangement position of the GND vias, a case will be described in which an area where the GND vias can be arranged is divided into areas having a predetermined size (hereinafter, referred to as blocks), and one point in the sectioned area is set as an arrangement position.

Figure 28:
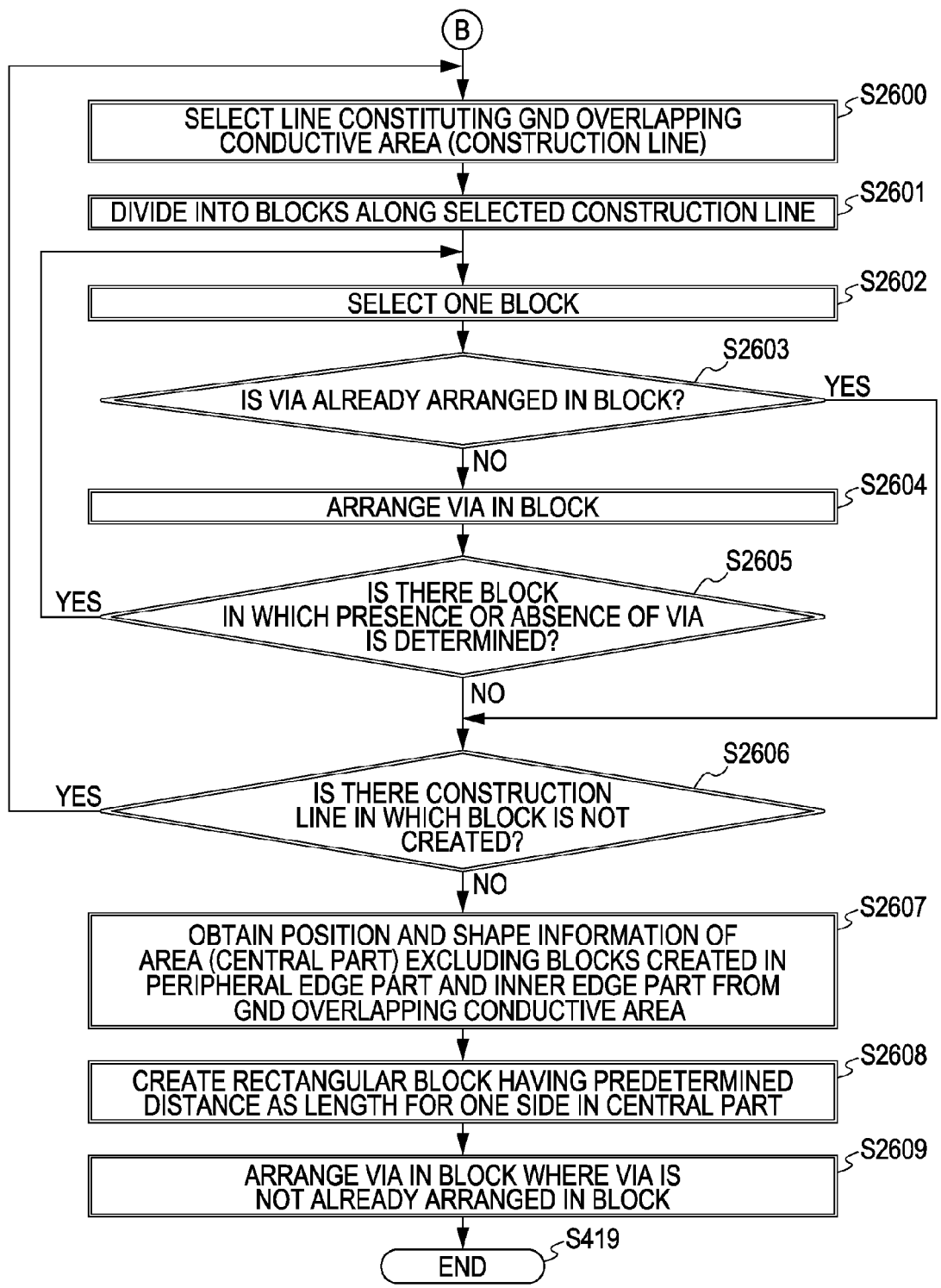
FIG. 28 is a flow chart for an example of the processing operation according to a fourth embodiment of the present invention.

The processing operation performed on the basis of the printed circuit board design support program (processing program) by the printed circuit board design support apparatus according to the present embodiment is similar to the above-mentioned flow chart shown in FIG. 3. FIG. 28 is a flow chart showing a part of the steps in detail in the flow chart shown in FIG. 3. Herein, step B shown in FIG. 28 follows step B shown in FIG. 23. It is to be noted that the processing in step B shown in FIG. 23 is similar to that of the first and third embodiments, and a description thereof will be omitted. Also, according to the present embodiment, similarly as in the second embodiment, in order to arrange the GND vias in the vicinity of the high-speed interconnection via with priority, steps S1600 to S1602 shown in FIG. 17 may be added between step S407 and step B shown in FIG. 23.

Hereinafter, the processing operation of the printed circuit board design support apparatus according to the present embodiment will be described with reference to the flow chart shown in FIG. 28 and the schematic drawings shown in FIGS. 29 to 33. It is to be noted that the processing in steps S2600 to S419 shown in FIG. 28 is a processing carried out by the via automatic arrangement unit 23 on the basis of the layout information 142 stored in the main storage apparatus 11. Also, in order to facilitate the description, FIGS. 29 to 33 show only the GND overlapping conductive area 81 shown in FIG. 10. However, similarly, the GND vias are of course arranged in the GND overlapping conductive areas 80, 82, 83, and 84 in actuality. Also, according to the present embodiment, a method will be described in which, similarly as in the first embodiment, the peripheral edge part and the inner edge part, and the central part are divided and, in a stepwise fashion, the GND vias are automatically arranged. Therefore, the via automatic arrangement condition in step S401 is the same as the predetermined interval L1, the predetermined interval L2, and the predetermined interval L3 according to the first embodiment.

Hereinafter, the flow chart shown in FIG. 28 will be described in detail.

In step S2600, when the position information and the shape information of the GND overlapping conductive area A are obtained in step S407 shown in FIG. 23, the via automatic arrangement unit 23 selects one of the construction lines of the GND overlapping conductive area A. The via automatic arrangement unit 23 calculates a length D2 of the selected construction line and calculates a value N2 which is obtained while 1 is added to an integer part of a quotient (D2/L2) obtained by dividing the calculated length D2 by the predetermined interval L2. Furthermore, the via automatic arrangement unit 23 calculates C2 which is obtained by dividing the length D2 by N2 (=D2/N2).

In step S2601, the via automatic arrangement unit 23 creates a block having a length of a side perpendicular to the construction line as the predetermined interval L1 and having a length of a side along the construction line as C2, along construction line selected in the step S2600. At this time, in a case where the block having the above-mentioned size cannot be created in the GND overlapping conductive area A such as in the vicinity of the construction point of the GND overlapping conductive area A, the via automatic arrangement unit 23 sets a shape obtained by excluding the outer part of the GND overlapping conductive area A from the rectangle having the above-mentioned size as the block shape.

In step S2602, after the block division, the via automatic arrangement unit 23 selects one (block B1) of the divided blocks.

In step S2603, the via automatic arrangement unit 23 determines whether the GND vias are already arranged in the block B1. In a case where the GND vias are already arranged in the block B1, the flow advances to the processing in step S2605. In a case where the GND vias are not yet arranged, the flow advances to the processing in step S2604.

In step S2604, the via automatic arrangement unit 23 arranges the GND vias in the block B1.

Next, in step S2605, the via automatic arrangement unit 23 determines whether a block for which the processing in step S2603 is not executed exists, that is, whether a block for which the presence or absence of the GND vias in the block is not determined (a block other than the block B1) exists. In a case where the block for which the processing in step S2603 is not executed exists, the flow is returned to the processing in step S2602. In a case where the block for which the processing in step S2603 is not executed does not exist, the flow advances to the processing in step S2606.

In step S2606, the via automatic arrangement unit 23 determines whether the construction line for which the processing in step S2601 is not executed exists. In a case where the construction line for which the processing in step S2601 is not executed exists, the flow is returned to the processing in step S2600. In a case where the construction line for which the processing in step S2601 is not executed does not exist, the flow advances to the processing in step S2607.

In step S2607, the via automatic arrangement unit 23 obtains the position information and the shape information of the central part of the GND overlapping conductive area A. The central part herein refers to an area in which all the blocks divided in step S2601 are excluded from the GND overlapping conductive area A (hereinafter, referred to as central area B).

In step S2608, after the position information and the shape information of the central area B is obtained, the via automatic arrangement unit 23 divides the central area B into square blocks with each side having a distance half of the predetermined distance L3 (L3/2). This processing corresponds to a block dividing step. At this time, in a case where the square blocks with each side of L3/2 in the vicinity of the construction line or the construction point of the central area B cannot be created in the central area B, the via automatic arrangement unit 23 sets the shape in which the outer part of the central area B is excluded from the square blocks as the shape of the blocks.

In step S2609, after the central area B is divided into the blocks, the via automatic arrangement unit 23 arranges the GND vias in the blocks where the GND vias are not yet arranged. This processing corresponds to a fourth arranging step. The processing in step S2609 is the same processing as the series of processing in steps S2602 to S2605.

In step S419, after the GND vias are arranged in the central area B, the via automatic arrangement unit 23 ends the processing program 141.

Next, the processing operation of the printed circuit board design support program according to the present embodiment will be specifically described with reference to the flow chart shown in FIG. 28 and the schematic drawings shown in FIGS. 29 to 33. First, in step S2600, the via automatic arrangement unit 23 selects one of the construction lines 910, 911, 912, 913, 914, and 915 of the position information and the shape information obtained in step S407 shown in FIG. 23. For example, it is supposed that the via automatic arrangement unit 23 selects the construction line 910.

Figure 29:
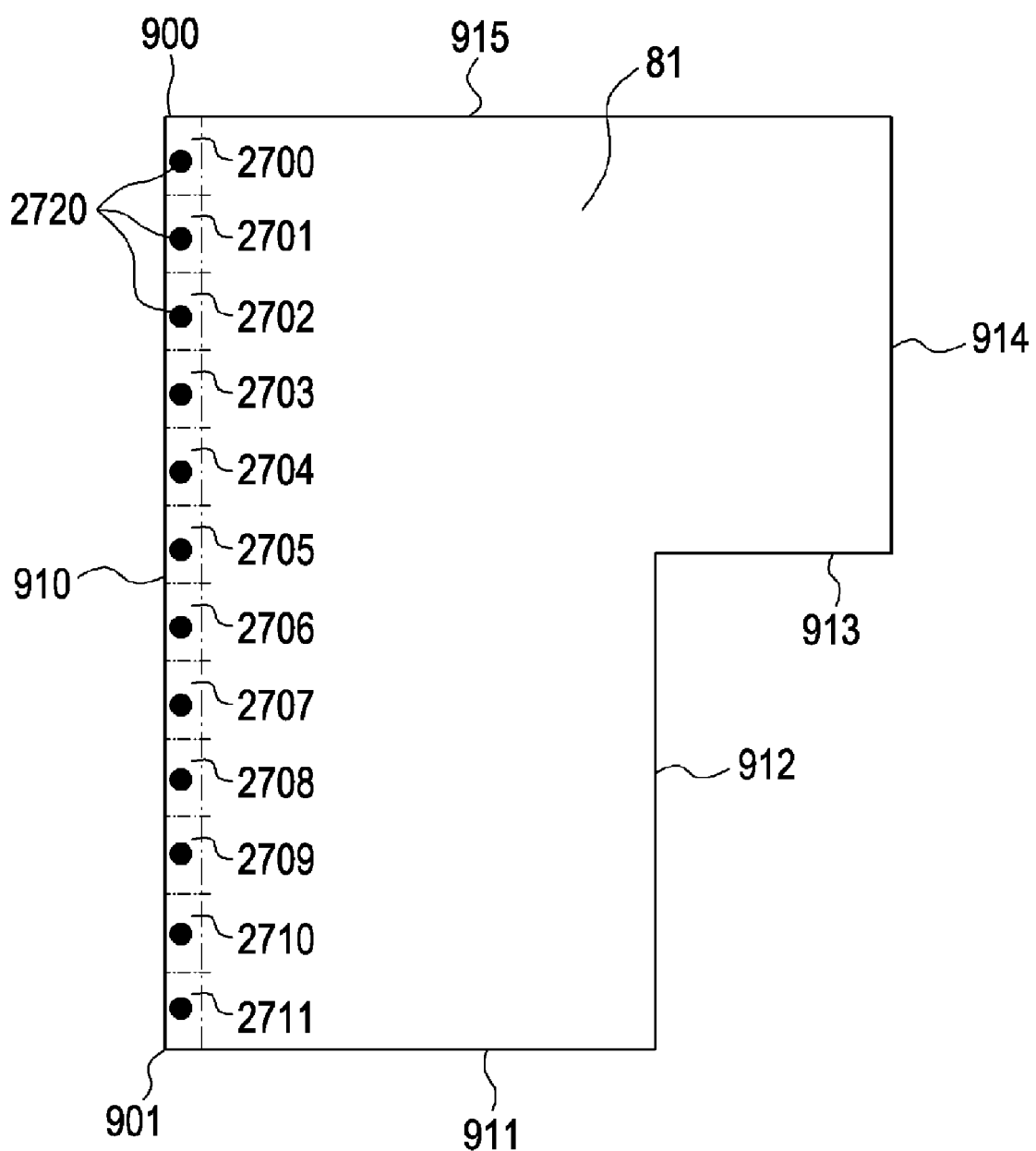
FIG. 29 is an explanatory diagram for describing a processing from steps S2600 to S2604 according to the fourth embodiment.

In step S2601, the via automatic arrangement unit 23 divides, as shown in FIG. 29, the peripheral edge part of the GND overlapping conductive area 81 along the construction line 910 into blocks. For a block dividing method in step S2601, first, the via automatic arrangement unit 23 calculates a length D2 of the construction line 910. Next, the via automatic arrangement unit 23 calculates a value N2 which is obtained while 1 is added to an integer part of a quotient obtained by dividing the length D2 by the predetermined interval L2, and subsequently calculates a value C2 which is obtained by dividing the length D2 by N2 (=D2/N2). Next, the via automatic arrangement unit 23 creates blocks 2700 to 2711, shown in FIG. 29, having a length of a side perpendicular to the construction line 910 as the predetermined interval L1 and a side along the construction line 910 as a value C2, along the construction line 910 from the end of the construction line 910. In the case of the construction line 910 shown in FIG. 29, as the corner of the construction points 900 and 901 is the right angle, it is possible to carry out the division by all the rectangular blocks. However, in the actual printed circuit board, the angle of the GND overlapping conductive area is not necessarily the right angle. In a case where the divided rectangular block runs off from the GND overlapping conductive area, a shape obtained by excluding the outside area of the GND overlapping conductive area from the divided rectangles may be applied as a shape of the block.

In addition, in a case where the peripheral edge part of the GND overlapping conductive area becomes an excess part with respect to the rectangles divided in the vicinity of the end point of the construction line 910, a shape in which the excess part diagram is added to the block at the end of the construction line can be applied.

In step S2602, the via automatic arrangement unit 23 selects one of the blocks created in step S2601. For example, it is supposed that the via automatic arrangement unit 23 selects the block 2700.

In step S2603, in order for the via automatic arrangement unit 23 to determine whether the GND via is not yet arranged in the block 2700, the flow advances to the processing in step S2604.

In step S2604, the via automatic arrangement unit 23 arranges the GND via 2720. At this time, the arrangement position of the GND via in step S2604 is preferably at the center of the block 2700. For another position, any position inside the block 2700 can be conceivable such as a gravity center of the block 2700 or a position in the vicinity of the border with respect to the adjacent block 2701.

Next, in step S2605, the via automatic arrangement unit 23 determines that the block for which the determination in step S2603 is not yet performed exists as to the blocks 2701 to 2711, and the flow is therefore returned to the processing in step S2602.

Subsequently, similarly, the via automatic arrangement unit 23 repeatedly executes the processing steps S2602 to step S2605, and as shown in FIG. 29, sequentially arranges the GND vias 2720 in the peripheral edge part along the construction line 910. In step S2605, when the via automatic arrangement unit 23 determines that the block for which the determination in step S2603 is not yet performed does not exist, the flow advances to the processing in step S2606. Then, in the next step S2606, the via automatic arrangement unit 23 determines that the construction line for which the blocks are not created exists as to the construction lines 911 to 915, and the flow returns to the processing in step S2600.

Figure 30:
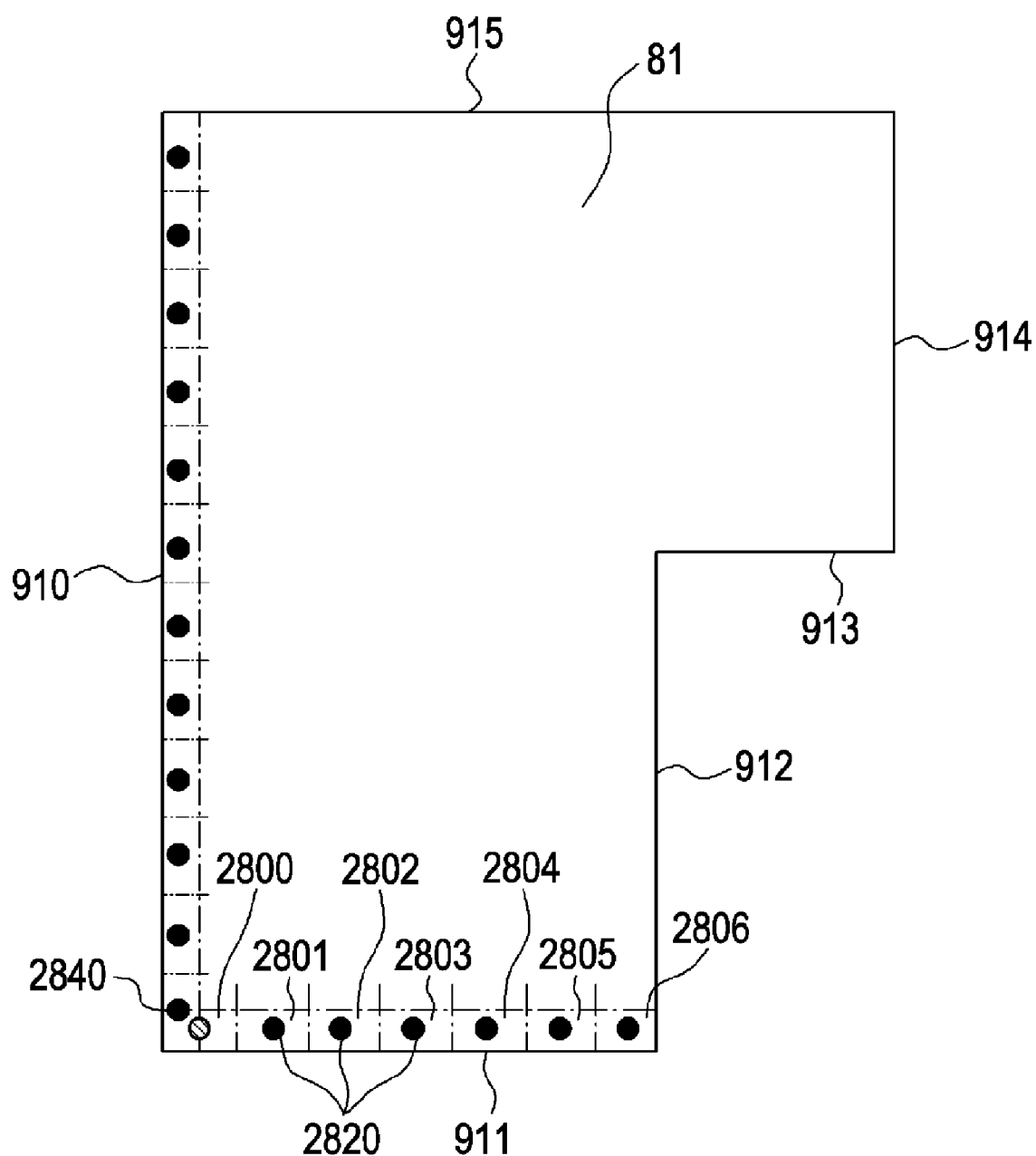
FIG. 30 is an explanatory diagram for describing the processing from steps S2600 to S2604 according to the fourth embodiment.

In step S2600, the via automatic arrangement unit 23 selects a construction line again. For example, when it is supposed that the via automatic arrangement unit 23 selects the construction line 911, as shown in FIG. 30, in step S2601, blocks 2800 to 2806 are created.

In step S2602, the via automatic arrangement unit 23 selects one of the blocks 2800 to 2806. For example, in a case where the via automatic arrangement unit 23 selects the block 2800, in step S2603, as the via automatic arrangement unit 23 determines whether the GND via 2840 exists in the block 2800, the flow advances to the processing in step S2605.

In step S2605, the via automatic arrangement unit 23 determines that the block for which the determination in step S2603 is not performed exists (the blocks 2801 to 2806), and the flow is returned to the processing in step S2602. Then, the via automatic arrangement unit 23 selects one block again. For example, in a case where it is supposed that the via automatic arrangement unit 23 selects the block 2801, in step S2603, as the via automatic arrangement unit 23 determines that the GND via is not yet arranged in the block 2801, the flow advances to the processing in step S2604. In step S2604, the via automatic arrangement unit 23 arranges the GND via 2820 in the block 2801, and the flow advances to the processing in step S2605.

Figure 31:
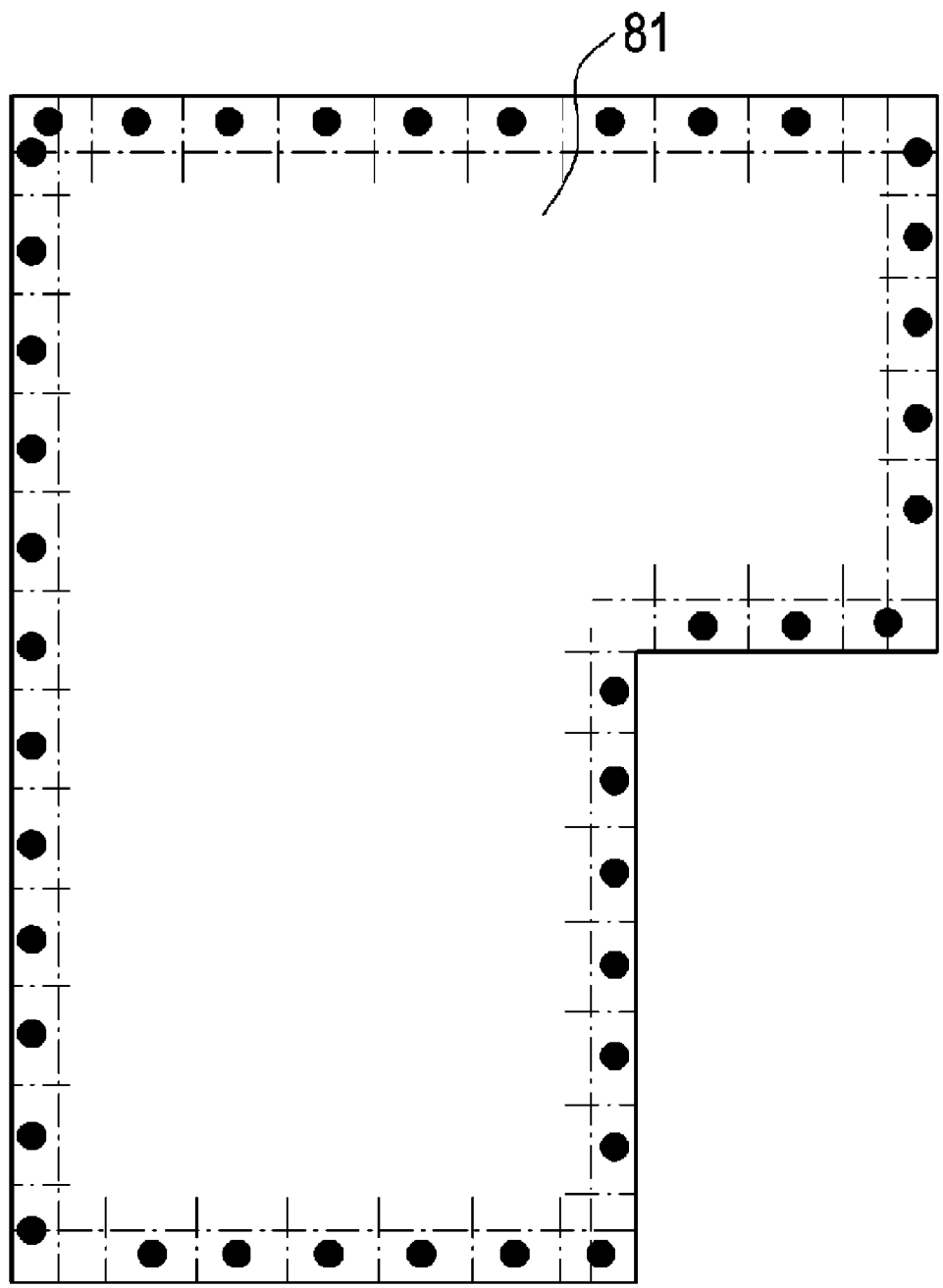
FIG. 31 shows a state after a processing in step S2606 according to the fourth embodiment.

Subsequently, similarly, the via automatic arrangement unit 23 repeatedly executes the processing in steps S2602 to S2605 and sequentially arranges the GND vias 2820. Then, similarly, the via automatic arrangement unit 23 repeatedly executes the processing in steps S2600 to S2606 until the construction line for which the block division in step S2606 is not carried out no longer exists. With this configuration, the GND vias can be arranged at an interval within the predetermined interval L2 in the peripheral edge part within the predetermined interval L1 from the construction line of the GND overlapping conductive area 81. FIG. 31 shows a state after the GND vias are arranged the peripheral edge part of the GND overlapping conductive area 81. At this time, the inner edge part does not exists in the GND overlapping conductive area 81, but in a case where the inner edge part exists, by obtaining the position information and the shape information of the inner edge in step S407, the via automatic arrangement unit 23 can arrange the GND via in the inner edge part. That is, on the basis of the position information and the shape information of the inner edge, as the via automatic arrangement unit 23 repeatedly executes the processing in steps S2600 to S2606, the GND vias are arranged at an interval within the predetermined interval L2 in a range within the predetermined interval L1 from the inner edge.

Next, the processing operation of automatically arranging the GND vias in the central part of the GND overlapping conductive area 81 will be described in detail.

Figure 32:
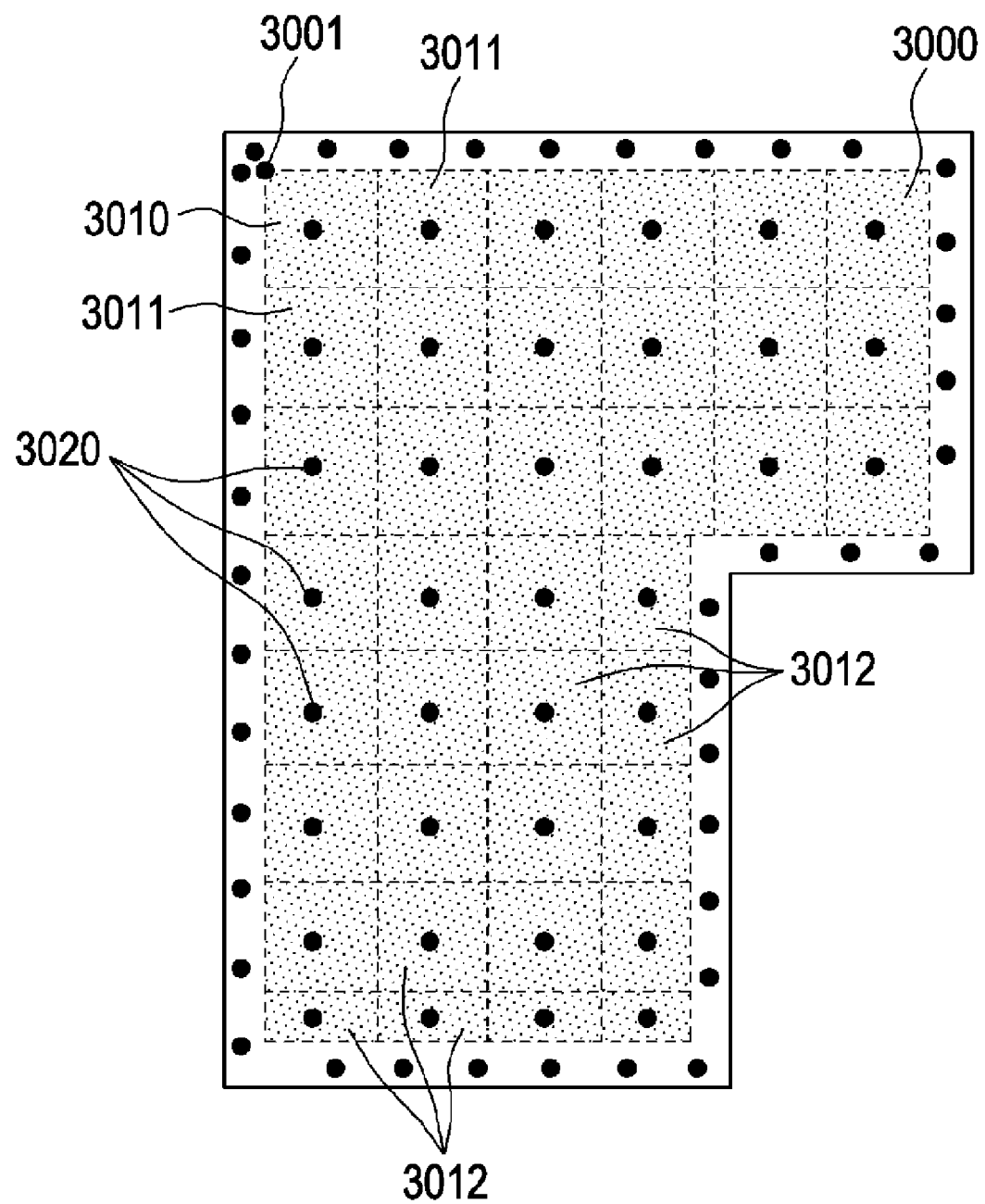
FIG. 32 is an explanatory diagram for describing a processing in steps S2608 and S2609 according to the fourth embodiment.

In step S2607, the via automatic arrangement unit 23 obtains the position information and the shape information of an area where the blocks created in step S2601 are all excluded from the GND overlapping conductive areas 81, that is, a central part 3000 which is an area of a gray part shown in FIG. 32. In step S2608, the via automatic arrangement unit 23 divides the central part 3000 into blocks. Herein, for a block dividing method, first, the via automatic arrangement unit 23 selects one of the construction points in the central part 3000. Herein, the via automatic arrangement unit 23 selects a construction point 3001 shown in FIG. 32. The via automatic arrangement unit 23 creates inside the central part 3000 a square block 3010 shown in FIG. 32 in which the construction point 3001 is one of the apexes, a length of one side is set as the predetermined interval L3, and also one side is parallel to the x axis. At this time, the length of the one side of the square blocks is not necessarily set as L3. For example, a value smaller than L3 such as L3/2 or L3/3 may be used. Then, a square block 3011 is created which shares one side with the block 3010 and also shares a part of the area with the central part 3000. The via automatic arrangement unit 23 sequentially creates the square blocks 3012 sharing one side from the created square block and also sharing a part of the area with the central part 3000. At this time, in a case where the created square block 3012 runs off from the central part 3000, the via automatic arrangement unit 23 applies a shape obtained by excluding the running off area from the central part 3000 from the square blocks 3012 as the shape of the block.

Next, in step S2609, the via automatic arrangement unit 23 determines whether the GND vias already exist inside the created blocks 3010, 3011, and 3012, respectively. In a case where the GND via does not exist, the via automatic arrangement unit 23 executes a processing of arranging the GND via 3020. In step S2609, the processing in the above-mentioned steps S2602 to S2606 may be applied to the block 3012. In step S419, the via automatic arrangement unit 23 ends the program.

According to the present embodiment, by adjusting the size of the blocks divided through the processing such as adoption of a value obtained by multiplying the predetermined interval L2 or L3 by a ratio set by the user, it is possible to realize the GND via arrangement state desired by the user. With this configuration, it is possible to arrange the GND vias while emphasizing the decrease in the number of the GND vias to be arranged instead of arranging the GND vias within the predetermined interval, that is, the cost aspects are considered. It is to be noted that in FIG. 32, the symbols are not assigned to all the GND vias 2720, 2820, and 3020, and the blocks 3012.

In addition, it is not necessary to arrange the GND vias in all the blocks. That is, for example, a processing of skipping the arrangement of the GND via in the block having the area equal to or smaller than a predetermined area is added, and thus the arrangement of the GND vias can be realized without arranging the GND via unnecessary to the user, that is, while the cost aspects are considered as described above.

Furthermore, similarly as in the first embodiment, it is possible to apply even in a case where the position information and the shape information of the GND overlapping conductive area are represented by inequations on the coordinate plane or the space.

Figure 33:
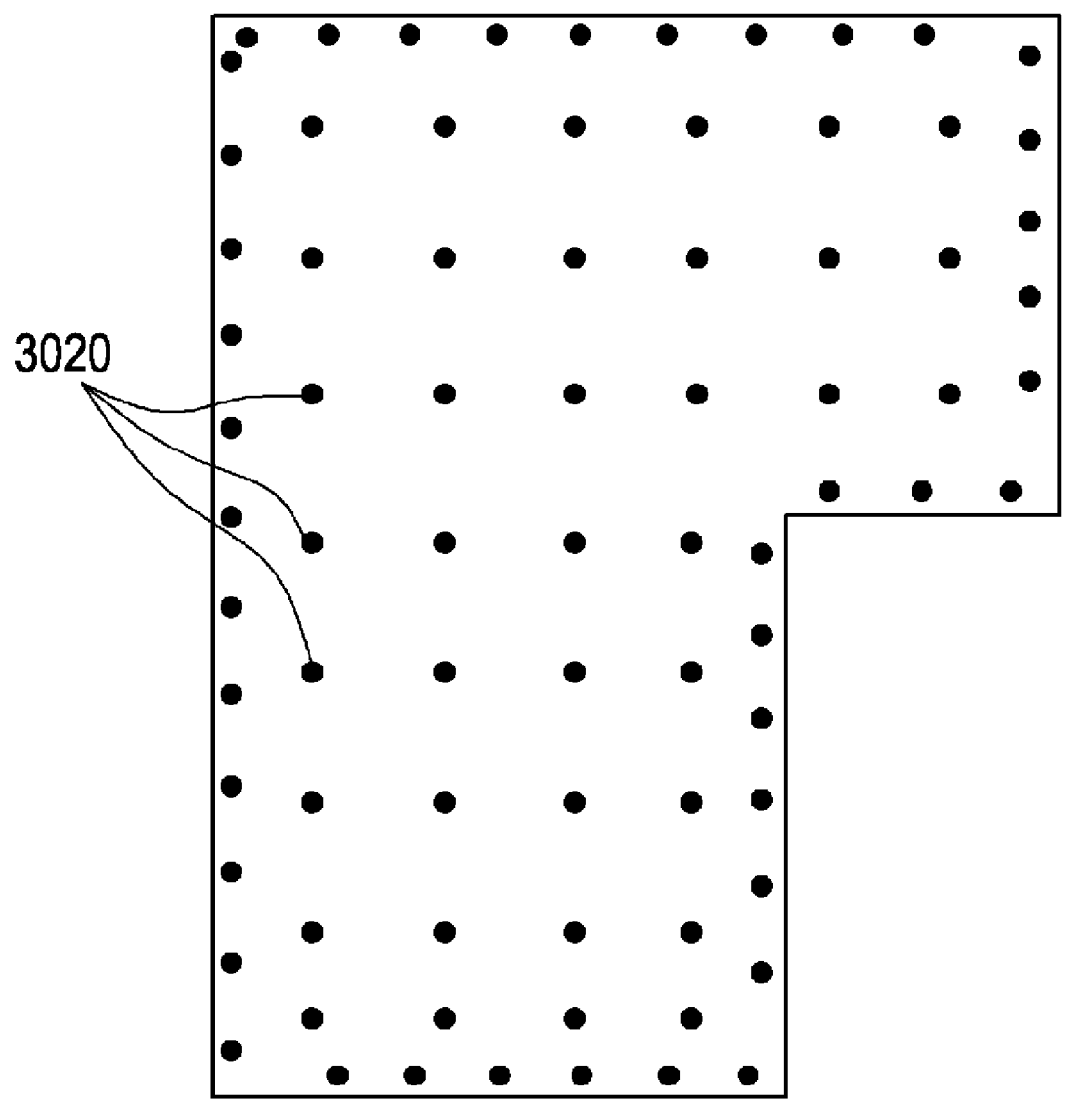
FIG. 33 shows an arrangement state of the GND vias after the processing according to the fourth embodiment.

According to the present embodiment, as shown in FIG. 33, at a distance within the predetermined interval L1 from the peripheral edge of the peripheral edge part and the inner edge part in the GND overlapping conductive area of the printed circuit board, the GND vias can be automatically arranged at an interval within the predetermined interval L2. Furthermore, the GND vias can be automatically arranged in the central part of the GND overlapping conductive area at an interval within the predetermined interval L3. It is to be noted that according to the present embodiment, when the GND vias are arranged in actuality, the predetermined intervals L1, L2, and L3 for deciding the size and the shape of the block may vary by a value within L1, a value within L2, and a value within L3, respectively, in one circuit board depending on a situation. It is however noted that as the values of L1, L2, and L3 are not varied, that is, with the setting of the evenly spaced block division, the calculation for the variations in the values of L1, L2, and L3 depending on a situation becomes unnecessary, and it is possible to obtain the effect that the operation of the program becomes faster.

Also, according to the present embodiment, the example is represented in which the peripheral edge part and the inner edge part, and the central part in the GND overlapping conductive area of the printed circuit board are divided, and the GND vias are automatically arranged in a stepwise fashion. On the other hand, the GND vias can also be automatically arranged entirely in the GND overlapping conductive area in a lump. In this case, by applying the method of dividing the central part into the blocks in step S2607 of FIG. 28 to the entire GND overlapping conductive area as it is, the GND vias be automatically arranged collectively in the entire GND overlapping conductive area within the predetermined interval.

In addition, according to the present embodiment, the case has been described in which the GND vias on contact with all the conductive layers of the printed circuit board are automatically arranged, but it is also possible to automatically arrange the GND vias on contact with a part of the conductive layers constituting the printed circuit board. In that case, the overlapping conductive area only with respect to the conductive layer on contact with the GND via is extracted, and the GND vias may be arranged in the relevant overlapping conductive area similarly as in the present embodiment. At that time, it is possible to efficiently arrange the GND vias by treating the GND vias on contact with the plurality of layers including the part of the relevant conductive layers as the GND vias already arranged.

According to the first to fourth embodiments, the case has been described in which the GND vias are automatically arranged in the GND overlapping conductive area of the printed circuit board. According to the fifth embodiment, a case will be described in which when the GND overlapping conductive area is changed along with the wiring change such as the signals, for example, the GND vias are rearranged within a predetermined interval.

Figure 34A:
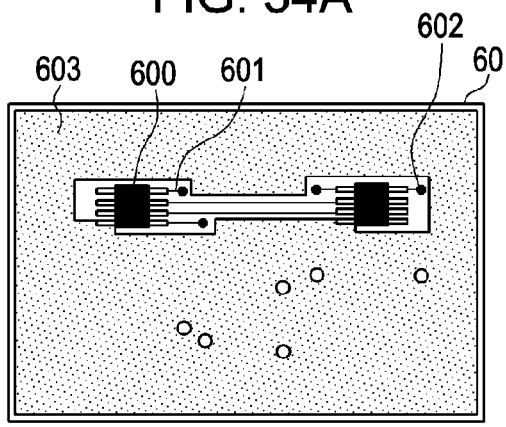
FIGS. 34A to 34E are schematic diagrams of a printed circuit board for describing the operational processing according to a fifth embodiment of the present invention.
Figure 34B:
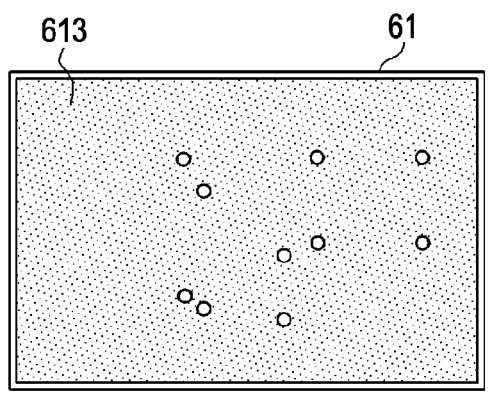
Figure 34C:
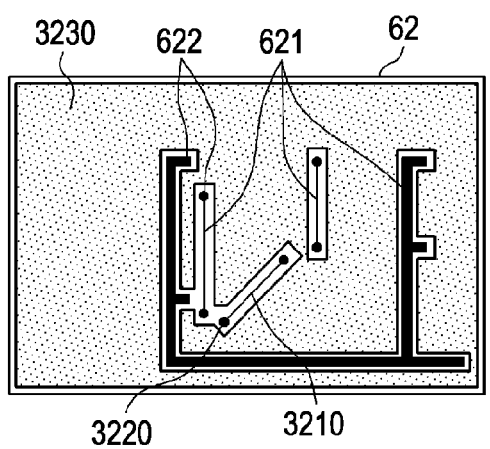
Figure 34D:
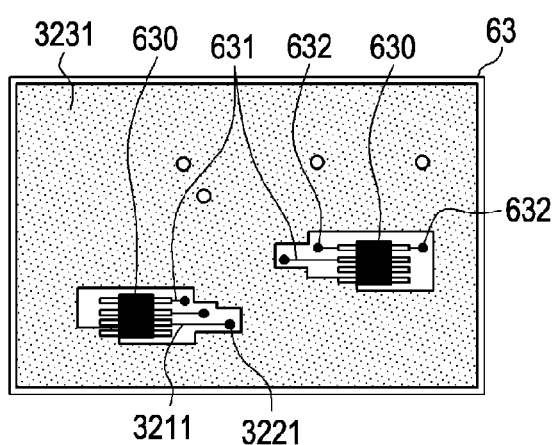
Figure 34E:
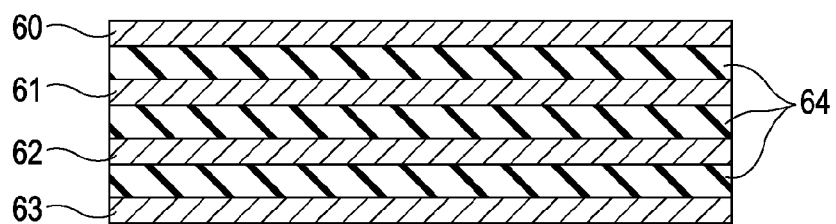

According to the present embodiment, as schematic diagrams of the printed circuit board before the wiring change, a reference is made to the printed circuit boards shown in FIGS. 6A to 6E. Also, as schematic diagrams of the printed circuit boards after the wiring change, a reference is made to the printed circuit boards shown in FIGS. 34A to 34E. Here, a wiring change point of the printed circuit board according to the present embodiment will be described. According to the present embodiment, the signal wiring 6210 and the signal wiring via 6220 of the internal layer shown in FIG. 6C are changed into a signal wiring 3210 and a signal wiring via 3220 of the internal layer shown in FIG. 34C. Also, the signal wiring 6310 and the signal wiring via 6320 of the front layer shown in FIG. 6D are changed into a signal wiring 3211 and a signal wiring via 3221 shown in FIG. 34D. Along with this wiring change, the shapes of the GND conductive areas 623 and 633 shown in FIGS. 6C and 6D are changed into GND conductive areas 3230 and 3231 shown in FIGS. 34C and 34D, respectively.

Figure 35:
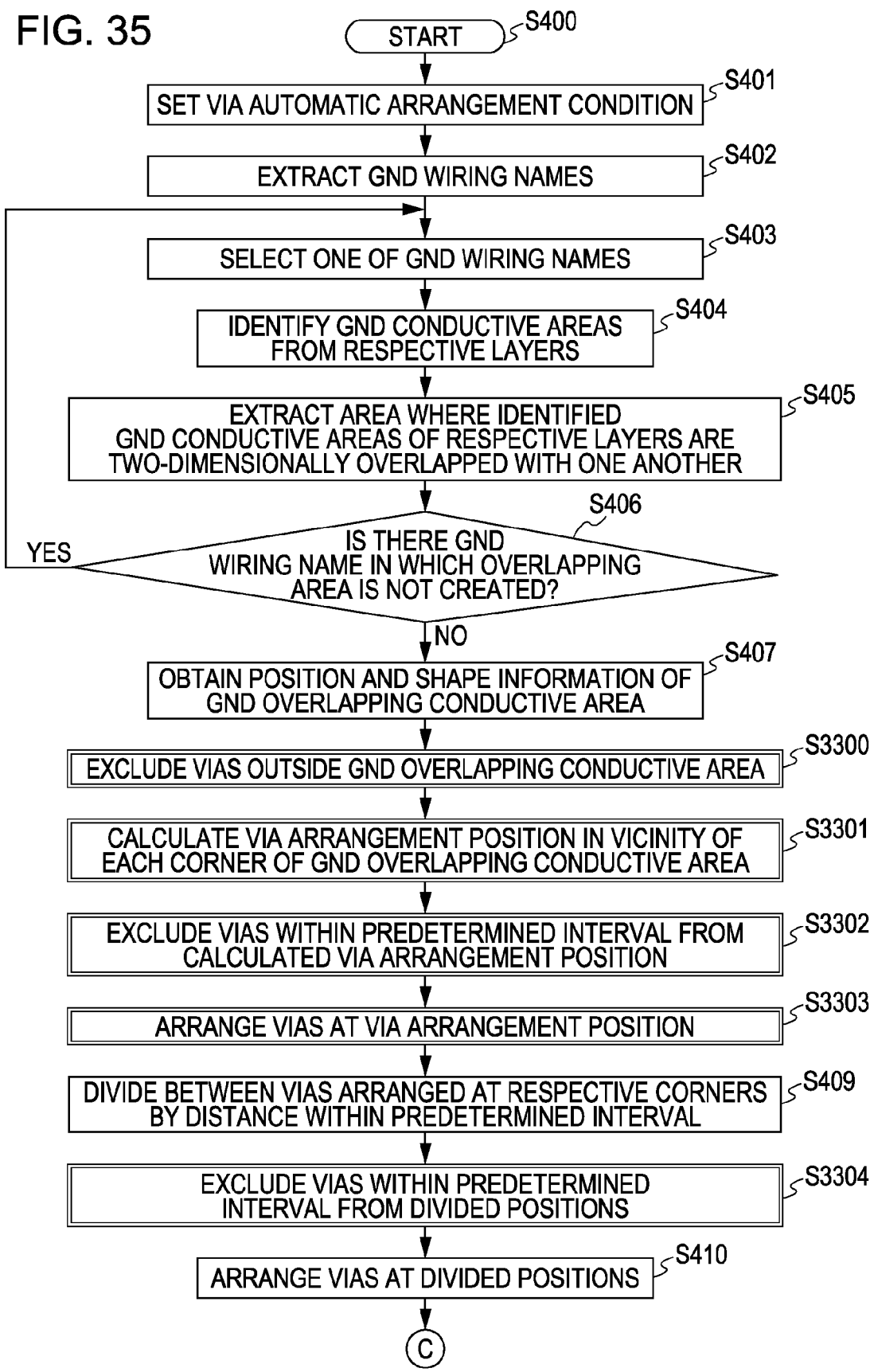
FIG. 35 is a flow chart for an example of the processing operation according to the fifth embodiment.
Figure 36:
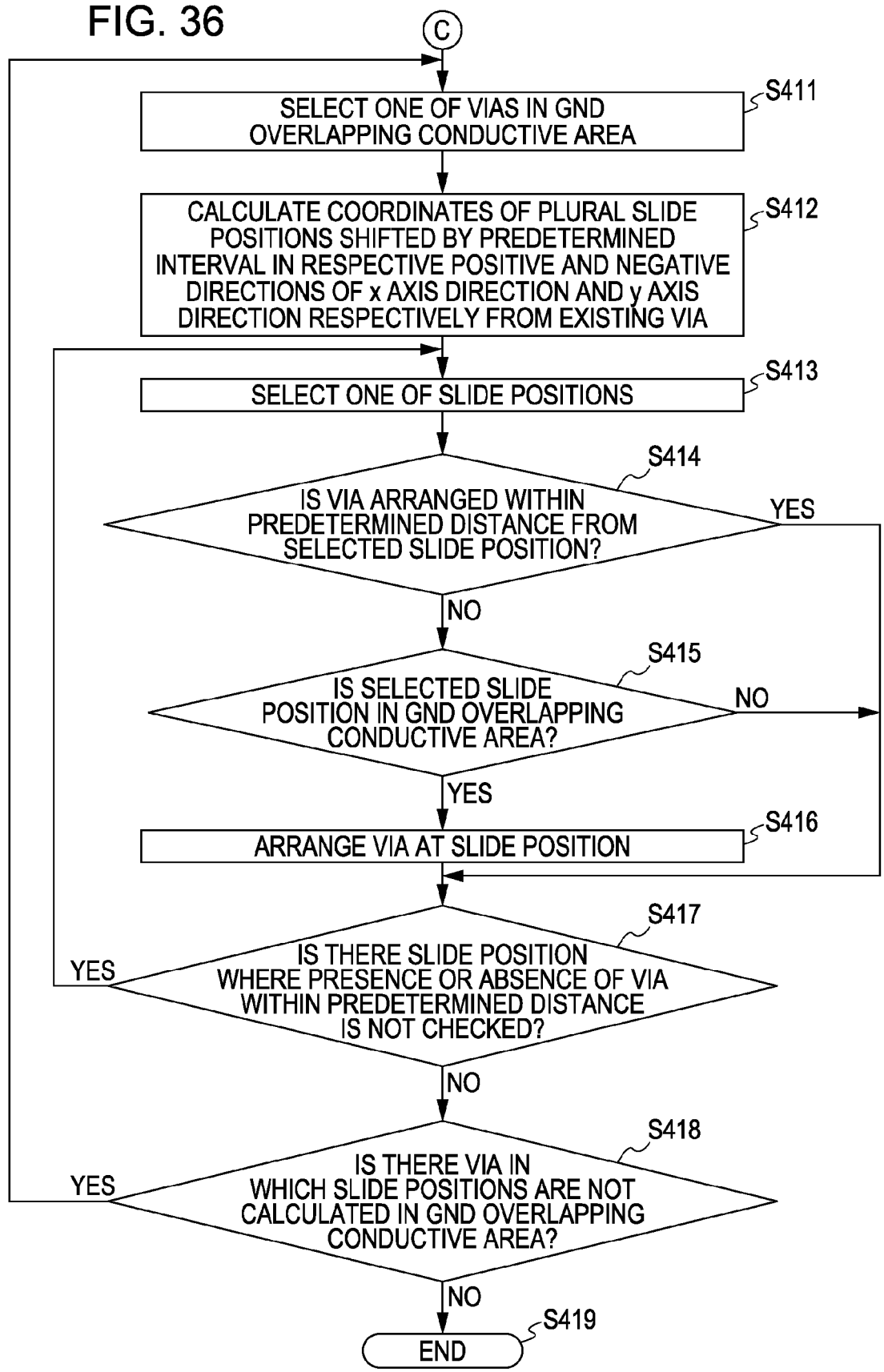
FIG. 36 is a flow chart for an example of the processing operation according to the fifth embodiment.

Hereinafter, the processing operation of the printed circuit board design support apparatus according to the present embodiment will be described with reference to the flow charts shown in FIGS. 35 and 36, FIGS. 34A to 34E and the schematic diagrams shown in FIGS. 37 to 44. The operational processing in steps S400 to S407 and steps S409 and S410 shown in FIG. 35 is the same processing as in the same step numbers shown in FIG. 4 according to the first embodiment, and therefore a detail description thereof will be omitted. Also, the flow chart shown in FIG. 36 is similar to the flow chart shown in FIG. 5, and a detail description thereof will be omitted.

Here, a processing of a part of the flow chart shown in FIG. 35 will be described.

In step S404, the diagram computation unit 22 identifies the conductive areas of the respective layers related to the GND wiring name selected in step S403 again. This processing corresponds to a ground conductive area reidentifying step.

Next, in step S405, the diagram computation unit 22 extracts an area where the identified conductive areas of the respective layers are two-dimensionally overlapped in the height direction as a GND overlapping conductive area C again. This processing corresponds to a reextracting step.

Next, a processing in steps S3300 to S3304 will be described. At this time, the processing in steps S3300 to S3304 is performed while the via automatic arrangement unit 23 reads out the layout information 142 stored in the main storage apparatus 11.

In step S3300, after the position information and the shape information of the GND overlapping conductive area C after the wiring change is obtained in step S407, the via automatic arrangement unit 23 excludes the GND vias. This processing corresponds to an interlayer connection member excluding step. To be more specific, the via automatic arrangement unit 23 excludes the GND vias out of the GND overlapping conductive area C. This processing corresponds to an overlapping conductive area outside member excluding step.

In step S3301, the via automatic arrangement unit 23 calculates via arrangement positions in the vicinity of the respective corners of the GND overlapping conductive area C.

In step S3302, the via automatic arrangement unit 23 excludes the GND via within the predetermined interval L2 from the via arrangement positions calculated in the step S3301.

In step S3303, the via automatic arrangement unit 23 arranges the GND vias at the via arrangement positions calculated in step S3301.

In step S409, the via automatic arrangement unit 23 divides the two adjacent GND vias among the GND vias arranged in step S3303 by a distance within the predetermined interval L2 along the construction line of the GND overlapping conductive area C.

In step S3304, the via automatic arrangement unit 23 excludes the GND vias already arranged within a range of the predetermined interval L2 from the divided positions.

In step S410, the via automatic arrangement unit 23 arranges the GND vias at the respective positions divided in step S409. This processing corresponds to an automatic rearranging step. At this time, in the case of coping with the change in the high-speed interconnection, the processing in steps S1600 to S1602 shown in FIG. 17 is added between steps S3300 and S3301. In this case, the high-speed interconnection via to be selected in step S1600 may be only the via of the changed high-speed interconnection.

Next, with reference to the schematic diagrams of FIGS. 34A to 34E and FIGS. 37 to 44, the processing operation of the printed circuit board design support apparatus according to the present embodiment will be specifically described.

Figure 37:
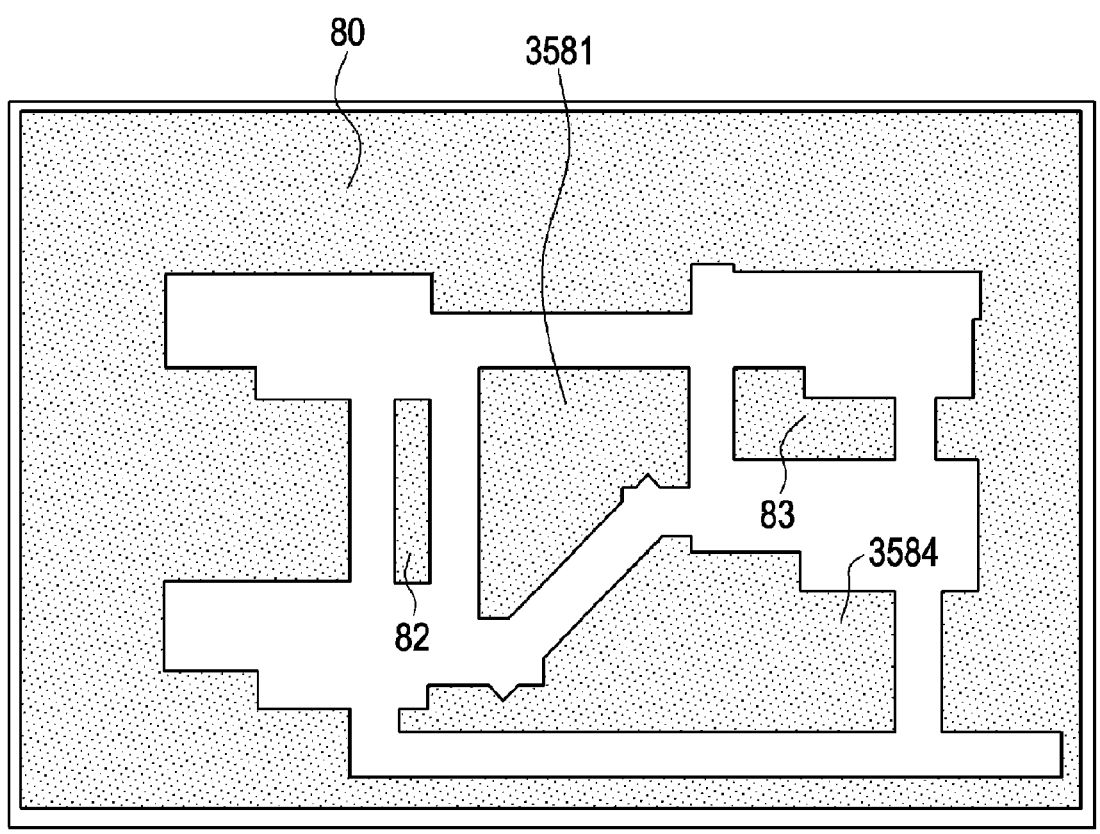
FIG. 37 shows a state after a processing in step S405 according to the fifth embodiment.

First, in steps S401 to S406, the via automatic arrangement unit 23 extracts the GND overlapping conductive areas. These processings are the same as those according to the first embodiment. FIG. 37 shows the extracted GND conductive areas. That is, areas of gray parts 80, 82, 83, 3581, and 3584 shown in FIG. 37 are the GND overlapping conductive areas. It is to be noted that the GND overlapping conductive areas 80, 82, and 83 are matched with the GND overlapping conductive areas having the same symbols shown in FIG. 10. That is, the GND overlapping conductive areas 3581 and 3584 are GND overlapping conductive areas in which the GND overlapping conductive areas are changed along with the wiring change.

Figure 38:
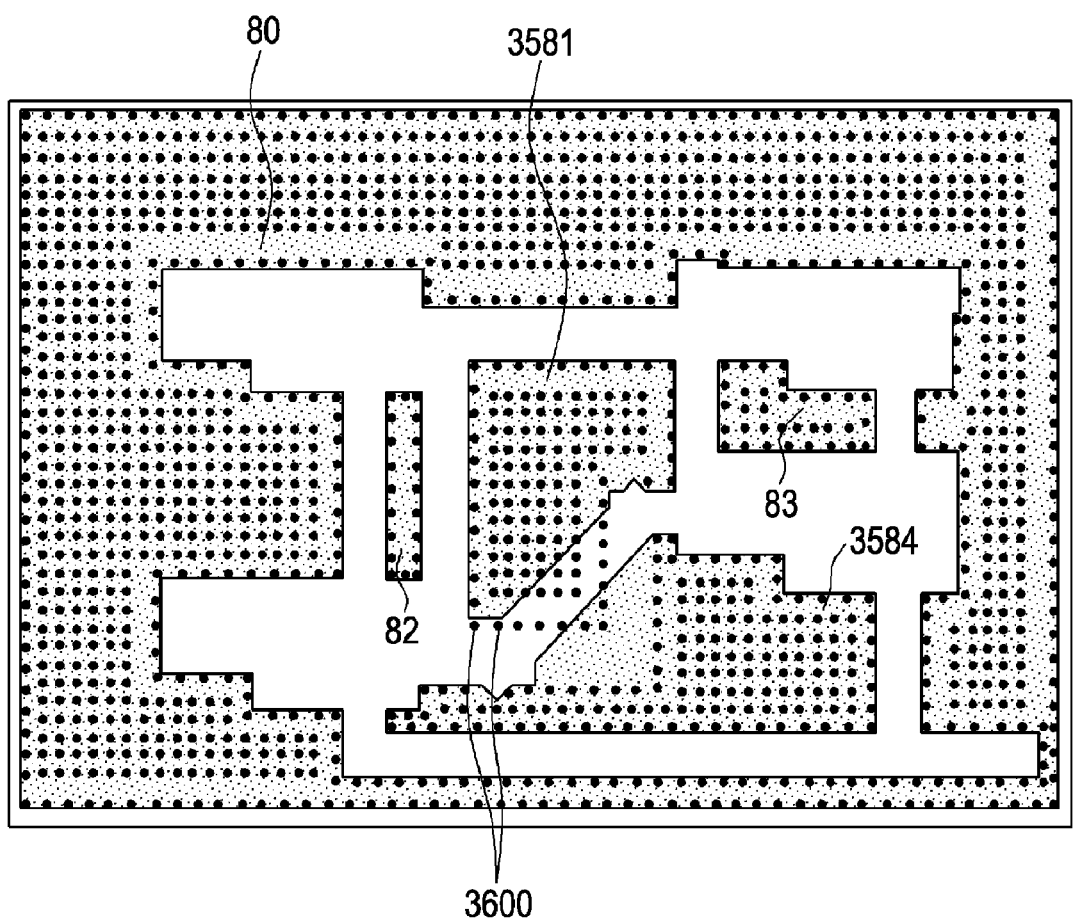
FIG. 38 shows a state after the processing in step S405 according to the fifth embodiment.
Figure 39:
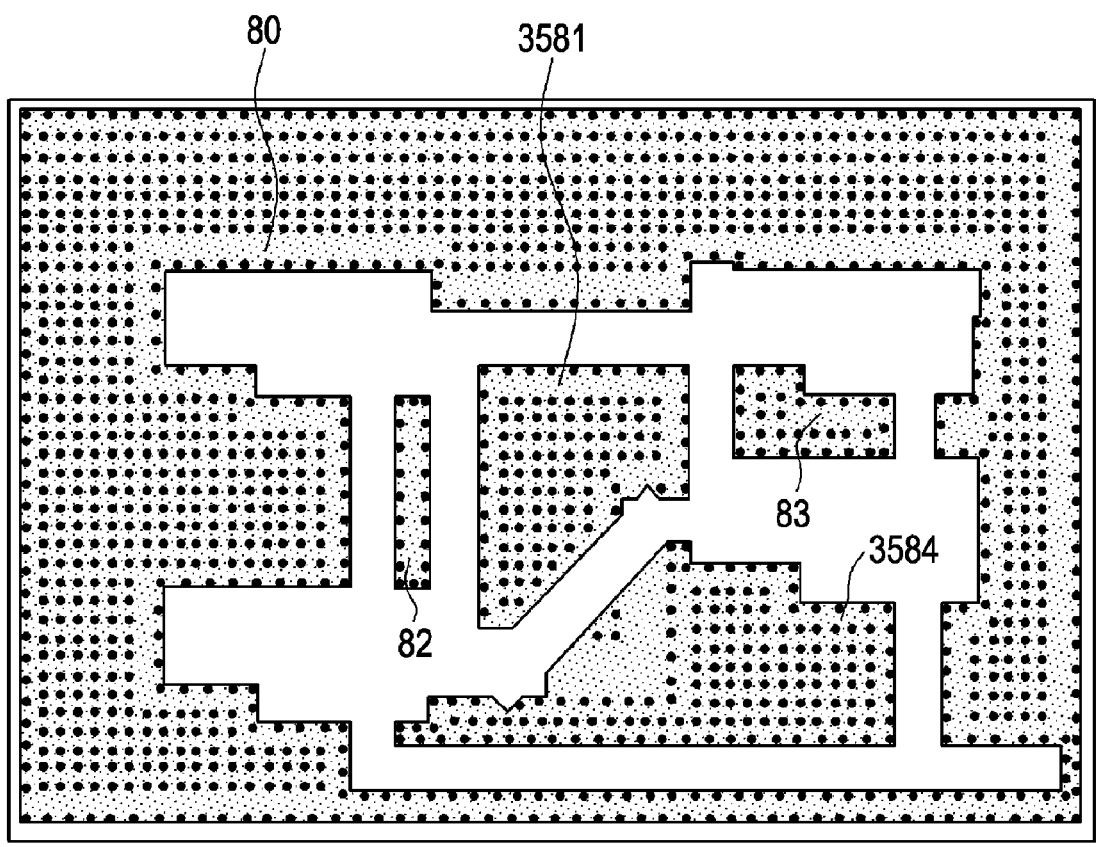
FIG. 39 shows a state after a processing in step S3300 according to the fifth embodiment.

FIG. 38 shows the GND overlapping conductive areas and an arrangement state of the GND vias after step S406 is ended. In step S407, the via automatic arrangement unit 23 obtains the position information and the shape information of the GND overlapping conductive area, and thereafter in step S3300, excludes GND vias 3600 out of the GND overlapping conductive area shown in FIG. 38. FIG. 39 shows an arrangement state of the GND vias after the GND vias out of the GND overlapping conductive areas are excluded. As shown in FIG. 39, the GND vias out of the GND overlapping conductive area are excluded.

Next, a processing operation of rearranging the GND vias in the GND overlapping conductive areas will be specifically described. Herein, in order to facilitate the description, a processing operation of rearranging the GND vias in the GND overlapping conductive area 3584 changed as shown in FIG. 38 will be described. In actuality, the rearrangement processing is similarly performed on the other GND overlapping conductive areas 80, 82, 83, and 3581. Also, by adding a flow for determining the changed GND overlapping conductive area, it is also possible to execute the rearrangement of the GND vias only on the changed GND overlapping conductive area.

Herein, similarly as in the first embodiment, a case will be described in which the peripheral edge part and the inner edge part, and the central part are divided, and the GND vias are rearranged in a stepwise fashion. Therefore, the via automatic arrangement conditions set in step S401 are the predetermined intervals L1, L2, and L3. First, an operation of rearranging the GND vias in the peripheral edge part and the inner edge part in the GND overlapping conductive area 3584 will be specifically described. Herein the area of the gray part shown in FIG. 40 is the GND overlapping conductive area 3584 in the enlarged view.

In step S3301, on the basis of the position information and the shape information of the GND overlapping conductive area 3584 obtained in step S407, the via automatic arrangement unit 23 extracts the respective construction points and calculates via arrangement positions 3800 in the vicinity of the respective construction points. For a method of calculating the via arrangement positions in the vicinity of the respective construction points, the same method as those in step S408 in the flow chart according to the first embodiment shown in FIG. 4 (see FIG. 11) may be used.

Figure 40:
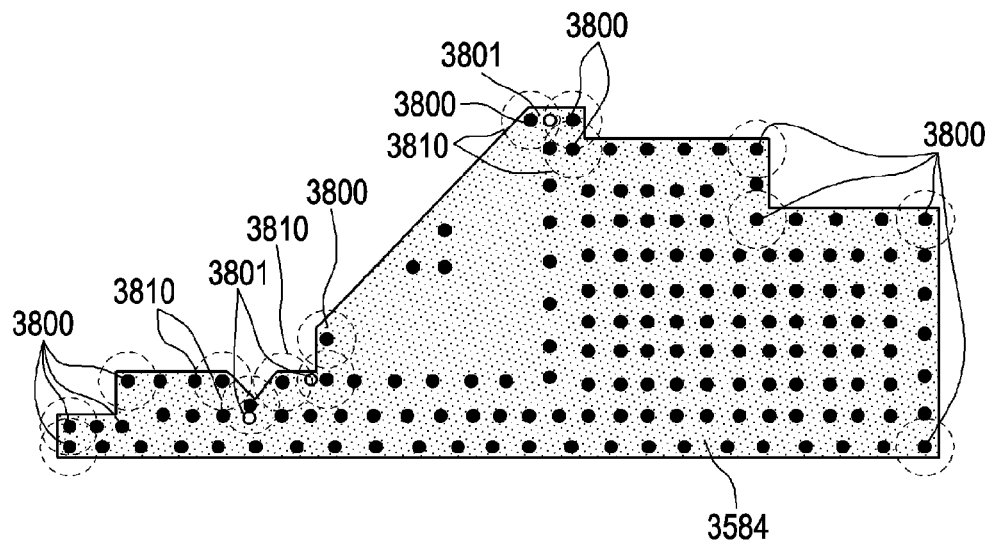
FIG. 40 is an explanatory diagram for describing a processing from steps S3301 to S3303 according to the fifth embodiment.

In step S3302, the via automatic arrangement unit 23 excludes the GND vias 3801 in the range of the predetermined interval L2 from the via arrangement positions 3800, that is, inside circle 3810s shown in FIG. 40.

Next, in step S3303, the via automatic arrangement unit 23 arranges the GND vias 3800 at the respective via arrangement positions 3800.

Next, in step S409, the via automatic arrangement unit 23 divides between the GND vias adjacent along the construction line of the GND overlapping conductive area 3584 among the GND vias arranged in step S3303 at an interval within the predetermined interval L2. At this time, for a division method, the method described in step S409 in the flow chart according to the first embodiment shown in FIG. 4 may be used. Herein, black circles 3900 shown in FIG. 41 represent respective positions divided in step S409.

Figure 41:
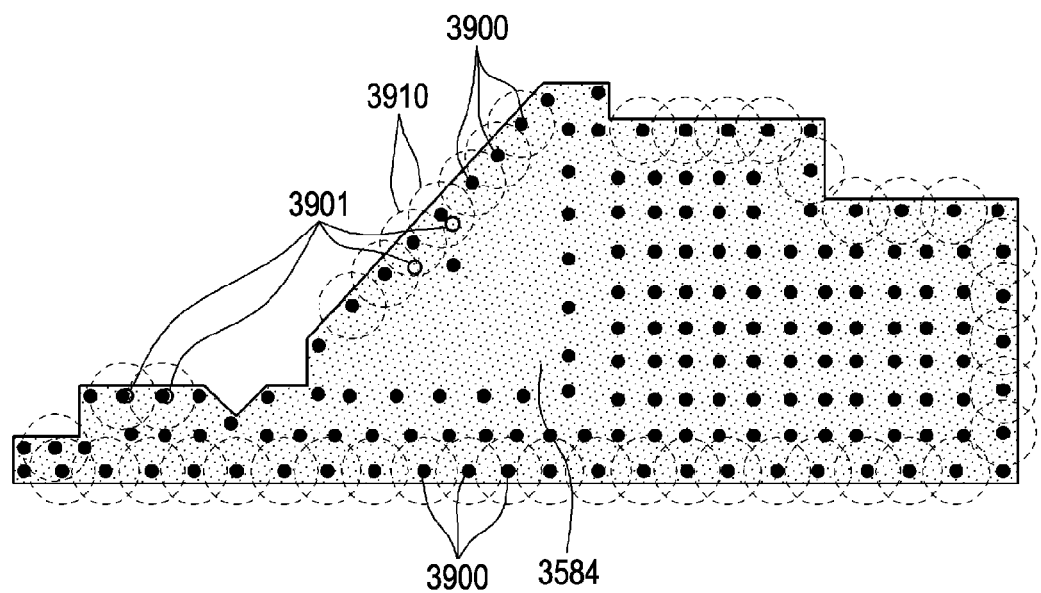
FIG. 41 is an explanatory diagram for describing a processing in steps S409 and S410 according to the fifth embodiment.

In step S3304, the via automatic arrangement unit 23 excludes the GND vias 3901 already arranged in the range of the predetermined interval L2 from the respective positions divided in step S409, that is, inside circles 3910 shown in FIG. 41. At this time, in FIG. 41, the GND vias 3901 completely overlapped with the positions 3900 along the construction line without a change between the GND overlapping conductive area 84 and the GND overlapping conductive area 3584 exist, and the via automatic arrangement unit 23 also excludes these GND vias 3901.

In step S410, the via automatic arrangement unit 23 arranges the GND vias 3900 at the respective positions divided in step S409. Herein, in order to facilitate visualization in the drawings, the same symbols are assigned to the positions 3900 divided in step S409 and the GND vias 3900 arranged in step S410.

Figure 42:
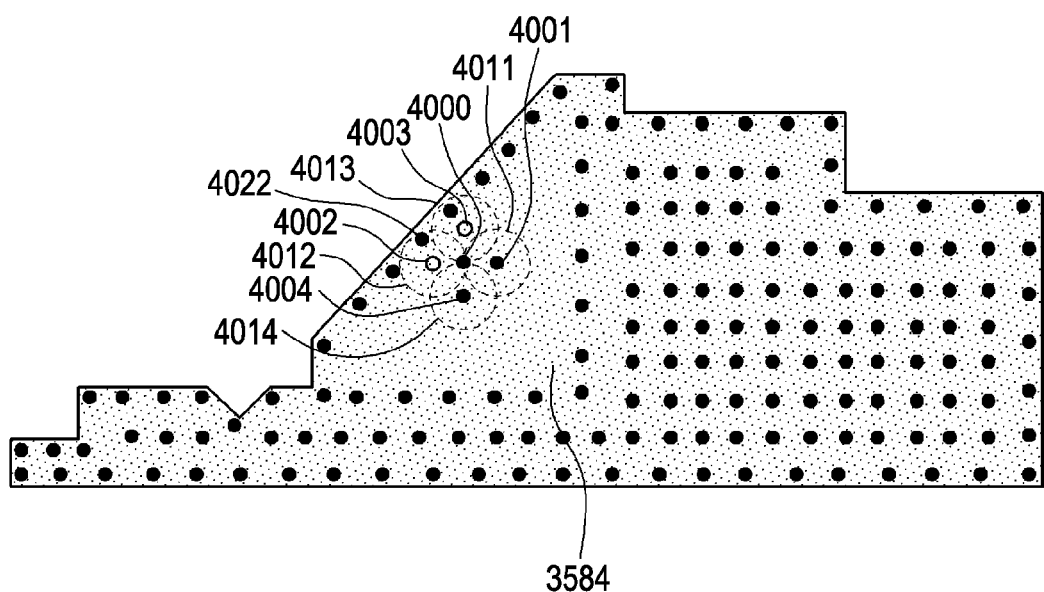
FIG. 42 is an explanatory diagram for describing a processing from steps S411 to S416 according to the fifth embodiment.

Next, an operation of arranging the GND vias in the central part of the GND overlapping conductive area 3584 will be specifically described. FIG. 42 shows an arrangement state of the GND vias in the central part of the GND overlapping conductive area 3584.

In step S411, the via automatic arrangement unit 23 selects one of the GND vias existing in the GND overlapping conductive area 3584. At this time, for example, it is supposed that the via automatic arrangement unit 23 selects a GND via 4000 shown in FIG. 42.

In step S412, the via automatic arrangement unit 23 calculates slide positions from the GND via 4000 through a method similar to that described in step S412 in the flow chart shown in FIG. 5 according to the first embodiment. That is, the via automatic arrangement unit 23 calculates the positions shifted in the respective positive and negative directions in the x axis direction and the y axis direction by a distance half of the predetermined interval L3 (L3/2). To be more specific, the positions shifted in the positive direction in the x axis direction, the negative direction in the x axis direction, the positive direction in the y axis direction, and the negative direction in the y axis direction are respectively slide positions 4001, 4002, 4003, and 4004 shown in FIG. 42.

In step S413, the via automatic arrangement unit 23 selects one of the slide positions 4001, 4002, 4003, and 4004. At this time, for example, the via automatic arrangement unit 23 selects the slide position 4001.

In step S414, the via automatic arrangement unit 23 determines that another GND via is not arranged within a range by a distance half of the predetermined interval L3 (L3/2) from the slide position 4001, that is, inside circles 4011 shown in FIG. 42, and the flow advances to the processing in step S415.

In step S415, the via automatic arrangement unit 23 determines that the slide position 4001 exists in the GND overlapping conductive area 3584, and the flow advances to the processing in step S416.

Therefore, in step S416, the via automatic arrangement unit 23 arranges the GND via 4001 at the slide position 4001. This processing corresponds to an automatic rearranging step.

In step S417, the via automatic arrangement unit 23 determines that the slide positions 4002, 4003, and 4004 for which the determination in step S414 is not yet performed exist, and the flow is returned to the processing in step S413.

In step S413, the via automatic arrangement unit 23 selects one of the slide positions 4002, 4003, and 4004. At this time, for example, the via automatic arrangement unit 23 selects the slide position 4002. In this case, in step S414, the via automatic arrangement unit 23 determines that the GND via 4022 is already arranged in a range of the distance L3/2 from the slide position 4002, that is, inside a circle 4012 shown in FIG. 42, and the flow advances to the processing in step S417. In step S417, the via automatic arrangement unit 23 determines that the slide positions 4003 and 4004 for which the determination in step S414 is not yet performed exist, and the flow is returned to the processing in step S413.

Subsequently, the via automatic arrangement unit 23 similarly repeatedly executes the processing in steps S413 to S417 until the remaining slide position does not exist in step S417. Then, the via automatic arrangement unit 23 does not arrange the GND via at the slide position 4003 but arranges the GND via 4004 at the slide position 4004. When the remaining slide position does not exist in step S417, the flow advances to the processing in step S418.

In step S418, the via automatic arrangement unit 23 determines that the GND via for which the determination in step S414 is not yet performed exists, and the flow is returned to the processing in step S411.

Subsequently, the via automatic arrangement unit 23 similarly repeatedly executes the processing in steps S411 to S418 until the remaining slide position for which the processing in step S412 is not performed does not exist in step S418. In step S418, when the GND via for which the processing in step S412 is not performed does not exist, the program is ended in step S419.

Figure 43:
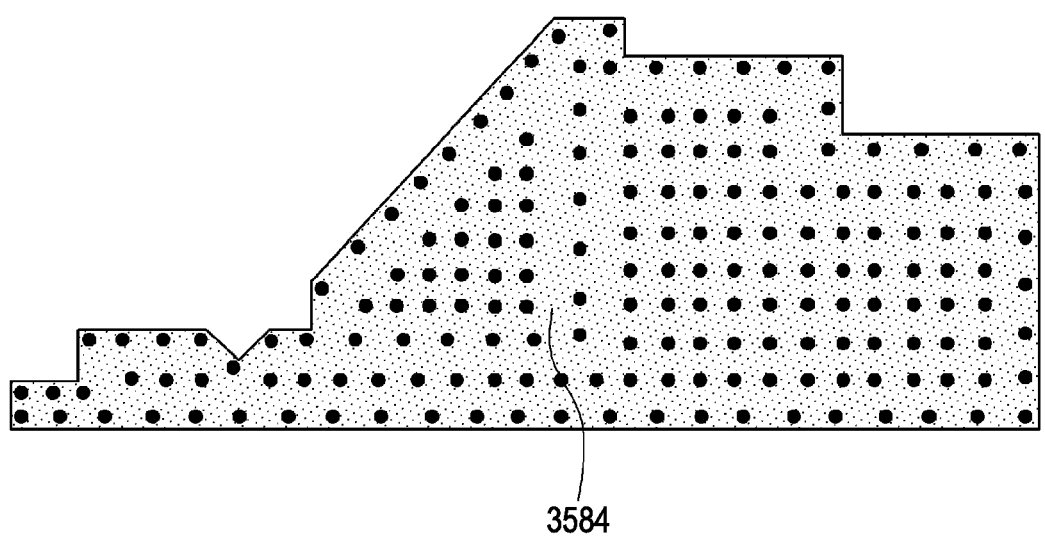
FIG. 43 shows an arrangement state of the GND vias after the processing according to the fifth embodiment.
Figure 44:
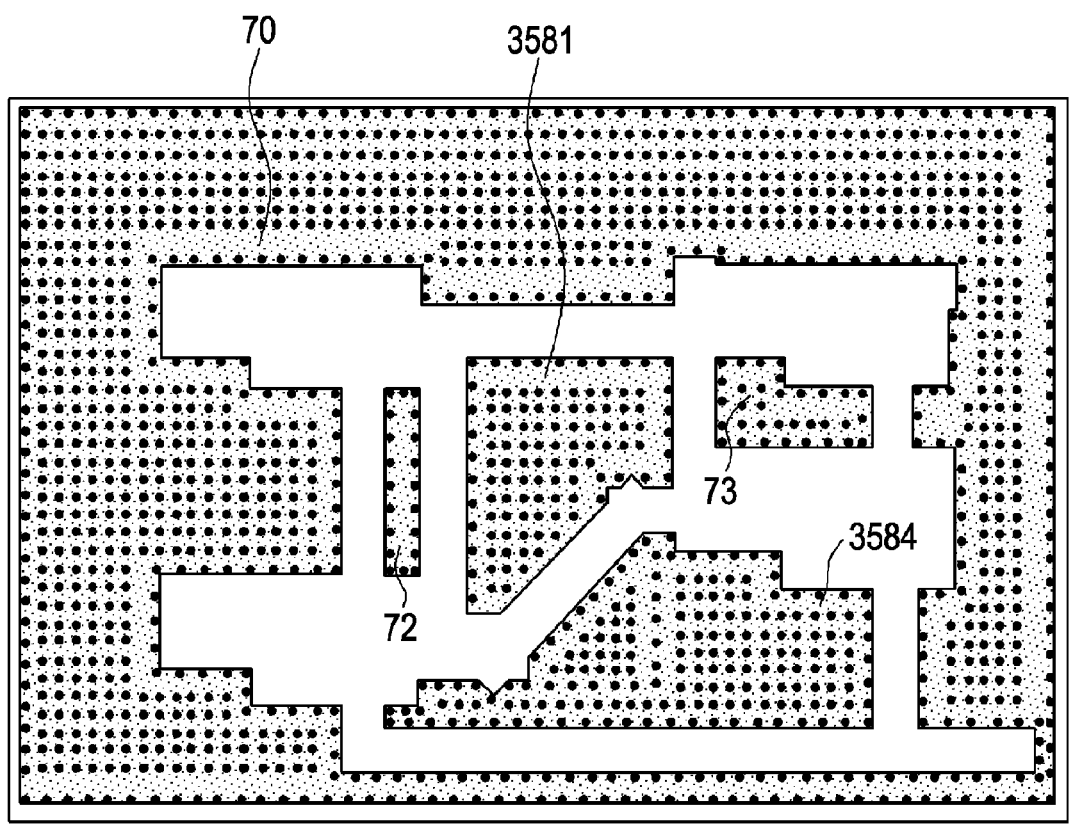
FIG. 44 shows the arrangement state of the GND vias after the processing according to the fifth embodiment.

FIG. 43 shows an arrangement state of the GND vias in the GND overlapping conductive area 3584 after the program is ended. Also, FIG. 44 shows an arrangement state of the GND vias and the GND overlapping conductive area of the entire printed circuit board after the program is ended. It is to be noted that in order to facilitate visualization in the drawings, the symbols are not assigned to all of the GND vias 3800 and the circles 3810 of FIG. 40, and the GND vias 3900, the circles 3910, and the GND vias 3901 of FIG. 41.

In this manner, according to the present embodiment, the case has been described in which when the GND vias are rearranged in the peripheral edge part and the inner edge part, all the GND vias are newly rearranged. However, along with the wiring change, a position where the vias are not arranged in the peripheral edge part and the inner edge part may be searched for or the changed construction line may be determined to arrange the GND vias only in a part of the changed GND overlapping conductive area.

Also, one each or a plurality of the GND vias each out of the GND overlapping conductive area may be correctively shifted to positions without the GND vias arranged where the arrangement is actually needed. This processing corresponds to an automatic correcting and arranging step. At this time, for a method of calculating a position where the arrangement is actually needed, the method described in step S3301 in the flow chart shown in FIG. 35 according to the present embodiment or in step S412 in the flow chart shown in FIG. 36 may be applied.

In addition, according to the present embodiment, the case has been described in which the GND overlapping conductive area is divided into the peripheral edge part and the inner edge part, and the central part, and the GND vias are rearranged in a stepwise fashion, but by the GND via arrangement method according to the third embodiment, the GND via can be rearranged without the division in a stepwise fashion.

According to the present embodiment, similarly as in the first embodiment, by allowing the user to set the shift distance in step S412 and the search range for the surrounding of the slide position in step S414, it is possible to realize the arrangement state of the GND vias desired by the user. With this setting, by decreasing the number of the GND vias to be arranged instead of arranging the GND vias within the predetermined interval, it is possible to carry out the arrangement of the GND vias in consideration of cost aspects. Furthermore, even in a case where the position information and the shape information of the GND overlapping conductive area are represented by inequations on the plane of coordinates or on the space, it is possible to carry out the automatic arrangement of the GND vias.

In this manner, according to the present embodiment, as shown in FIG. 44, even in a case where the GND overlapping conductive area is changed, it is possible to automatically rearrange the GND vias in a distance within the predetermined interval L1 from the end of the peripheral edge part and the inner edge part at an interval within the predetermined interval L2. Furthermore, it is possible to automatically rearrange the GND vias in the central part of the GND overlapping conductive area at an interval within the predetermined interval L3. It is to be noted that when the GND vias are arranged in actuality, the predetermined intervals L1, L2, and L3 according to the present embodiment may also vary in one circuit board depending on a situation within the value of L1, within the value of L2, and within the value of L3, respectively. It is however noted that by performing a setting that the values of L1, L2, and L3 are not varied, that is, the setting of the evenly spaced arrangement, the calculation of the variation in the values of L1, L2, and L3 depending on a situation becomes unnecessary, and an advantage is obtained that the program operation becomes faster.

Also, according to the present embodiment, the case has been described in which the GND vias on contact with all the conductive layers of the printed circuit board are automatically rearranged, but the GND vias on contact with a part of the conductive layers constructing the printed circuit board can also be automatically rearranged. In that case, the GND overlapping conductive area is extracted with respect to only the conductive layers on contact with the GND vias, and the GND vias may be rearranged in the GND overlapping conductive area similarly as in the above-mentioned embodiment. At that time, it is possible to efficiently arrange the GND vias by treating the GND vias on contact with the plurality of layers including the part of the relevant conductive layers as the GND vias already arranged.

According to the fifth embodiment, the case has been described in which the GND vias are automatically rearranged with respect to the change of the GND overlapping conductive area along with the wiring change. At this time, a method of rearranging the GND vias is a method of excluding the relevant GND vias by referring to only the position information and the shape information of the GND overlapping conductive area after the wiring change and additionally arranging the GND vias. According to the sixth embodiment, a case will be described in which the GND vias are extracted by referring to the changed shape of the signal wirings along with the wiring change, and thereafter, the GND vias are rearranged in the GND overlapping conductive area.

Figure 45:
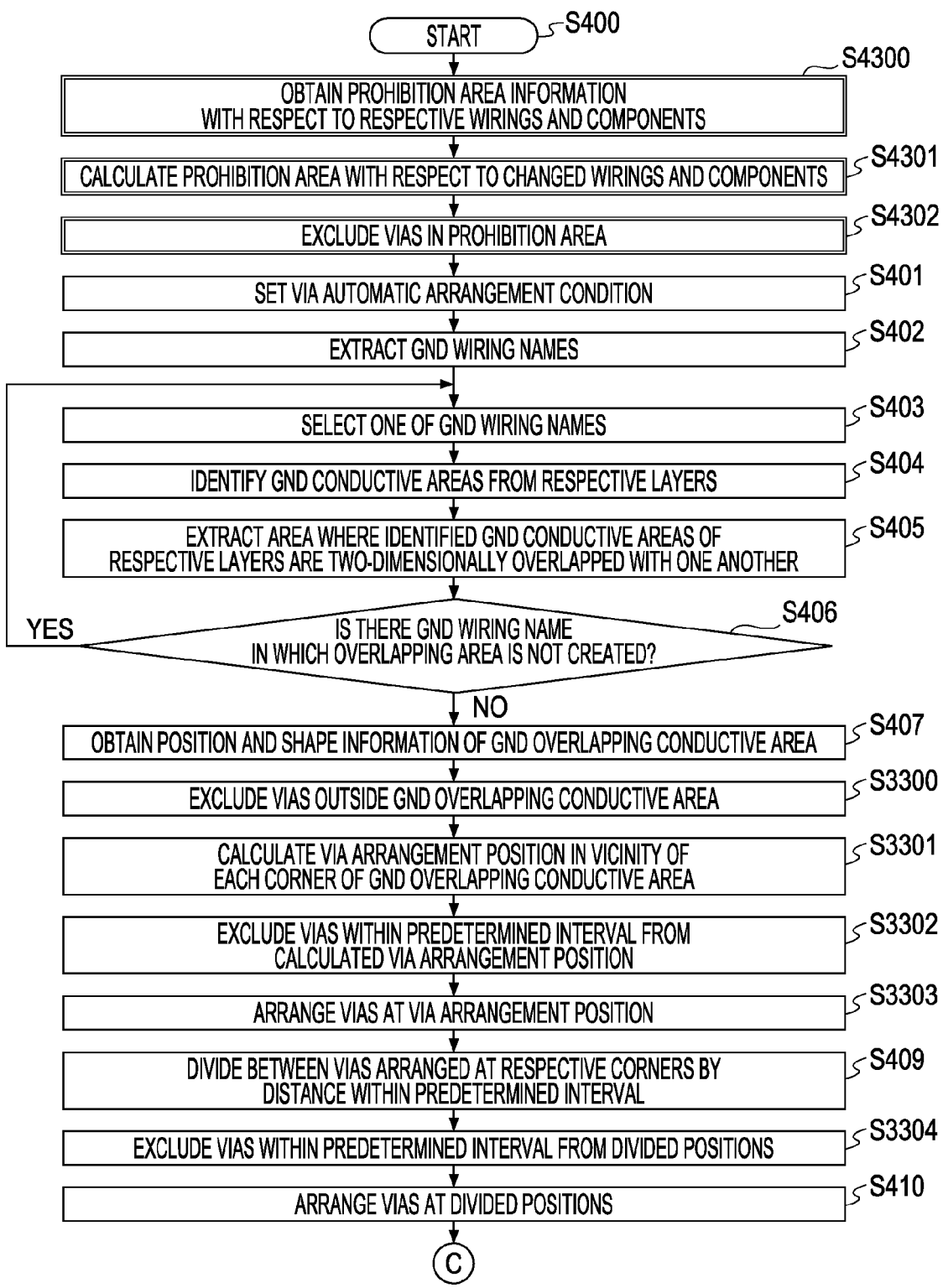
FIG. 45 is a flow chart for an example of the processing operation according to a sixth embodiment of the present invention.

FIG. 45 is a flow chart showing an example of a processing procedure performed by the printed circuit board design support apparatus according to the present embodiment on the basis of the printed circuit board design support program. Step C shown in FIG. 45 leads to a flow chart of step C shown in FIG. 36 according to the fifth embodiment. Hereinafter, the processing operation of the printed circuit board design support apparatus according to the present embodiment will be described with reference to the flow chart shown in FIG. 45 and the schematic diagrams shown in FIGS. 46 to 48. It is to be noted that for the drawings before the wiring change and after the wiring change, similarly as in the fifth embodiment, the schematic diagrams of FIGS. 6A to 6E and FIGS. 34A to 34E are respectively referred to.

First, the flow chart shown in FIG. 45 will be described in detail. Herein, the flow chart shown in FIG. 45 is obtained by adding steps S4300, S4301 and S4302 after the start of the flow chart in FIG. 35 according to the fifth embodiment shown. Therefore, only details of steps S4300, S4301 and S4302 will be described.

In step S4300, the external storage information extracting unit 21 obtains via arrangement prohibition area information with respect to the respective components and wirings arranged on the printed circuit board. This processing corresponds to a prohibition area information obtaining step. For a method of obtaining the via arrangement prohibition area information, it is preferably to use a method in which the via arrangement prohibition area information is included in the layout information 142, and the external storage information extracting unit 21 obtains via arrangement prohibition area information from the layout information 142 stored in the main storage apparatus 11. It is to be noted that the following method is also conceivable. Attribute information of types of the signal wirings and components is included in the layout information 142, and the external storage information extracting unit 21 extracts the attribute information of the types of the signal wirings and components from the layout information 142 stored in the main storage apparatus 11. Next, correspondence data D between the attribute information of types of the respective signal wirings and components and the via arrangement prohibition area information is previously accumulated in the external storage apparatus 14, and the external storage information extracting unit 21 stores the correspondence data D from the external storage apparatus 14 in the main storage apparatus 11. Then, the external storage information extracting unit 21 collates the attribute information of the types of the signal wirings and components with the correspondence data D and obtains the via arrangement prohibition area information assigned to the relevant attribute information of the types of the signal wirings and components from the correspondence data D.

Next, in step S4301, while referring to the layout information 142 and via arrangement prohibition area information stored in the main storage apparatus 11, the diagram computation unit 22 calculates a via arrangement prohibition area with respect to the respective wirings or components changed. This processing corresponds to a prohibition area calculating step. For example, in a case where a signal wiring E is changed and the via arrangement prohibition area information with respect to the signal wiring E indicates a range of a distance L6A from the conductive area of the signal wiring E, a range within the distance L6A from the conductive area of the signal wiring E after the change is calculated as the via arrangement prohibition area. Also, for example, in a case where a arrangement position of a component F is changed and in a case where the via arrangement prohibition area information of the component F indicates a range of a distance L6B for the profile of the component F, the range within the distance L6B from the profile of the component F at the position after the change is calculated as the via arrangement prohibition area.

On the other hand, it is supposed that the via arrangement prohibition area information of the component F indicates a range of a distance L6C from a conductive area for electrically connecting the respective pins (hereinafter, referred to as pin pad) of the component F with the conductive area of the printed circuit board. In this case, the range within the distance L6C from the pin pad of the respective pins of the component F after the change is calculated as the via arrangement prohibition area.

Furthermore, in a case where the via arrangement prohibition area information of the component F is diagram information F5 constructed by the construction point which can be calculated while using the component arrangement position of the component F as the reference, the via arrangement prohibition area is calculated from the arrangement position of the component F and the diagram information F5.

In addition, for example, it is supposed that a position of a signal wiring via G is changed, and the via arrangement prohibition area of the signal wiring via G indicates a range of a distance L6D from a conductive area provided for connecting well electrically (hereinafter, referred to as via pad) with the signal wiring via G. In that case, a range within the distance L6D from a via pad of the signal wiring via G after the change is calculated as the via arrangement prohibition area.

When the via arrangement prohibition area with respect to the respective wirings, components, and the like after the change is calculated in step S4301, In step S4302, the via automatic arrangement unit 23 refers to the layout information 142 stored in the main storage apparatus 11 to exclude the GND vias included in the via arrangement prohibition area. This processing corresponds to an interlayer connection member excluding step.

The above is an example of the processing procedure of a part of the printed circuit board design support apparatus according to the present embodiment.

It is to be noted that in the flow chart shown in FIG. 45, the processing in steps S4300 to S4302 is executed immediately after the flow chart is started, that is, immediately after step S400. However, a similar result can be obtained even when the processing in steps S4300 to S4302 is executed immediately after step S406.

In addition, for measures for the change in the high-speed interconnection, the processing in steps S1600 to S1602 shown in FIG. 17 may be added between steps S3300 and S3301. In this case, the high-speed interconnection via selected in step S1600 may only be the changed high-speed interconnection via.

Figure 46:
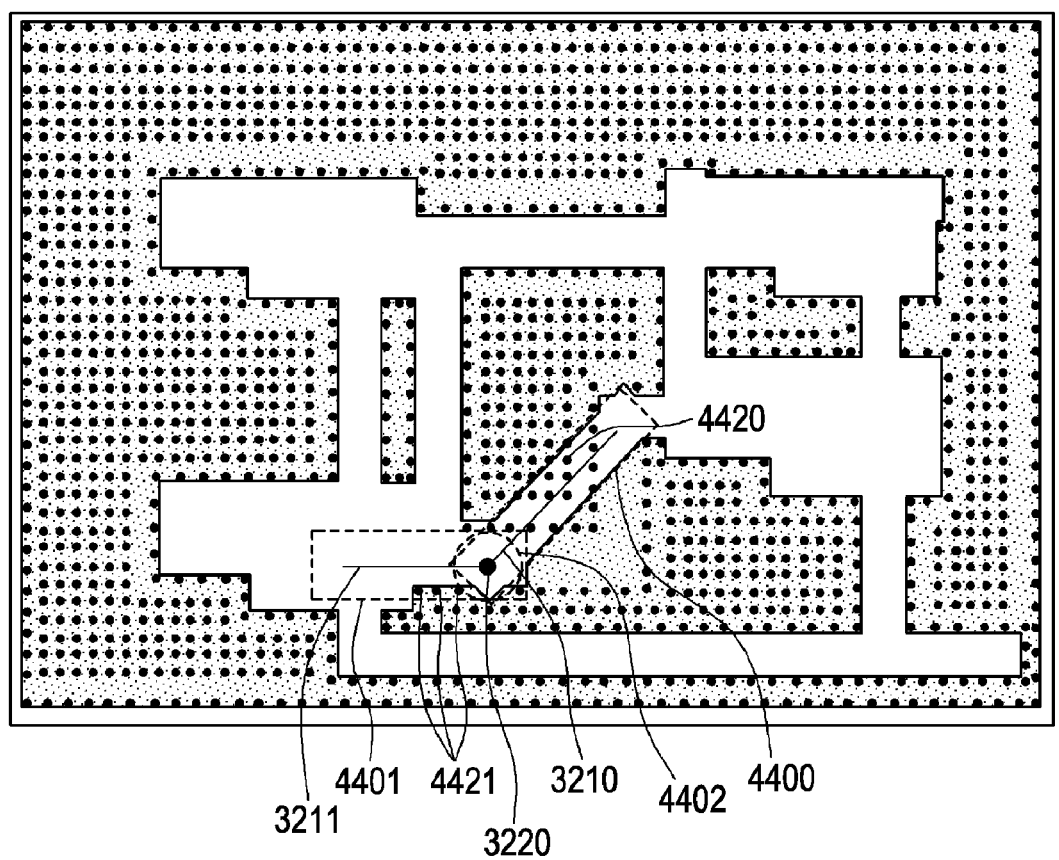
FIG. 46 is an explanatory diagram for describing a processing in step S4301 according to the sixth embodiment.
Figure 47:
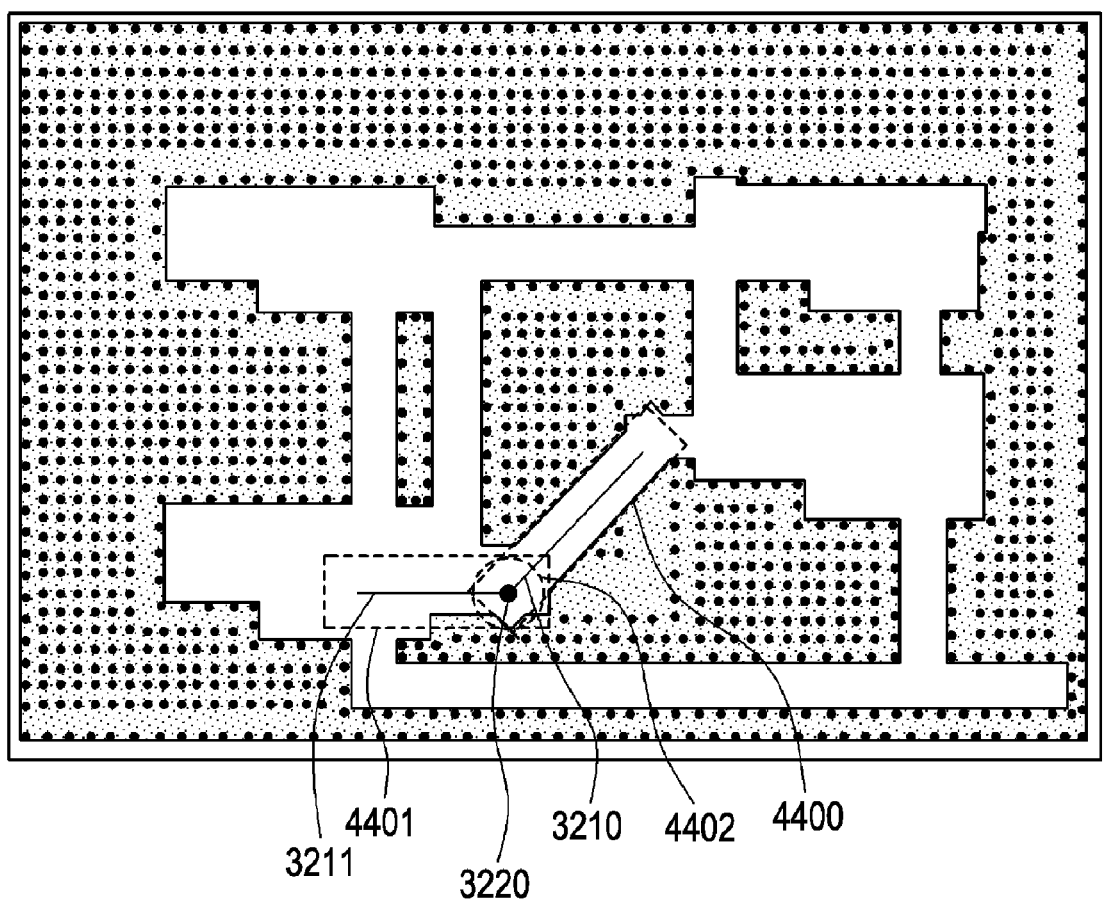
FIG. 47 shows a state after a processing in step S4302 according to the sixth embodiment.
Figure 48:
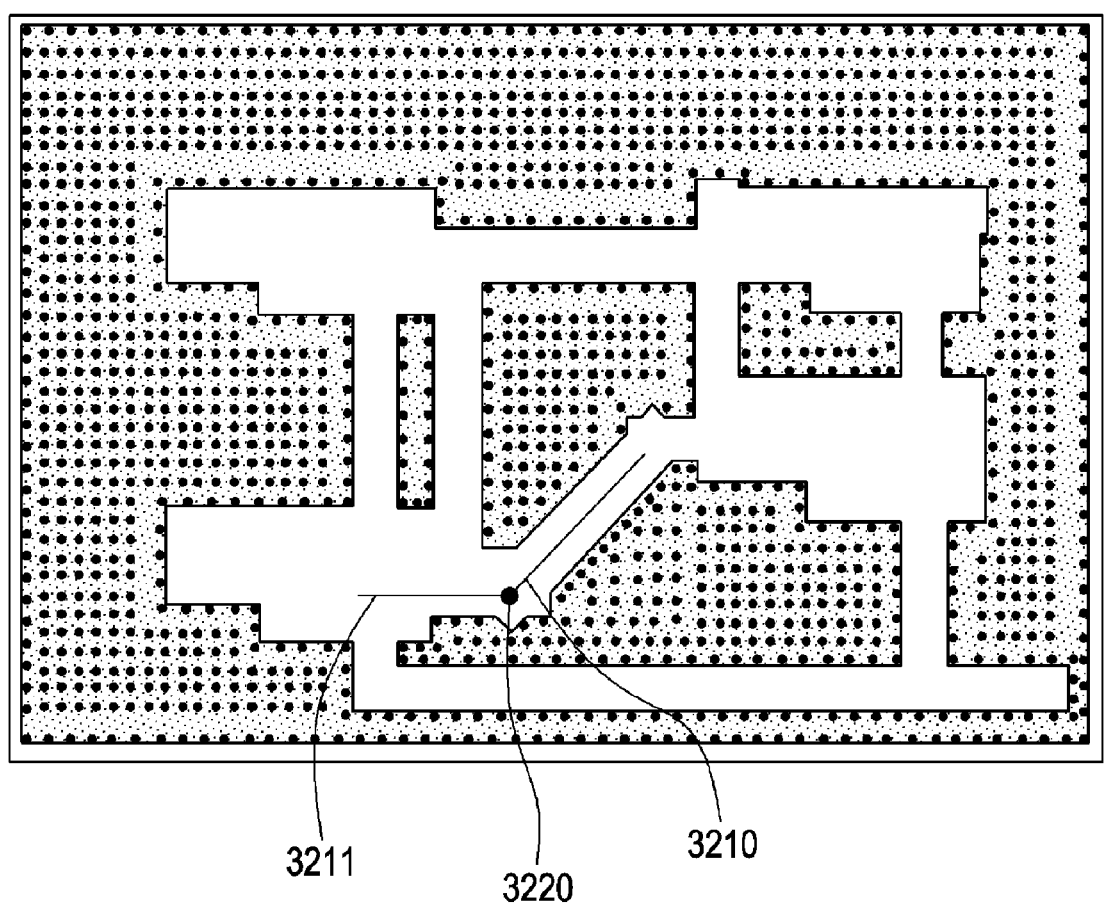
FIG. 48 shows an arrangement state of the GND vias after the processing according to the sixth embodiment.

Next, with reference to schematic diagrams of FIGS. 46 to 48, a processing operation of the printed circuit board design support apparatus according to the present embodiment will be specifically described. Herein, in order to facilitate the understanding of the description, the processing in steps S401 to S406 is executed after the program start, and the processing in the next step S4300 to S4302 is executed. After that, the processing from step S407 to the program end is executed.

When the processing is started from step S400 and a series of the step group up to step S406 is repeatedly executed, the diagram computation unit 22 extracts the GND overlapping conductive areas 80, 82, 83, 3581, and 3584 shown in FIG. 38 described according to the fifth embodiment. In addition to FIG. 38, FIG. 46 shows the changed signal wirings 3210 and 3211 and the changed signal wiring via 3220.

In step S4300, the external storage information extracting unit 21 obtains the via arrangement prohibition area information on the signal wirings 3210 and 3211 and the signal wiring via 3220. At this time, for example, it is supposed that the via arrangement prohibition area information on the signal wirings 3210 and 3211 is a range of the distance L6A from the conductive area of the signal wiring, and the via arrangement prohibition area information of the signal wiring via 3220 is a range in the distance L6D from the via pad.

In step S4301, the diagram computation unit 22 calculates ranges of the distance L6A from the conductive areas of the respective lines of the signal wiring 3210 and the signal wiring 3211, that is, a rectangle 4400 and a rectangle 4401 represented by the dotted lines respectively shown in FIG. 46. Also, the diagram computation unit 22 calculates a range of the distance L6D from the via pad of the signal wiring via 3220, that is, a circle 4402 shown in FIG. 46 represented by the dotted line.

In step S4302, the via automatic arrangement unit 23 excludes GND vias included in the rectangles 4400 and 4401 and the circle 4402, that is, GND vias 4420 included in the rectangle 4400 and GND vias 4421 included in the rectangle 4401. It is to be noted that in order to facilitate visualization in the drawings, the symbols are not assigned to all the GND vias 4420 and 4421. FIG. 47 shows the GND overlapping conductive area and arrangement states of the GND vias after the GND vias 4420 and the GND vias 4421 in the via arrangement prohibition area are excluded. It is to be noted that the processing in steps S407 to S419 is similar to the description according to the fifth embodiment, and a description thereof will be omitted. FIG. 48 shows the GND overlapping conductive area and arrangement states of the GND vias after the program is ended.

According to the present embodiment, similarly as in the fifth embodiment, even in a case where the shape of the GND overlapping conductive area is changed along with the wiring change of the printed circuit board, it is possible to automatically rearrange the GND vias. It is to be noted that according to the present embodiment, the case has been described in which after the wiring change is ended all through, the GND vias in the via arrangement prohibition area are excluded. However, each time the wiring and component are rearranged, the calculation of the via arrangement prohibition area, the exclusion of the GND vias in the via arrangement prohibition area, and the rearrangement of the GND vias in the GND overlapping conductive area may also be performed. With this configuration, while changing the wirings, the user can confirm the rearrangement state of the GND vias. It is however noted that in a case where the rearrangement of the GND vias is executed at the time of each wiring change, a diagram calculation processing is necessary each time the position and direction of the wiring are changed, which may also disturb the user's smooth operation in some cases. Therefore, herein, a case will be represented in which after the wiring change is ended all through, the GND vias in the via arrangement prohibition area are excluded.

Also, according to the present embodiment, the case has been described in which the via arrangement prohibition area with respect to the line is set as rectangular, but the corner of the via arrangement prohibition area with respect to the line may be rounded, and the surrounding areas at the starting point and the ending point of the line may also be set in a circular pattern. Also, the via arrangement prohibition area with respect to the via pad is set as a circle, but an ellipse or rectangle may also be used instead. In this manner, the shape of the via arrangement prohibition area information with respect to the respective wirings and components can take various shapes.

In addition, according to the present embodiment, according to the present embodiment, the case has been described in which the GND vias on contact with all the conductive layers of the printed circuit board are automatically arranged. However, it is also possible to automatically arrange the GND vias on contact with a part of the conductive layers constituting the printed circuit board. In that case, the overlapping conductive area only with respect to the conductive layer on contact with the GND via is extracted, and the GND vias may be arranged in the relevant overlapping conductive area similarly as in the present embodiment. At that time, it is possible to efficiently arrange the GND vias by treating the GND vias on contact with the plurality of layers including the part of the relevant conductive layers as the GND vias already arranged.

According to the first to third embodiments, the case has been described in which the GND vias are automatically arranged with respect to the GND overlapping conductive area. According to the fifth and sixth embodiments, the case has been described in which in a case where the shape of the GND overlapping conductive area is changed along with the wiring change or the like, the GND vias are automatically rearranged.

According to the seventh embodiment, a printed circuit board design apparatus will be described which is configured to automatically arrange the GND vias before arrangement of the components and wiring are carried out and exclude the GND vias which should be excluded along with the arrangement of the components and the wiring.

Figure 49:
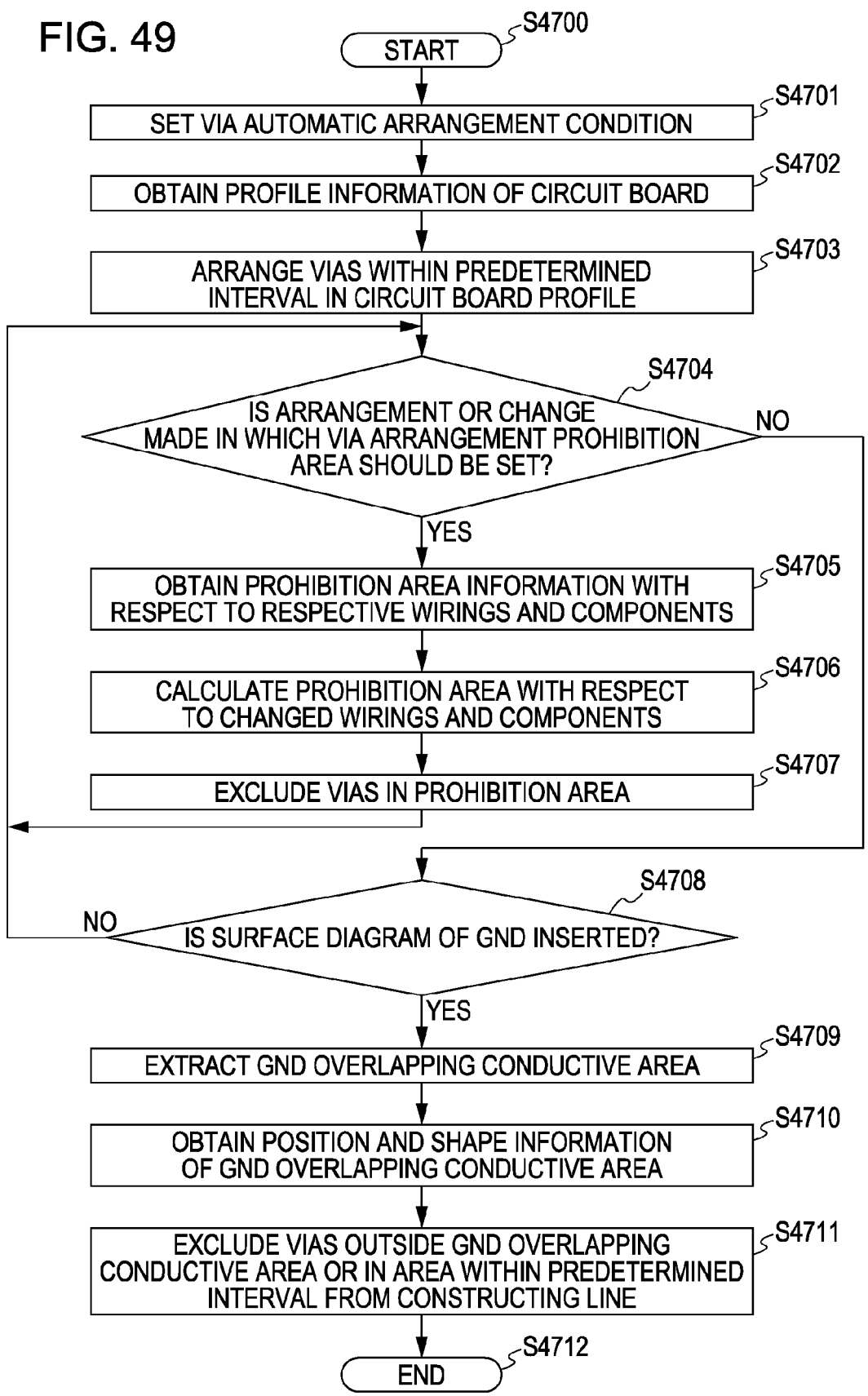
FIG. 49 is a flow chart for an example of the processing operation according to a seventh embodiment of the present invention.
Figure 50A:
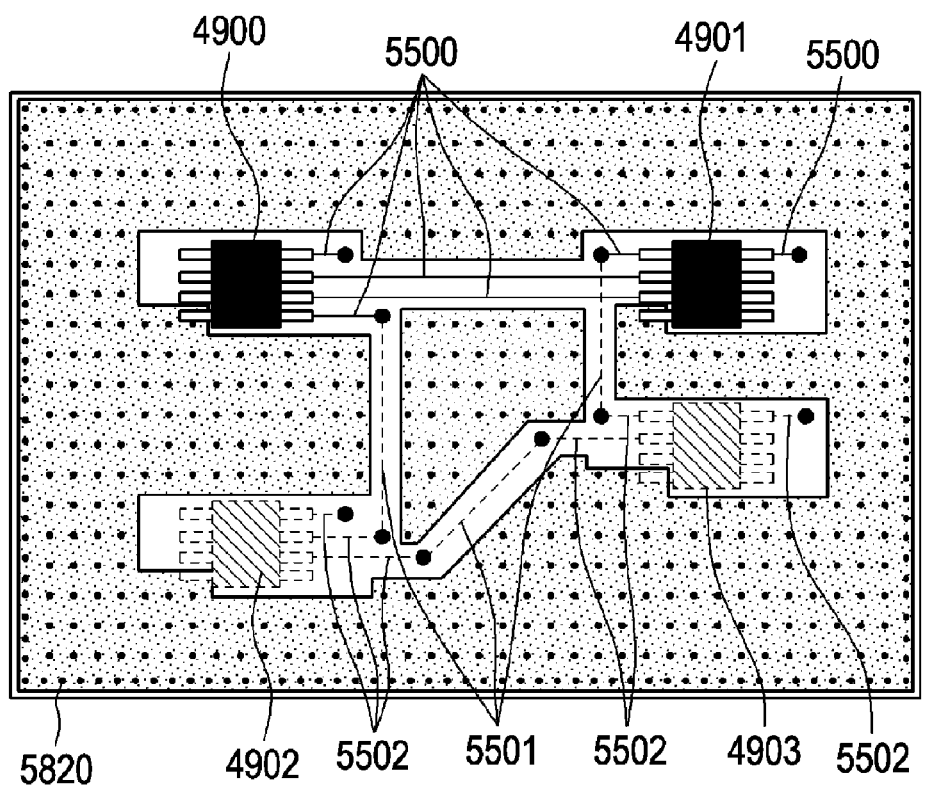
FIGS. 50A and 50B show arrangement states of the GND vias after the processing according to the seventh embodiment.
Figure 50B:
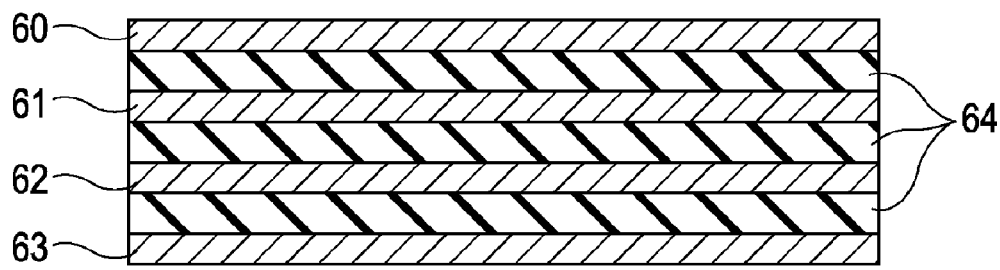

FIG. 49 is a flow chart showing a example of a processing procedure performed by the printed circuit board design support apparatus according to the present embodiment on the basis of the printed circuit board design support program. Hereinafter, the processing operation of the printed circuit board design support apparatus according to the present embodiment will be described with reference to the flow chart shown in FIG. 49 the schematic diagrams shown in FIGS. 50A and 50B to FIGS. 59A and 59B. FIGS. 50A and 50B show states of the printed circuit board after carrying out a design on the printed circuit board according to the present embodiment. Here, the arrangement of the components and the wiring state shown in FIGS. 50A and 50B will be described. The arrangement of the components and the wiring state in the schematic diagrams of the printed circuit board shown in FIGS. 50A and 50B are matched with the arrangement of the components and the wiring state after the wirings represented by bold solid lines in a layer 62 are excluded from the schematic diagrams shown in FIG. 34A to 34E. Herein, in order to improve the visibility of the drawings shown in FIGS. 50A and 50B, the bold solid lines are excluded. Also, the gray areas shown in FIGS. 50A and 50B represent the GND overlapping conductive areas.

Next, the flow chart shown in FIG. 49 will be described in detail.

First, the processings in steps S4700 and S4701 are respectively similar to the processing in steps S400 and S401 in the flow chart shown in FIG. 4 described according to the first embodiment, and a description thereof will be omitted. It is however noted that the via automatic arrangement conditions according to the present embodiment are the same as the predetermined intervals L1, L2, and L3 described according to the first embodiment, and these conditions are supposed to be applied by replacing the GND overlapping conductive area with the circuit board profile. Also, the via automatic addition conditions include, in addition to the above-mentioned predetermined intervals L1, L2, and L3, a via arrangement prohibition distance L7 from the peripheral edge of the GND overlapping conductive area (hereinafter, referred to as prohibition distance L7). Hereinafter, the processing performed in steps S4702 to S4708 is a processing performed by the via automatic arrangement unit 23 while the via automatic arrangement unit 23 reads out the layout information 142 stored in the main storage apparatus 11.

In step S4702, the via automatic arrangement unit 23 obtains the position information and the shape information of the profile of the printed circuit board.

In step S4703, the via automatic arrangement unit 23 arranges the GND vias in the circuit board profile within the predetermined interval. In step S4703, as a method of arranging the GND vias within the predetermined interval, the method may be applied by replacing the GND overlapping conductive area according to the first or fourth embodiment described above with the inner part of the profile of the circuit board according to the present embodiment.

In step S4704, after the via automatic arrangement unit 23 arranges the GND vias in step S4703, each time the components and the wirings are added or changed by the user, that is, each time the layout information 142 is changed, it is determined whether the via arrangement prohibition area should be created. In a case where the via arrangement prohibition area should be created, the processing in steps S4705, S4706, and S4707 is executed, and the flow is returned to the processing in step S4704 again. In a case where the via arrangement prohibition area is not necessarily created, the flow advances to the processing in step S4708. At this time, in steps S4705, S4706, and S4707, the processings are respectively executed similar to those in steps S4300, S4301, and S4302 shown in FIG. 45 described according to the sixth embodiment. Therefore, a detail description of the processing in steps S4705, S4706, or S4707 will be omitted.

In step S4708, the diagram computation unit 22 determines whether the surface diagram of the GND conductive area has been inserted (whether the surface insertion is performed). In a case where the surface diagram of the GND conductive area is inserted, the flow advances to the processing in step S4709. In a case where the surface diagram of the GND conductive area is not inserted and the component arrangement or the wiring change is performed, the flow is returned to the processing in step S4704.

In step S4709, the diagram computation unit 22 reads out the layout information 142 stored in the main storage apparatus 11 to extract the GND overlapping conductive area. For a method of extracting the GND overlapping conductive area in step S4709, the method in steps S402 to S406 in the flow chart according to the first embodiment shown in FIG. 4 may be applied.

Hereinafter, the processing in steps S4710 to S4712 is a processing performed while the via automatic arrangement unit 23 reads out the layout information 142 stored in the main storage apparatus 11.

In step S4710, the via automatic arrangement unit 23 obtains the position information and the shape information of the extracted GND overlapping conductive area.

Next, in step S4711, the via automatic arrangement unit 23 excludes the GND vias arranged out of the GND overlapping conductive area or in a range within the predetermined distance L7 from the peripheral edge and the inner edge of the GND overlapping conductive area. In step S4712, the processing program 141 is ended.

The above is the detailed description on the flow chart shown in FIG. 49 according to the present embodiment. According to the present embodiment, the case has been described in which the GND vias are arranged in the entire GND overlapping conductive area of the printed circuit board within the equal interval. However, the peripheral edge part, the inner edge part, and the central part of the GND overlapping conductive area may be divided and arranged. In that case, steps S3301 to S410 in the flow chart shown in FIG. 35 described according to the fifth embodiment are added after step S4711 in the flow chart shown in FIG. 49, and the GND vias may be rearranged in the GND overlapping conductive area.

In addition, similarly as in the second embodiment, in a case where the GND vias are arranged in the vicinity of the high-speed interconnection via, the processing in steps S1600 to S1602 in the flow chart shown in FIG. 17 may be added between steps S4710 and step S4711.

Furthermore, the wirings or the like may be changed in some cases after the GND surface insertion in step S4708. In this case, each time the wirings or the like is changed similarly as in the sixth embodiment, the via arrangement prohibition area is created in accordance with the change, and the processing for excluding the GND vias may be performed.

Hereinafter, with reference to schematic diagrams of FIGS. 50A and 50B to FIGS. 59A and 59B, a processing operation according to the present embodiment will be specifically described. When the processing in steps S4700 to S4703 is executed, the GND vias are respectively arranged in the peripheral edge part and the inner edge part, and the central part of the circuit board profile within the predetermined interval. This specific operation can be realized by replacing the GND overlapping conductive area with the circuit board profile with regard to the processing in steps S407 to S418 in the flow charts shown in FIGS. 4 and 5 described according to the first embodiment. Also, the processing in steps S2600 to S2609 in the flow chart shown in FIG. 28 described according to the fourth embodiment can be realized by replacing the GND overlapping conductive area with the circuit board profile.

Figure 51:
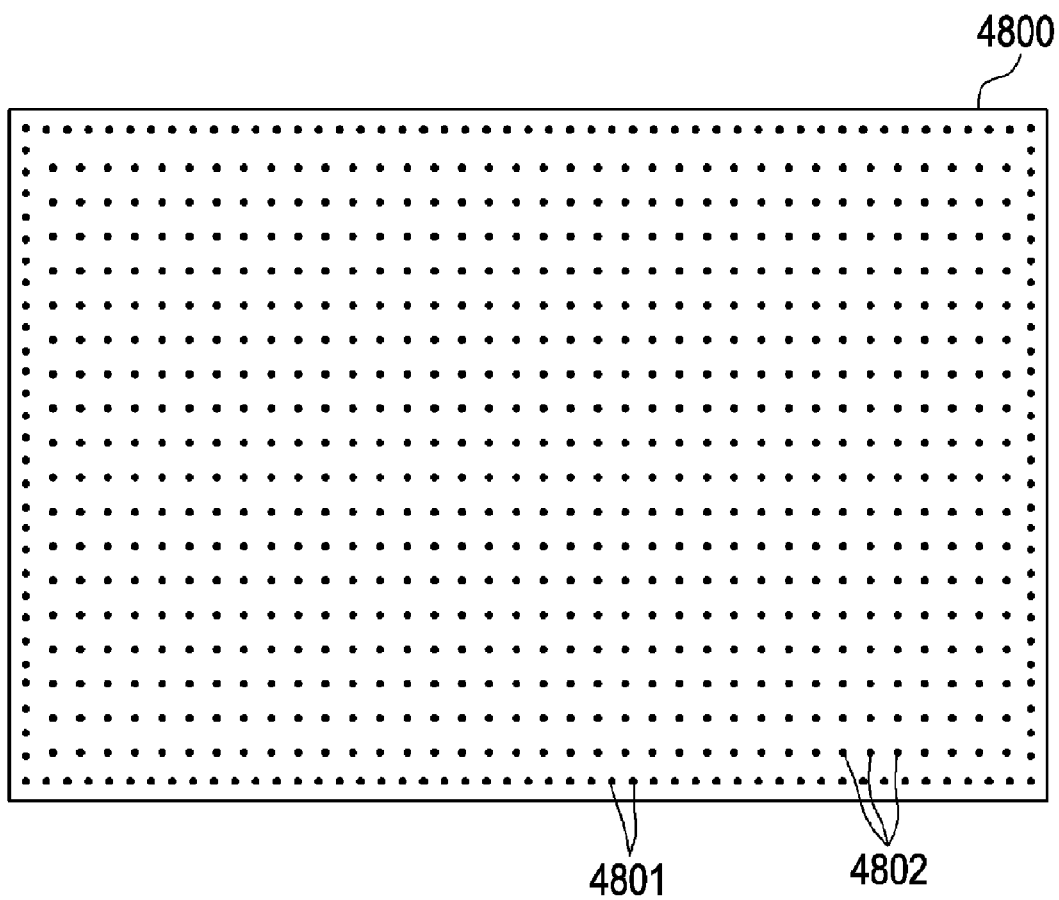
FIG. 51 shows a state after a processing in step S4703 according to the seventh embodiment.

It is to be noted that in a case where the GND vias are arranged in the entire circuit board profile within the predetermined interval without dividing the peripheral edge part and the inner edge part, and the central part, the processing in steps S407 to S418 shown in FIGS. 23 and 24 according to the third embodiment can be realized by replacing the GND overlapping conductive area with the circuit board profile. Herein, FIG. 51 shows an arrangement state of the GND vias of the printed circuit board after the GND vias are arranged in the circuit board profile. As shown in FIG. 51, GND vias 4801 are arranged in the peripheral edge part in a circuit board profile 4800 within the predetermined interval (L2), and GND vias 4802 are arranged in the central part within the predetermined interval (L3).

Figure 52A:
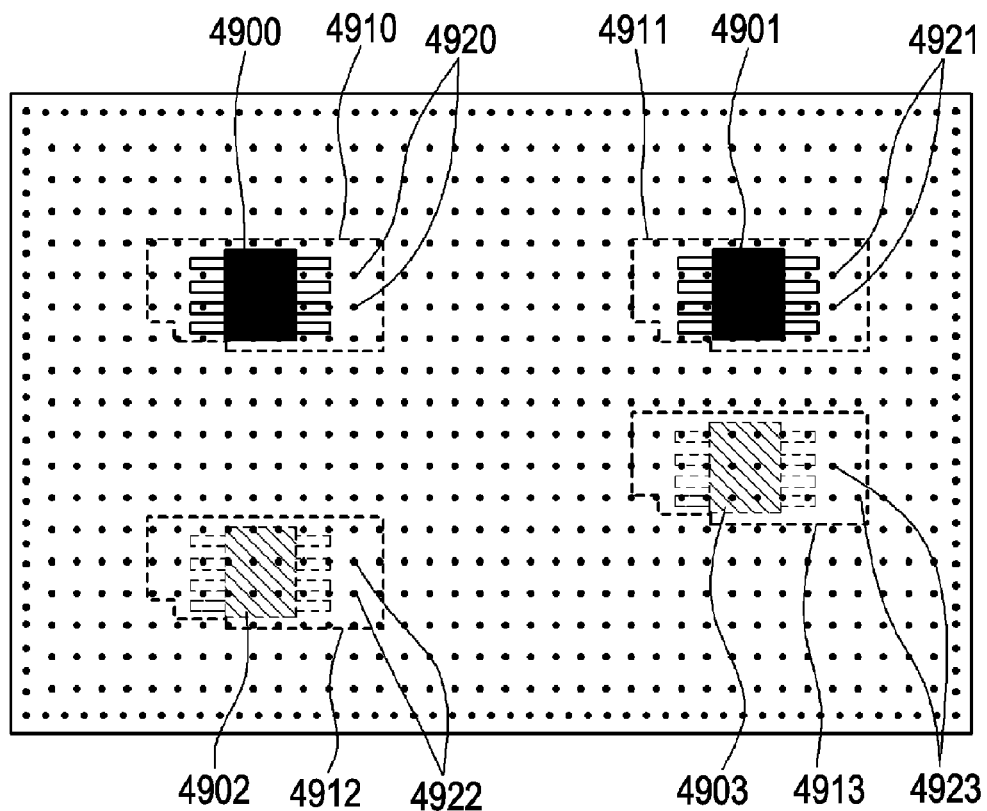
FIGS. 52A and 52B are explanatory diagrams for describing a processing in step S4704 according to the seventh embodiment.
Figure 52B:
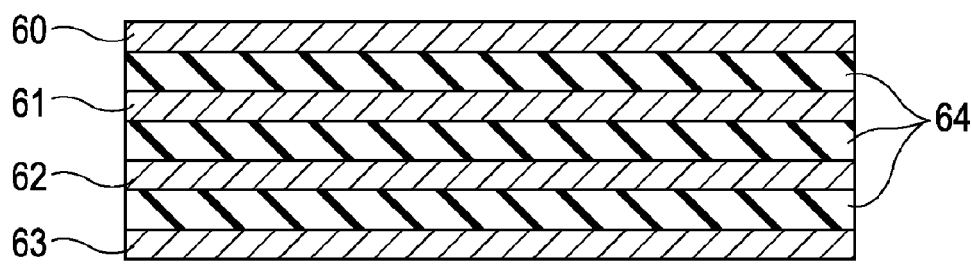

The processing in step S4704 and subsequent steps is executed while the user arranges the components, the wirings, and the like on the printed circuit board. For example, as shown in FIG. 52A, in a case where a component 4900 (component having the via arrangement prohibition area) is arranged, in step S4704, the via automatic arrangement unit 23 determines that an additional arrangement has been made with which the via arrangement prohibition area should be created. Then, by executing steps S4705 and S4706, the via arrangement prohibition areas 4910 surrounded by the dotted lines shown in FIG. 52A are calculated. Herein, the case has been described in which the via arrangement prohibition area information of the component 4900 is represented by the diagram shape constructed by the construction points which can be calculated by using coordinates of the arrangement position of the component 4900 as the reference.

In step S4707, the via automatic arrangement unit 23 excludes the GND vias 4920 included in the via arrangement prohibition area 4910. Similarly, each time components 4901, 4902, and 4903 are arranged, the processing in steps S4705 to S4707 is executed, and GND vias 4921, 4922, and 4923 included in the respectively calculated via arrangement prohibition area 4911, 4912, 4913 are excluded.

Figure 53A:
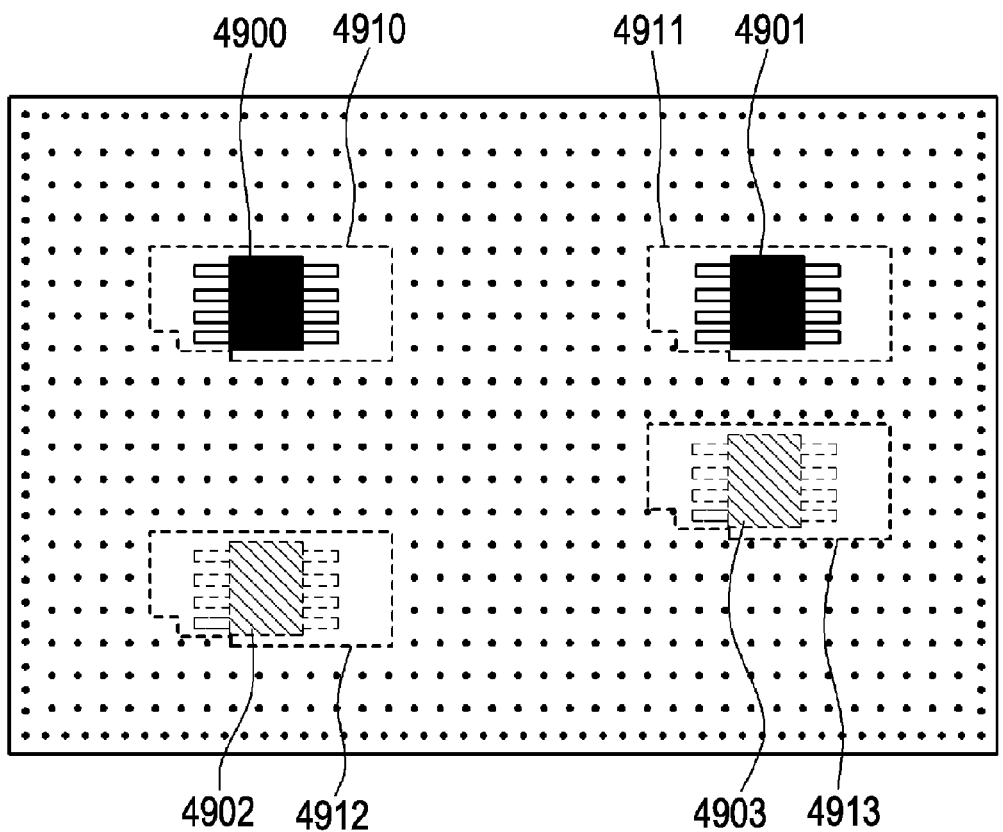
FIGS. 53A and 53B show states after a processing in step S4707 according to the seventh embodiment.
Figure 53B:
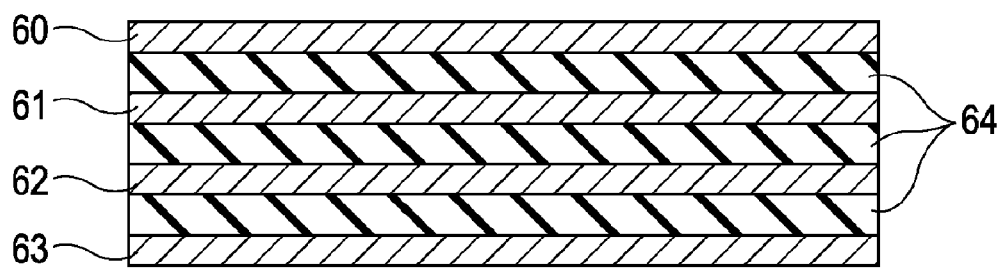
Figure 54A:
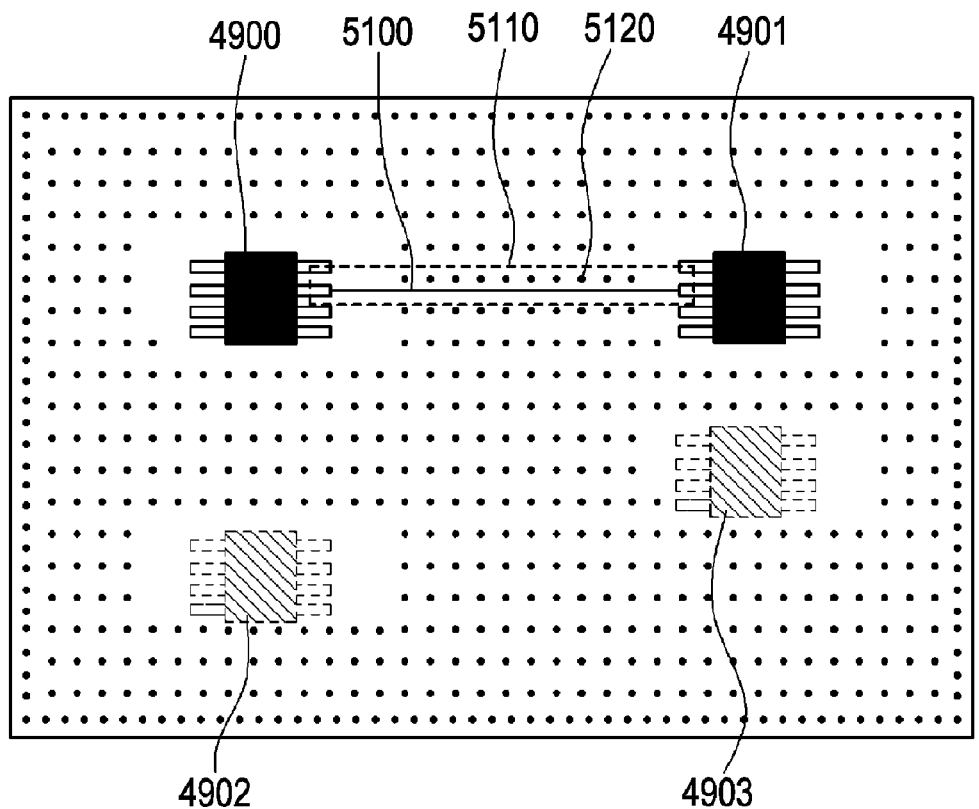
FIGS. 54A and 54B are explanatory diagrams for describing a processing in step S4706 according to the seventh embodiment.
Figure 54B:
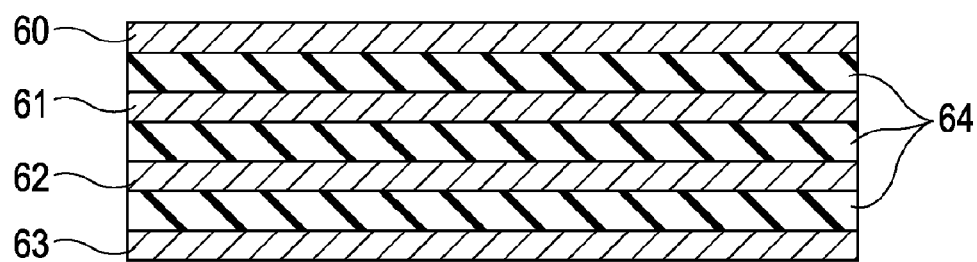
Figure 55A:
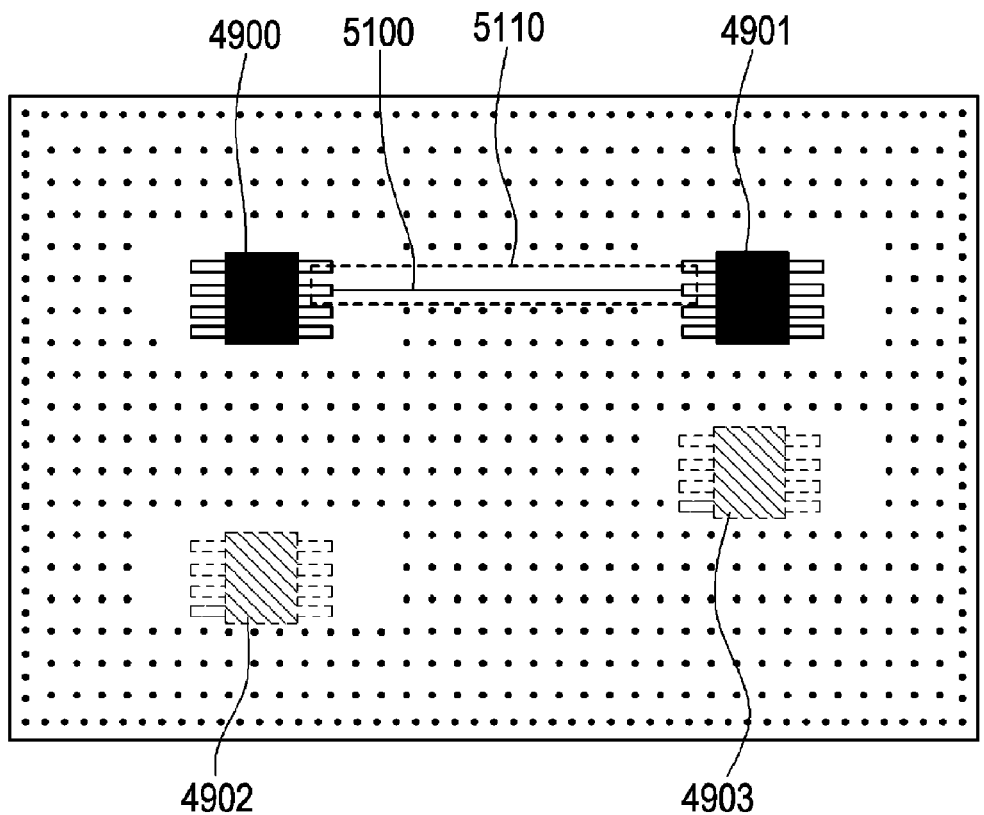
FIGS. 55A and 55B are explanatory diagrams for describing the processing in step S4707 according to the seventh embodiment.
Figure 55B:
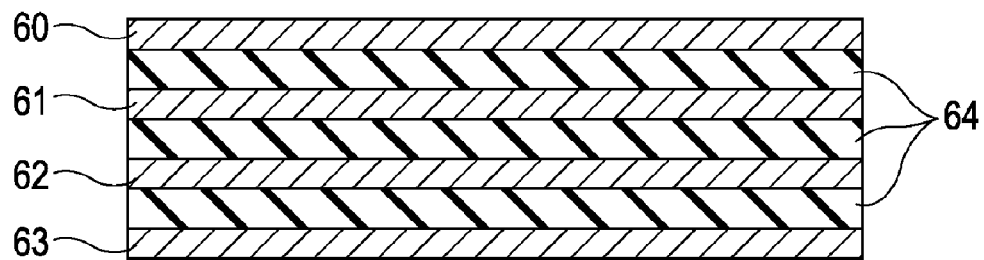

FIG. 53A shows a state of the printed circuit board after the components 4900, 4901, 4902, and 4903 are arranged. At this time, the components 4900 and 4901 are arranged on the layer 60 shown in FIG. 53B, and the components 4902 and 4903 are arranged on the layer 63. Next, as shown in FIG. 54A, in a case where a signal wiring 5100 is arranged on the layer 60, the via arrangement prohibition area should be set in the surrounding of the signal wiring. Therefore, by executing the processing in steps S4705 and S4706, the via automatic arrangement unit 23 calculates a via arrangement prohibition area 5110 of the dotted line shown in FIG. 54A, and in step S4707, excludes the GND vias 5120 included in the via arrangement prohibition area 5110. FIG. 55A shows a state of the printed circuit board after the signal wiring 5100 is arranged.

Figure 56A:
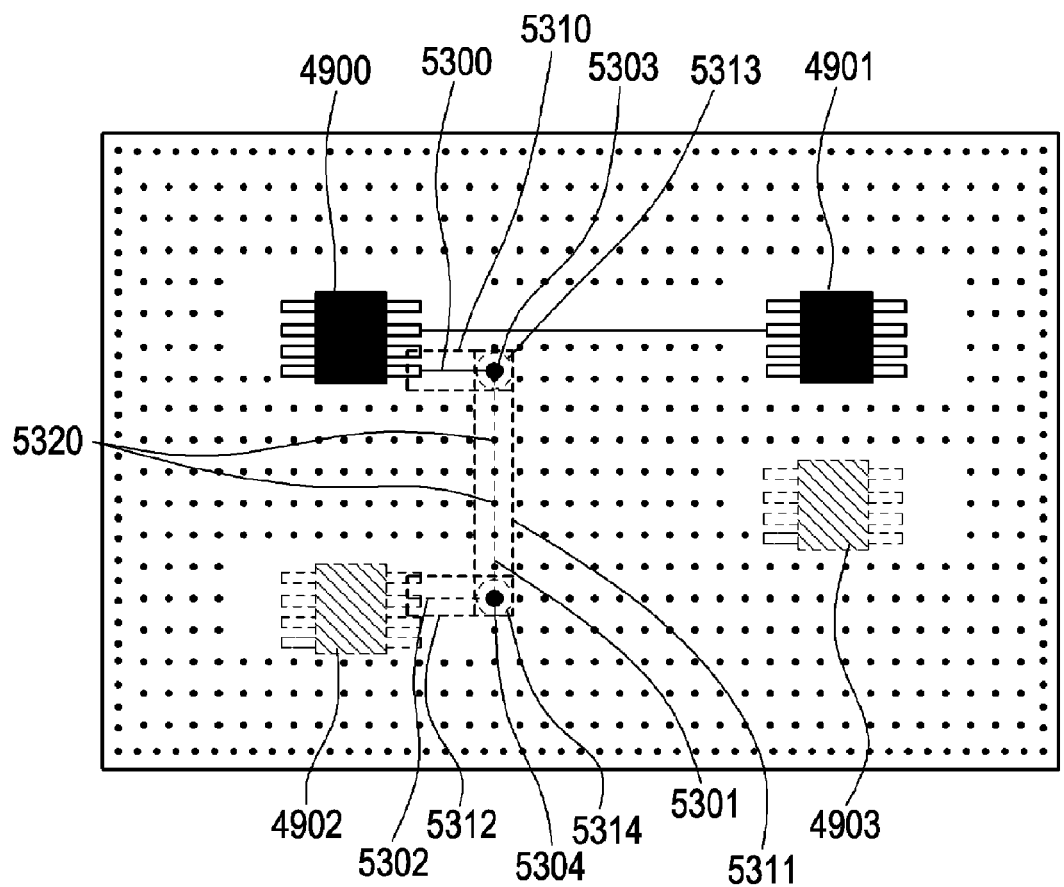
FIGS. 56A and 56B are explanatory diagrams for describing the processing in step S4706 according to the seventh embodiment.
Figure 56B:
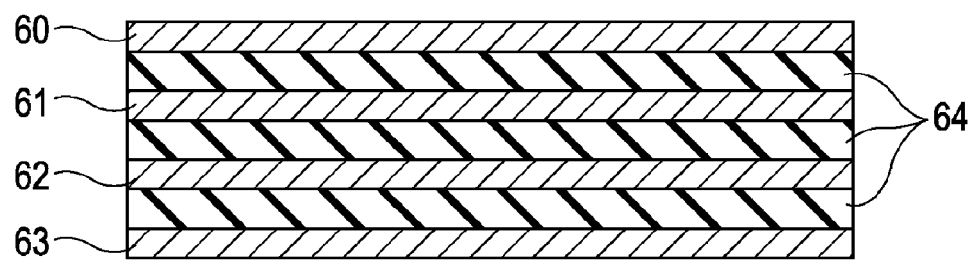

Next, a case will be described in which the signal wiring and the signal wiring via are arranged as shown in FIG. 56A. In FIG. 56A, signal wirings 5300, 5301, and 5302 are arranged respectively on the layers 60, 62, and 63, and a signal wiring via 5303 for connecting the signal wirings 5300 and 5301 and a signal wiring via 5304 for connecting the signal wirings 5301 and 5302 are arranged. At this time, in the surroundings of the signal wiring and the signal wiring via, the via arrangement prohibition areas should be set. Therefore, by executing the processing in steps S4705 and S4706, the via automatic arrangement unit 23 calculates the via arrangement prohibition areas 5310, 5311, and 5312 with respect to the signal wirings 5300, 5301, and 5302. Also, the via automatic arrangement unit 23 calculates the via arrangement prohibition areas 5313 and 5314 with respect to the signal wiring vias 5303 and 5304. Next, in step S4707, the via automatic arrangement unit 23 excludes GND vias 5320 included in the via arrangement prohibition areas 5310, 5311, 5312, 5313, 5314.

Figure 57A:
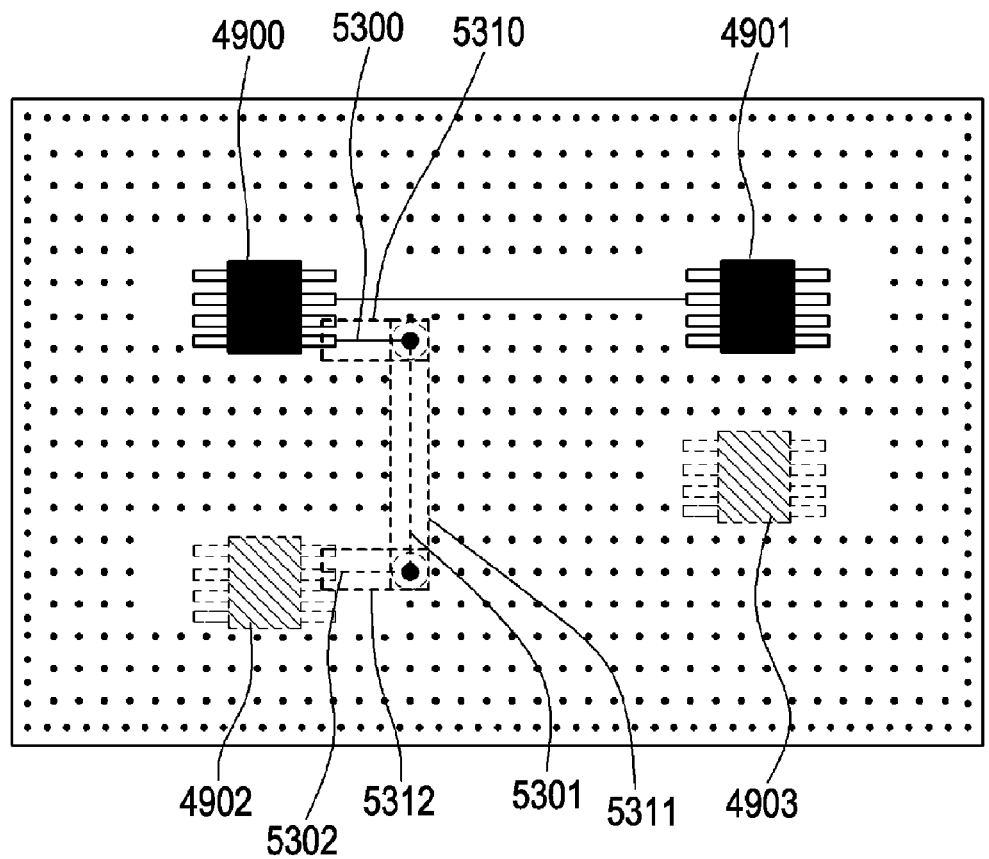
FIGS. 57A and 57B are explanatory diagrams for describing the processing in step S4707 according to the seventh embodiment.
Figure 57B:
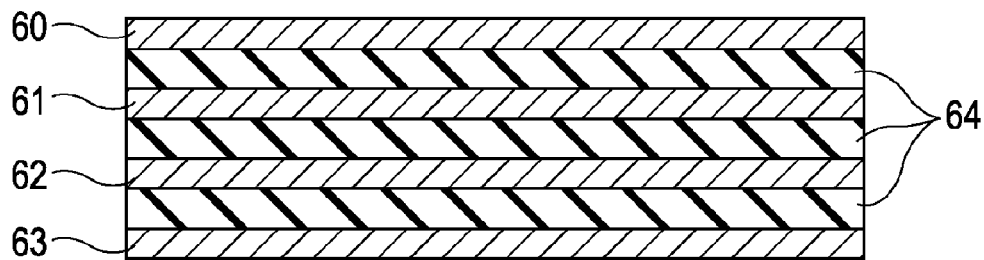

FIG. 57A shows a state of the printed circuit board after the signal wirings 5300, 5301, and 5302 are arranged.

Subsequently, each time the user arranges the components, the wirings, and the like on the printed circuit board, similarly, the via automatic arrangement unit 23 executes the processing in steps S4705 to S4707 until the surface insertion of the GND conductive area is carried out.

Figure 58A:
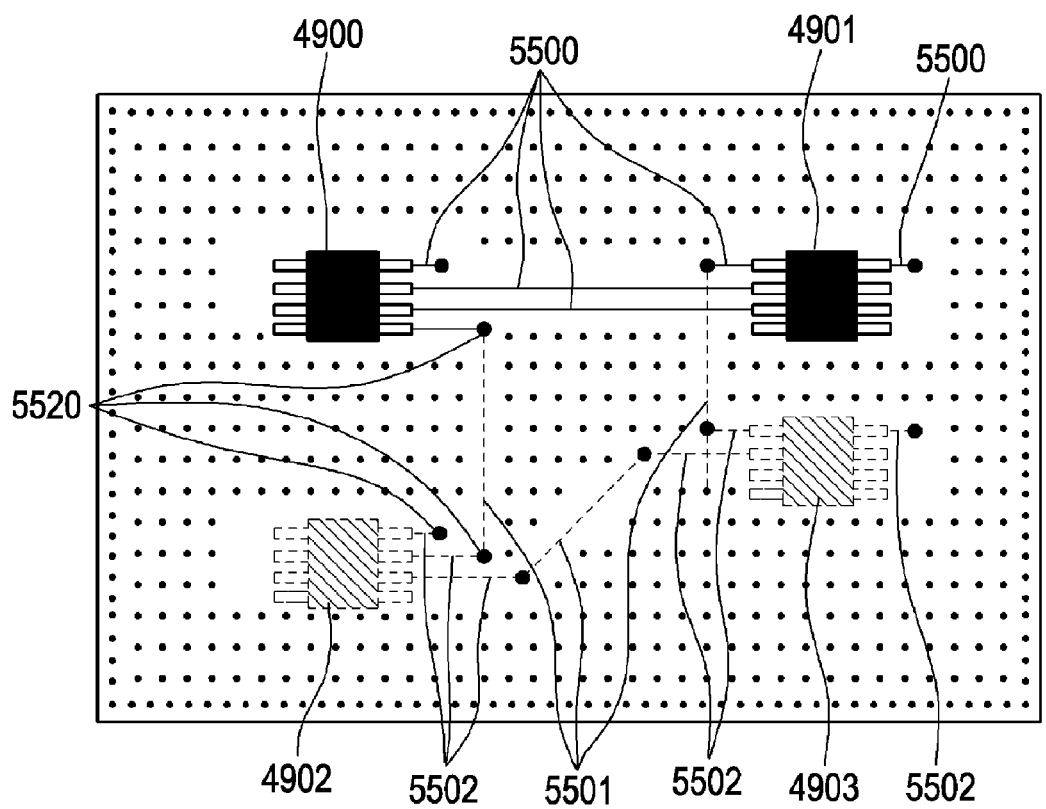
FIGS. 58A and 58B are explanatory diagrams for describing the processing in step S4707 according to the seventh embodiment.
Figure 58B:
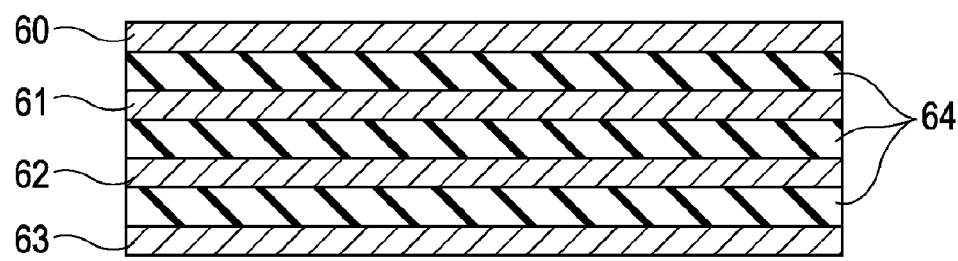

FIG. 58A shows a state of the printed circuit board after the all the wirings are completed. In FIG. 58A, signal wirings 5500, 5501, and 5502 are respectively arranged on the layer 60, 62, and 63, and the signal wiring via 5520 is arranged for connecting those wirings. Also, as shown in FIG. 58A, the GND vias in the surroundings of the signal wiring and the signal wiring via are excluded.

Figure 59A:
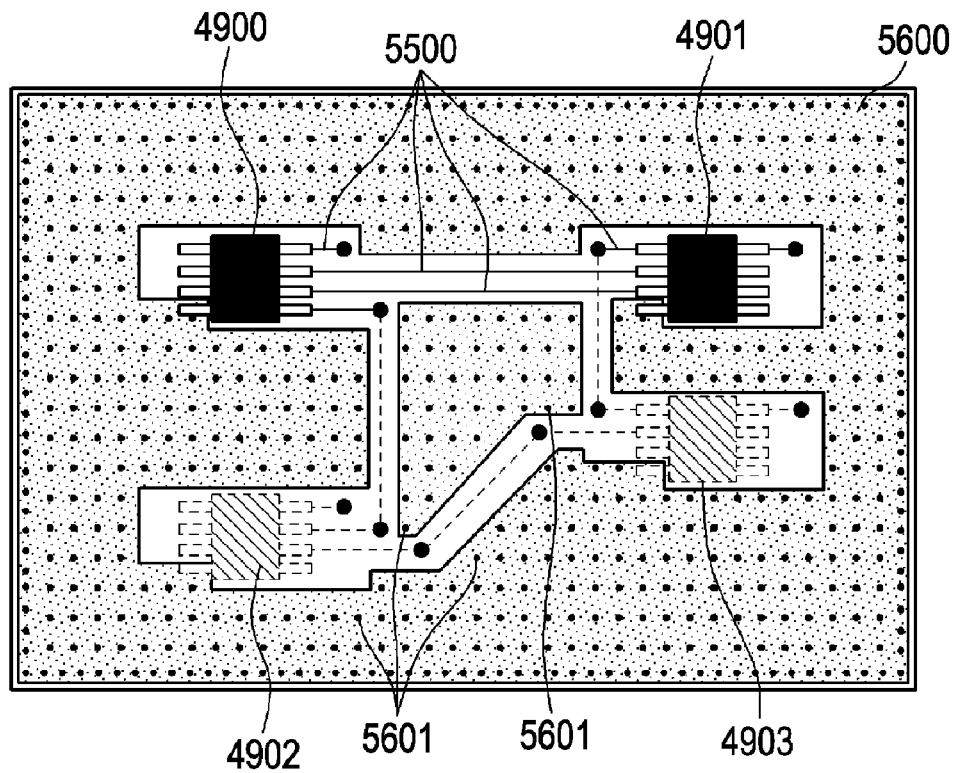
FIGS. 59A and 59B are explanatory diagrams for describing a processing in step S4709 according to the seventh embodiment.
Figure 59B:
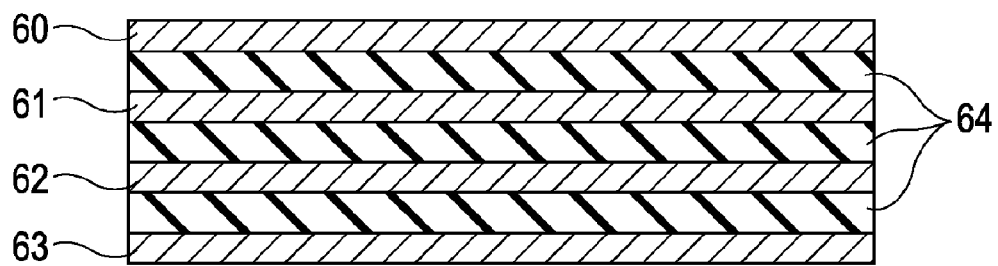

Next, when the user carries out the GND surface insertion, in step S4709, the diagram computation unit 22 extracts the GND overlapping conductive area. At this time, a gray area shown in FIG. 59A is a GND overlapping conductive area 5600.

In step S4710, the via automatic arrangement unit 23 obtains the position information and the shape information of the GND overlapping conductive area 5600.

In step S4711, the via automatic arrangement unit 23 excludes GND vias 5601 included in the peripheral edge of the GND overlapping conductive area 5600 and in a range of the prohibition distance L7 from the inner edge. In step S4712, the program is ended.

FIG. 50A shows a state of the printed circuit board after the GND vias are excluded. It is however noted that in FIG. 50A, in order to improve the visibility, the symbols are not assigned to the GND via 4801 shown in FIG. 51, the GND vias 4920, 4921, 4922, and 4923 shown in FIG. 52A, the GND via 5120 shown in FIG. 54A, and the GND via 5320 shown in FIG. 56A. Also, the symbols are not assigned to the signal wiring via 5420 shown in FIG. 58A and the GND via 5601 shown in FIG. 59A.

The above is the processing operation of the printed circuit board design support apparatus according to the present embodiment. According to the present embodiment, as shown in FIG. 50A, the GND vias can be automatically arranged in the peripheral edge part and the inner edge part of the printed circuit board within the predetermined interval. Also, the GND vias can be automatically arranged in the central part of the printed circuit board and also over the entire GND overlapping conductive area within the predetermined interval.

It is to be noted that according to the present embodiment, the case has been described in which the position information and the shape information of the GND overlapping conductive area are mainly represented as the coordinates, but, for example, the GND vias can be also automatically arranged in a case where the area is represented by an equation or an inequation of the plane or the space such as an inequation on the xy plane. For example, in the case of the inequation on the xy plane, it is possible to obtain the positional coordinates of the respective construction points of the GND overlapping conductive area by way of coordinates of intersecting points in equations in which an inequality sign is represented by an equality sign. Also, the determination whether a particular point is in or out of the GND overlapping conductive area can be carried out by simply applying the coordinates to the inequation. Therefore, it is possible to perform a processing similar to that according to the above-mentioned present embodiment.

In addition, according to the present embodiment, the case has been described in which the GND vias are arranged in the entire GND overlapping conductive area within the predetermined interval. However, the GND via can also be arranged in the peripheral edge part and the inner edge part within the predetermined interval the entire GND overlapping conductive area. In this case, the processing in steps S3300 to S3304 in the flow chart shown in FIG. 35 may be added between steps S4710 and S4711. Also, similarly as in the second embodiment, in a case where the GND vias are arranged in the vicinity of the high-speed interconnection via, the processing in steps S1600 to S1602 shown in FIG. 17 may be added between steps S4710 and S4711.

Further, in the above-described exemplary embodiment, the various above-described devices can be activated according to a program stored in a computer (central processing unit (CPU) or micro processing unit (MPU)). In such a case, the code (e.g., software program) for realizing the functions of the above-described exemplary embodiment is supplied to a computer in an apparatus or a system connected to the various above-described devices so as to activate the devices so that the functions of the color processing parameter editing apparatus are realized.

For example, driver software installed in a computer can be used to perform the image processing. Further, in this case, the code of the above-described software program itself realizes the functions of the above-described exemplary embodiment. The code itself may be stored on a computer-readable storage medium which supplies the code to a computer.

As described above, the respective units constituting the printed circuit board design support apparatus according to the embodiments of the present invention and the respective steps of the printed circuit board design support method can be realized while the printed circuit board design support program stored in the external storage apparatus 14 is executed. A computer-readable recording medium recording this program is included in the aspect of the present invention.

In a case where the aspect of the present invention is applied to the recording medium, the recording medium stores a computer program corresponding to or related to the flow chart described above.

According to the above-mentioned embodiments, by automatically arranging the power source or GND vias on the printed circuit board, in the printed circuit board design stage, the power source or GND vias can be arranged in a short period of time and also without making mistakes.

Also, according to the above-mentioned embodiments, by automatically arranging the vias in the overlapping conductive area within the predetermined interval, the labor of the user for arranging the power source or GND vias can be omitted, and further it is possible to arrange the power source or GND vias without mistakes or omissions.

Also, according to the above-mentioned embodiments, the power source or GND vias in the overlapping conductive area is used as the starting point, other power source or GND vias can be automatically arranged, and further it is possible to eliminate the arrangement of the vias at the unnecessary positions.

Also, according to the above-mentioned embodiments, by arranging the vias at positions shifted from the power source or GND vias used as the starting point in the predetermined direction by the predetermined position, it is possible to arrange the vias in an alignment, and the user can easily recognize the arrangement state of the vias. That is, when the power source or GND vias are further shifted or additionally arranged, it is possible to easily find out the changing method for the arrangement state of the vias.

Also, according to the above-mentioned embodiments, by arranging the power source or GND vias in the blocks obtained by dividing the overlapping conductive area, further, it is possible to prevent the excessive arrangement of the power source or GND vias.

Also, according to the above-mentioned embodiments, within the range of the predetermined distance from the peripheral edge part and the inner edge part of the overlapping conductive area, the power source or GND vias are automatically arranged within the predetermined interval. Therefore, while the user looks at the plurality of conductive layers, the labor of checking the shape of the overlapping conductive area can be omitted, and also the power source or GND vias can be arranged without mistakes or omissions in the vicinity of the peripheral edge or the inner edge of the overlapping conductive area.

Also, according to the above-mentioned embodiments, as the GND vias are arranged within the range of the predetermined distance from the vias of the high-speed signal line, the detour of the return current of the high-speed signal can be avoided. With this configuration, the radiation noise generated from the printed circuit board can be set even smaller.

Also, according to the above-mentioned embodiments, even in a case where the shape of the overlapping conductive area is changed by the wiring change, the power source or GND vias are automatically rearranged based on the shape change of the overlapping conductive area. With this configuration, at the time of the wiring change, the user can avoid the labor of excluding the unnecessary vias and additionally arranging the necessary vias, and further it is possible to rearrange the power source or GND vias without mistakes or omissions. In addition, if the power source or GND vias out of the changed overlapping conductive area are automatically excluded, further, the necessary minimum power source or GND vias are excluded, and at the time of the rearrangement of the power source or GND vias, the time for the unnecessary additional arrangement can be saved. In addition, if the power source or GND vias in the surrounding thereof in accordance with the changed wiring are excluded, further, in a case where the power source or GND vias exist at the positions where the user desires to change the wiring, the labor of excluding the relevant power source or GND vias can be omitted. Furthermore, the user can change the wiring without noticing the existence of the GND vias.

Also, according to the above-mentioned embodiments, the power source or GND vias is automatically corrected and arranged in the changed overlapping conductive area. With this configuration, the power source or GND vias can be arranged in an alignment in the changed overlapping conductive area, and the user can easily recognize the arrangement state of the vias. In addition, if the power source or GND vias out of the changed overlapping conductive area are corrected and arranged into the overlapping conductive area, further, it is possible to omit the labor of excluding the power source or GND vias out of the overlapping conductive area.

Also, according to the above-mentioned embodiments, even in a case where the components and the wirings are changed to the printed circuit board, the GND vias arranged in the arrangement prohibition area are automatically excluded. With this configuration, it is possible to omit the labor of excluding the power source or GND vias.

As many apparently widely different embodiments of the present invention can be made without departing from the spirit and scope thereof, it is to be understood that the invention is not limited to the specific embodiments thereof except as defined in the appended claims.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

What is claimed is:

1. A method, comprising:
   identifying conductive areas as ground areas which can be used as grounds of a printed circuit board having a plurality of conductive layers;
   extracting an overlapping conductive area in which the identified conductive areas are two-dimensionally overlapped with one another; and
   arranging connection members by a computer, wherein the connection members are configured to connect at least two layers among the plurality of conductive areas in the extracted overlapping conductive area at an interval within a predetermined distance.

2. The method according to claim 1,
   wherein the arranging includes:
   arranging connection members at a plurality of predetermined positions respectively in the extracted overlapping conductive area;
   selecting a first connection member from the arranged connection members; and
   arranging other connection members using the first connection member as a starting point.

3. The method according to claim 2,
   wherein the arranging other connection members includes:
   calculating positional coordinates separated from coordinates of the first connection member in a predetermined direction by a predetermined distance, and
   wherein the first connection member is arranged at the calculated positional coordinates.

4. The method according to claim 1,
   wherein the arranging includes:
   dividing the extracted overlapping conductive area into blocks; and
   arranging the connection members in the divided blocks.

5. The method according to claim 1,
   wherein the arranging includes arranging the connection members within a range of a predetermined distance from a peripheral edge or an inner edge of the extracted overlapping conductive area at an interval within a predetermined distance.

6. The method according to claim 1,
   wherein the arranging includes:
   selecting a high speed connection member related to a high-speed signal line among the connection members arranged on the printed circuit board;
   arranging a connection member in the extracted overlapping conductive area and within a range of a predetermined distance from the selected connection member;
   arranging the interlayer connection members at a plurality of predetermined positions respectively in the extracted overlapping conductive area;
   selecting a first connection member from the arranged interlayer connection members; and
   arranging other connection members while the first connection member is used as a starting point.

7. The method according to claim 1, further comprising:
   in a case where a change in a wiring is performed,
   reidentifying conductive areas as the ground areas which can be used as the ground;
   reextracting an overlapping conductive area in which the reidentified conductive areas are two-dimensionally overlapped with one another;
   excluding one or a plurality of interlayer connection members; and
   rearranging the reextracted connection members.

8. The method according to claim 7,
   wherein the excluding includes:
   excluding connection members out of the reextracted overlapping conductive area.

9. The method according to claim 8,
   wherein the excluding further includes excluding interlayer connection members within a range of a predetermined distance from a changed wiring whose potential is different from the ground.

10. The method according to claim 1, further comprising:
    in a case where a change in a wiring is performed,
    reidentifying conductive areas as ground areas which can be used as the ground;

reextracting an overlapping conductive area in which the reidentified conductive areas are two-dimensionally overlapped with one another; and correcting and arranging reextracted interlayer connection members.

11. The method according to claim 10, wherein the correcting and arranging includes shifting connection members arranged out of the reextracted overlapping conductive area to an inside of the reextracted overlapping conductive area.

12. The method according to claim 1, further comprising:

in a case where a change in a component or a wiring is performed, obtaining, via arrangement prohibition area, information with respect to the component or the wiring;

calculating, the obtained information;

excluding extracting connection members arranged in the via arrangement prohibition area calculated in the calculating.

13. A non-transitory computer-readable recording medium recording a program for causing a computer to execute the method according to claim 1.

14. The non-transitory computer-readable recording medium according to claim 13, wherein the arranging includes:

arranging connection members at a plurality of predetermined positions respectively in the extracted overlapping conductive area;

selecting a first connection member from the arranged connection members; and arranging other connection members using the first connection member as a starting point.

15. The non-transitory computer-readable recording medium according to claim 13, wherein the arranging includes:

dividing the extracted overlapping conductive area into blocks; and arranging the connection members in the divided blocks.

16. The non-transitory computer-readable recording medium according to claim 13, wherein the arranging includes arranging the connection members within a range of a predetermined distance from a peripheral edge or an inner edge of the extracted overlapping conductive area at an interval within a predetermined distance.

17. The non-transitory computer-readable recording medium according to claim 13, wherein the arranging includes:

selecting a high speed connection member related to a high-speed signal line among the connection members arranged on the printed circuit board;

arranging a connection member in the extracted overlapping conductive area and within a range of a predetermined distance from the selected connection member;

arranging interlayer connection members at a plurality of predetermined positions respectively in the extracted overlapping conductive area;

selecting a first connection member from the arranged interlayer connection members; and arranging other connection members while the first connection member is used as a starting point.

18. The non-transitory computer-readable recording medium according to claim 13, said method further comprising:

in a case where a change in a wiring is performed, reidentifying conductive areas as the ground areas which can be used as the ground;

reextracting an overlapping conductive area in which the reidentified conductive areas are two-dimensionally overlapped with one another;

excluding one or a plurality of interlayer connection members; and rearranging the connection members based on a result of the reextracting.

19. The non-transitory computer-readable recording medium according to claim 13, said method further comprising:

in a case where a change in a wiring is performed, reidentifying conductive areas as ground areas which can be used as the ground;

reextracting an overlapping conductive area in which the reidentified conductive areas are two-dimensionally overlapped with one another; and correcting and arranging the connection members based on a result of the reextracting.

20. An apparatus comprising:

an identifying unit configured to identify conductive areas which can be used as grounds of a printed circuit board having a plurality of conductive layers;

an extracting unit configured to extract an overlapping conductive area in which the identified conductive areas are two-dimensionally overlapped with one another; and an arranging unit configured to arrange interlayer connection members configured to connect at least two layers among the plurality of conductive areas in the extracted overlapping conductive area at an interval within a predetermined distance.

* * * * *